(12) United States Patent
Taki

(10) Patent No.: US 6,329,845 B1
(45) Date of Patent: *Dec. 11, 2001

(54) LOGIC GATE CELL

(75) Inventor: Kazuo Taki, Kobe (JP)

(73) Assignee: AIL Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/333,456

(22) Filed: Jun. 15, 1999

(30) Foreign Application Priority Data

Jun. 18, 1998 (JP) .................................................. 10-208513

(51) Int. Cl.[7] .............................. H01L 25/00; H03K 19/00
(52) U.S. Cl. ......................... 326/102; 326/101; 326/122; 326/121
(58) Field of Search .................................. 326/102, 101, 326/103, 104, 121

(56) References Cited

U.S. PATENT DOCUMENTS

| | | | |
|---|---|---|---|
| 4,750,026 | 6/1988 | Kuninobu et al. | 364/491 |
| 5,072,285 | * 12/1991 | Ueda et al. | 326/102 X |
| 5,119,314 | * 6/1992 | Hotta et al. | 364/491 |
| 5,764,533 | * 6/1998 | Kikushima et al. | 257/378 |
| 5,903,174 | * 5/1999 | Landry et al. | 326/93 X |

FOREIGN PATENT DOCUMENTS

| | | |
|---|---|---|
| 03-82140 | 4/1991 | (JP) . |
| 11-87667 | 3/1999 | (JP) . |

OTHER PUBLICATIONS

Saika et al., "A Two-Dimensional Transistor Placement Algorithm for Cell Synthesis and Its Application to Standard Cells," *IEICE Trans. Fundamentals*, vol. E80-A, No. 10, pp. 1883–1891 (1997).

Zimmerman et al., "Low-Power Logic Styles: CMOS Versus Pass-Transistor Logic," *IEEE Journal of Solid-State Circuits*, vol. 32, No. 7, pp. 1079–1090 (1997).

Nikkei BP Company, "Technical Paper of Low-power LSI", *Nikkei Micro Devices*, pp. 1–258 (1994).

* cited by examiner

*Primary Examiner*—Huan Hoang
(74) *Attorney, Agent, or Firm*—Ladas & Parry

(57) ABSTRACT

To provide a small-area and low-power-consuming logic gate cell which is constructed of a circuit of two inverting logic gates connected in series in a layout of four-step diffusion regions. A first inverting logic gate is formed of a small transistor on internal two-step diffusion regions, a second inverting logic gate is formed of external two-step diffusion regions, and output wirings of the second inverting logic gate is formed of second metal layer wirings so that the second metal layer wirings extend over the first inverting logic gate.

59 Claims, 53 Drawing Sheets

AND-NOR
AOI21

AND-NOR
AOI22

OR-NAND
OAI21

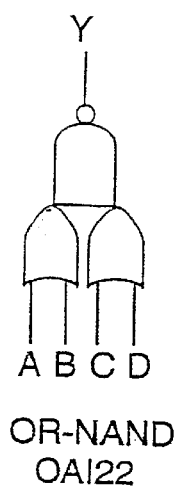
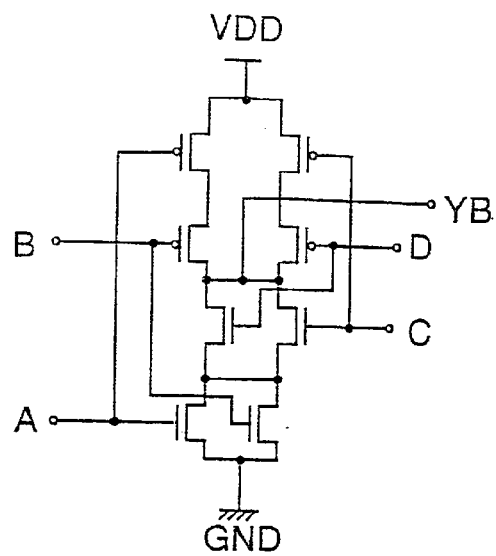
FIG. 7A
FIG. 7B
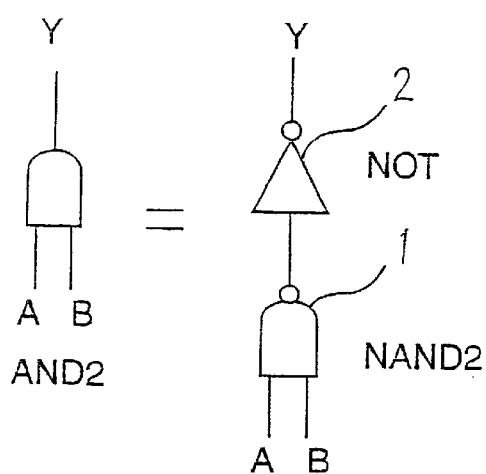
FIG. 8A  FIG. 8B

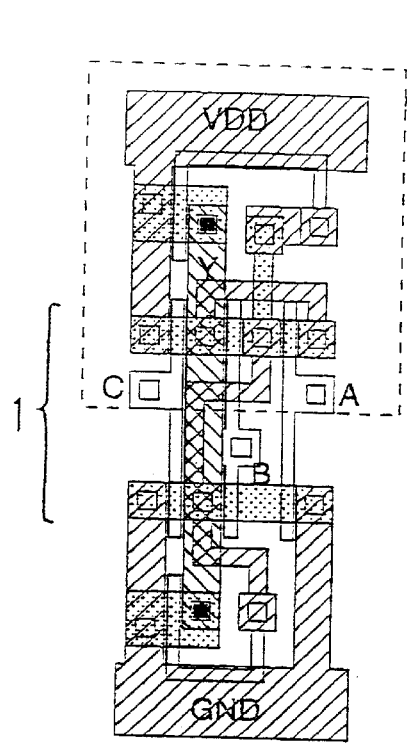
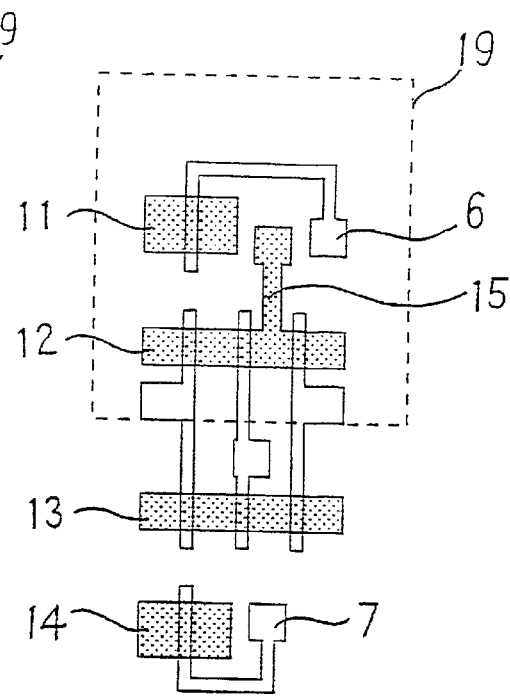
FIG. 34A
FIG. 34B
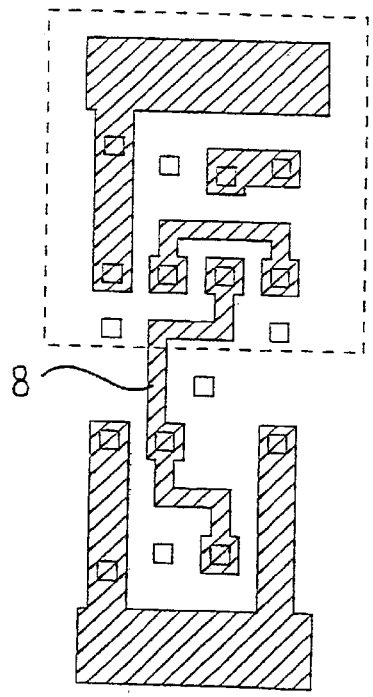
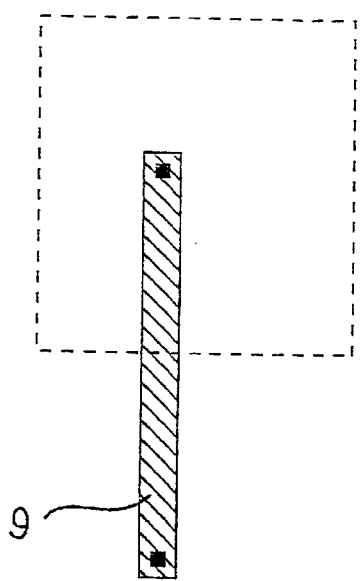
FIG. 35A
FIG. 35B

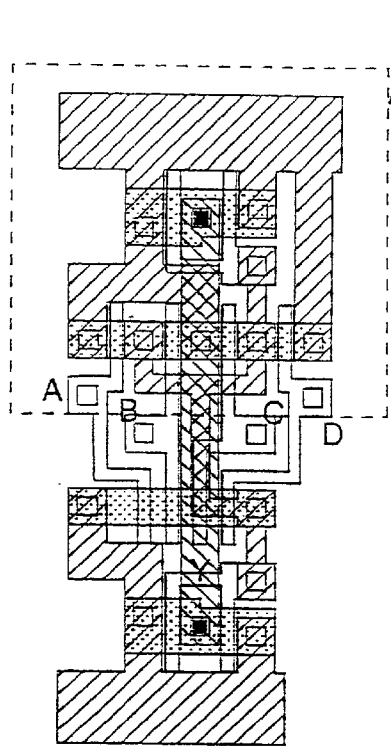
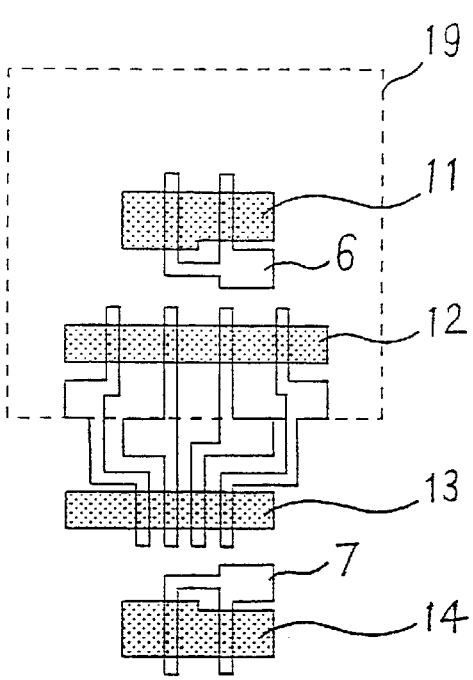
FIG. 45A				FIG. 45B
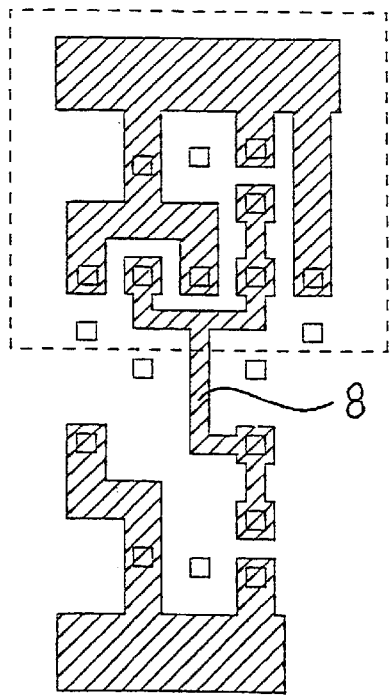
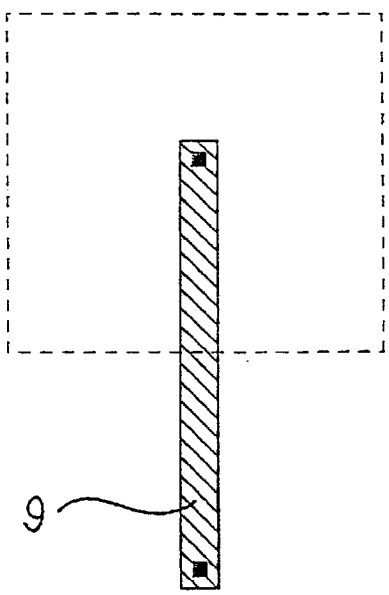
FIG. 46A				FIG. 46B

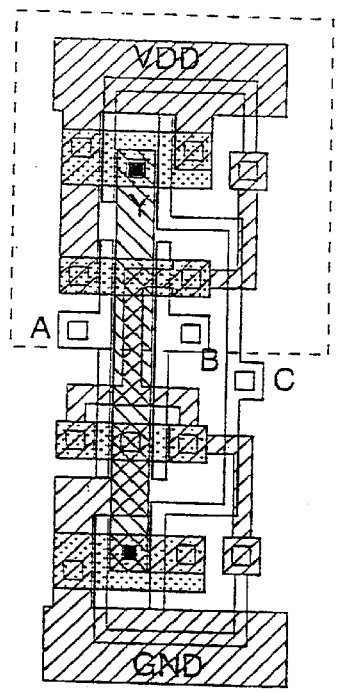
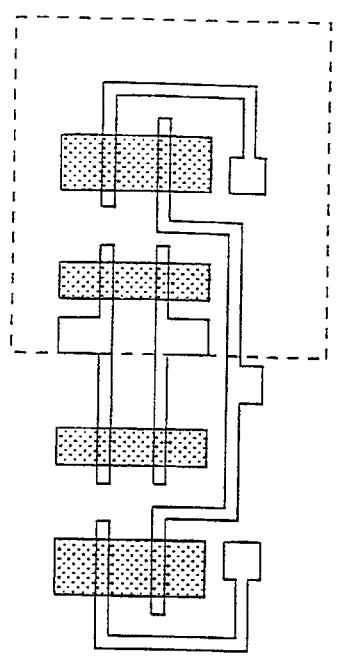
FIG. 58A　　　　　　　FIG. 58B
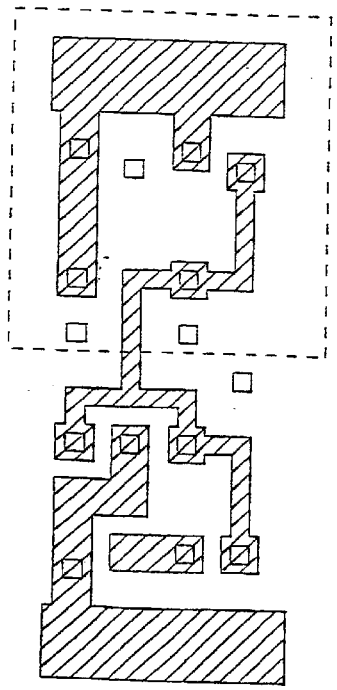
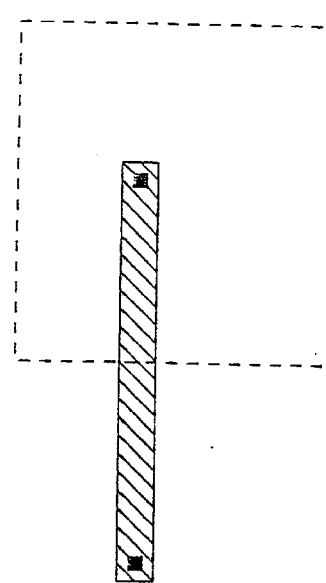
FIG. 59A　　　　　　　FIG. 59B

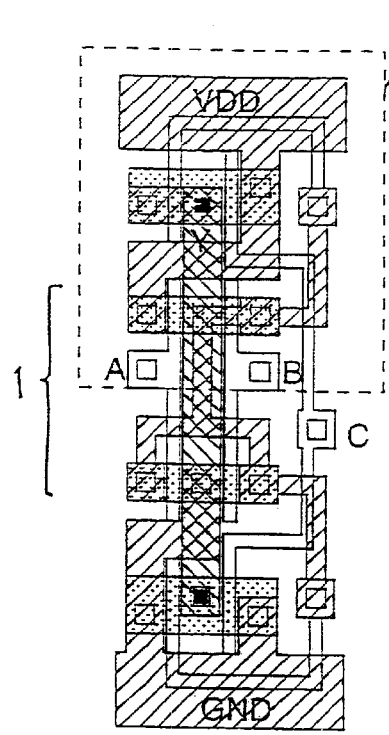
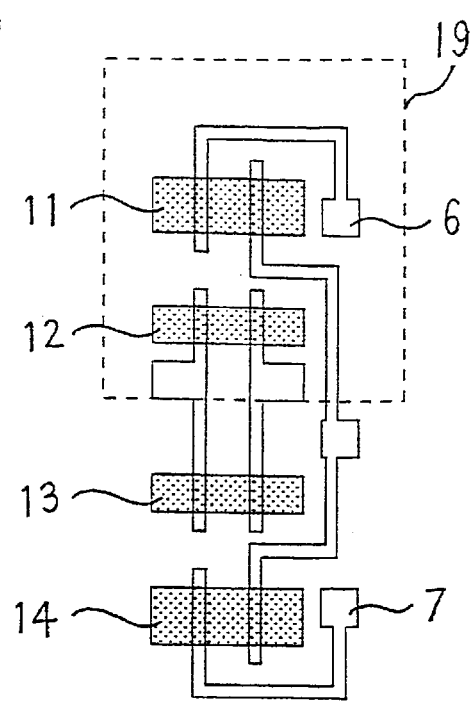
FIG. 68A  FIG. 68B
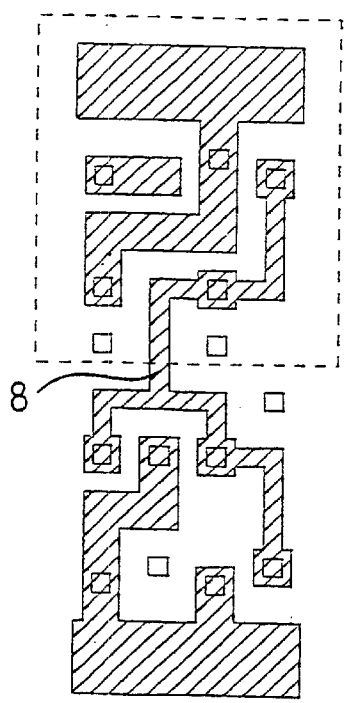
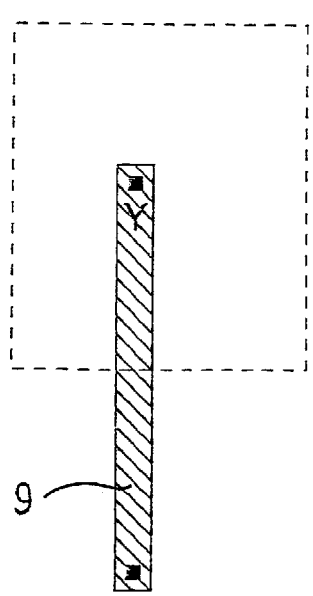
FIG. 69A  FIG. 69B

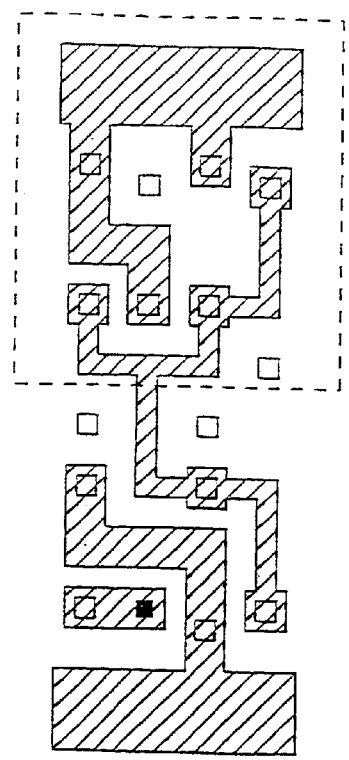
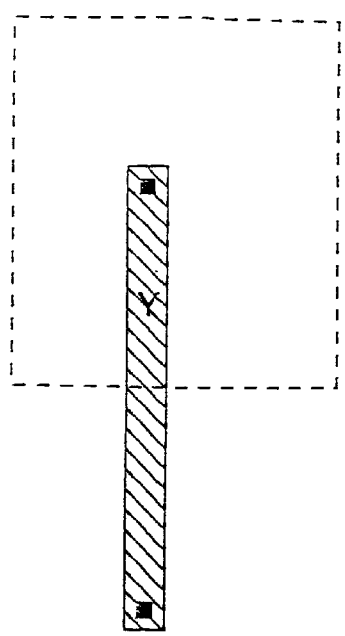
FIG. 72A
FIG. 72B
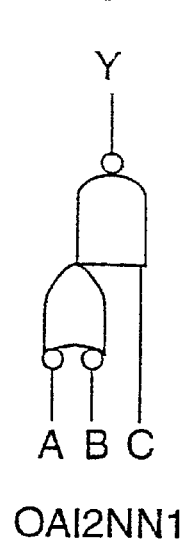
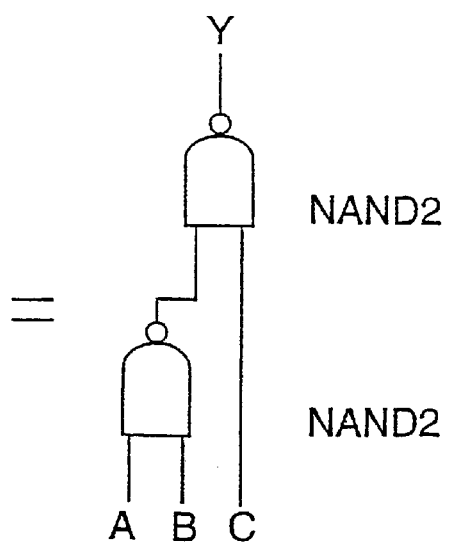
FIG. 73A
FIG. 73B

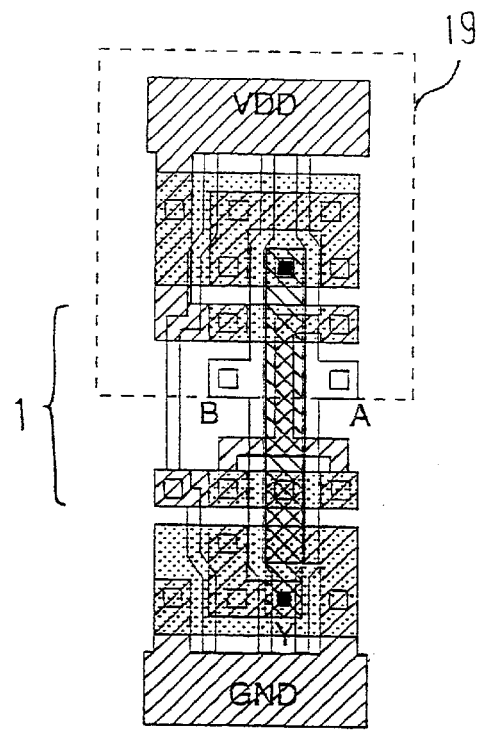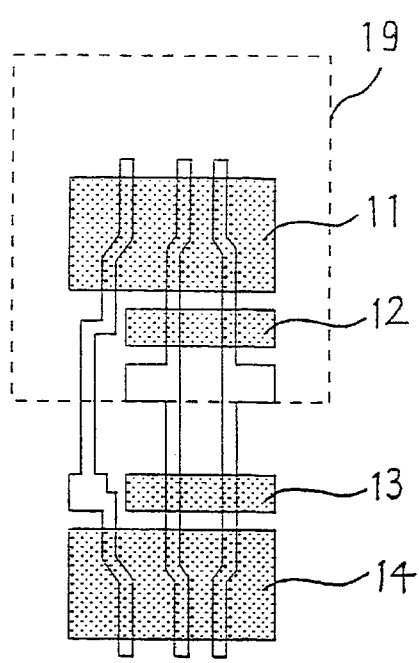
FIG. 81A          FIG. 81B
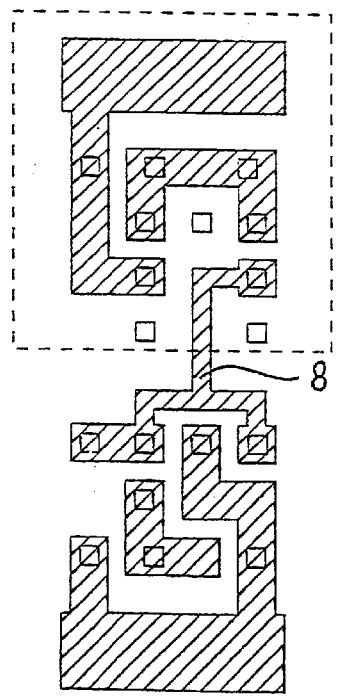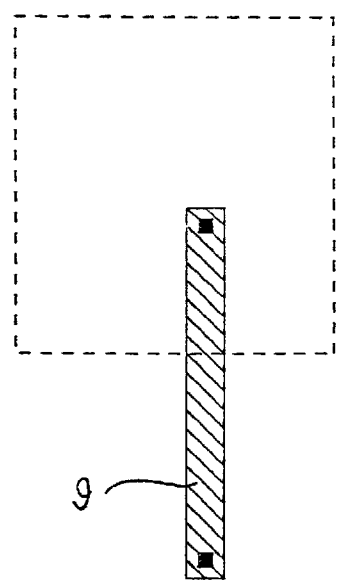
FIG. 82A          FIG. 82B FIG. 83A
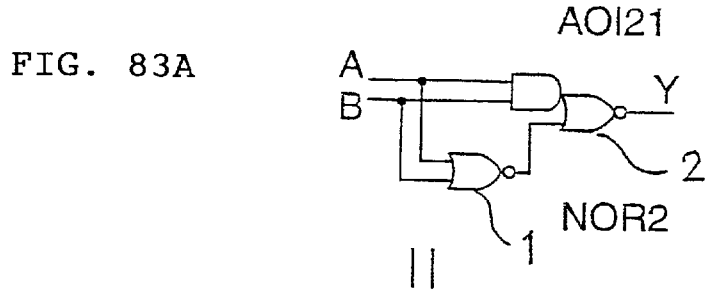
FIG. 83B
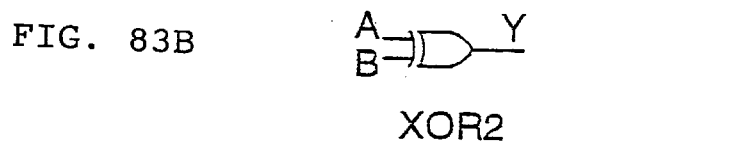
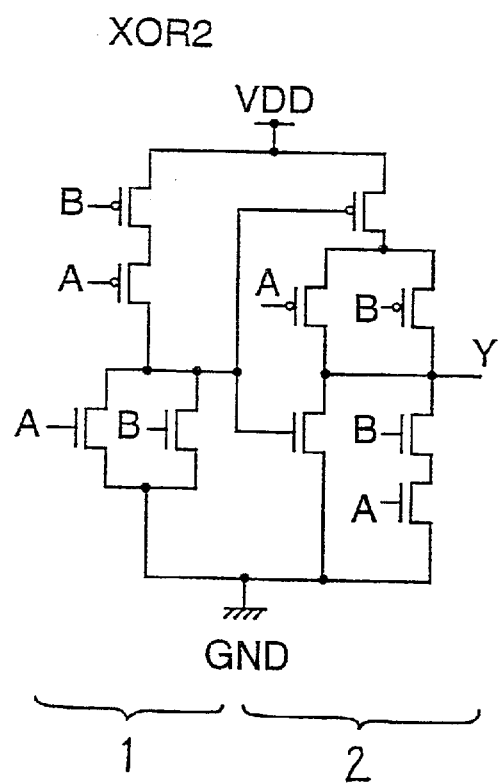
FIG. 84

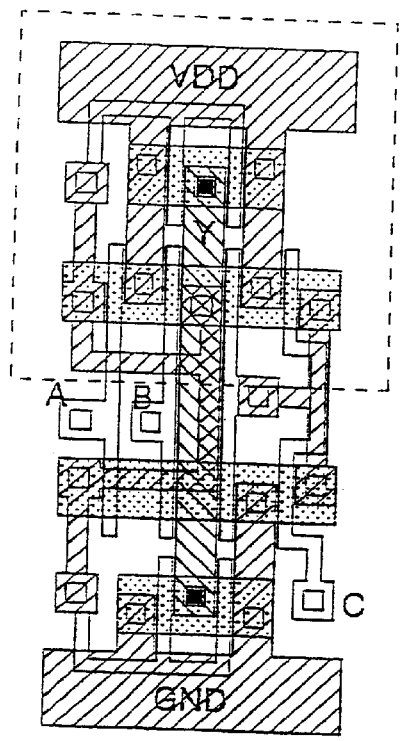 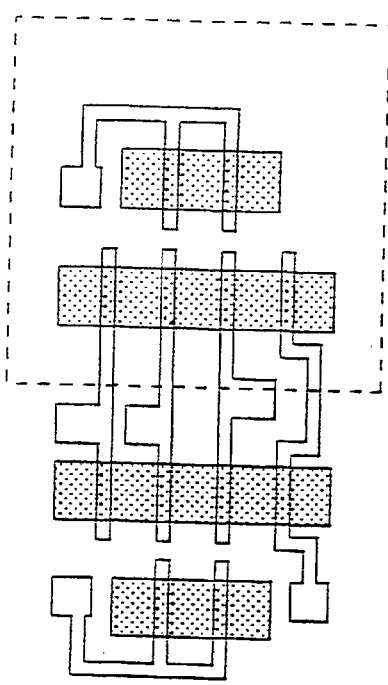
FIG. 89A  FIG. 89B
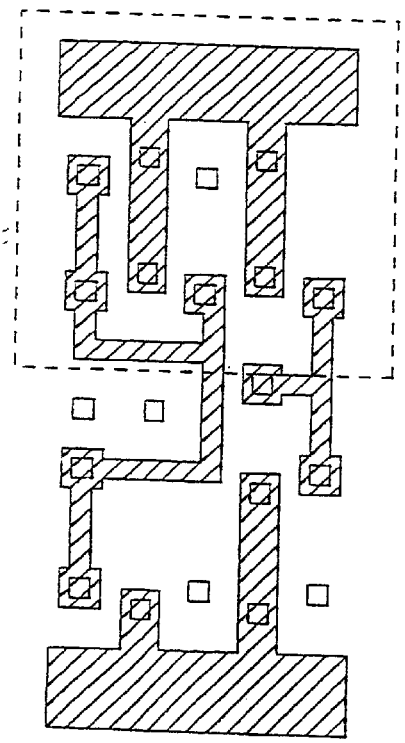 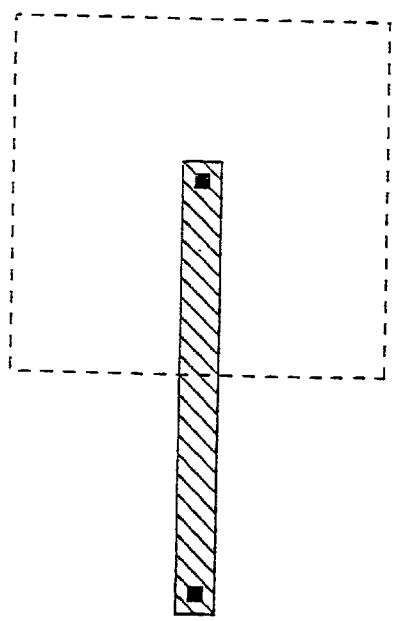
FIG. 90A  FIG. 90B

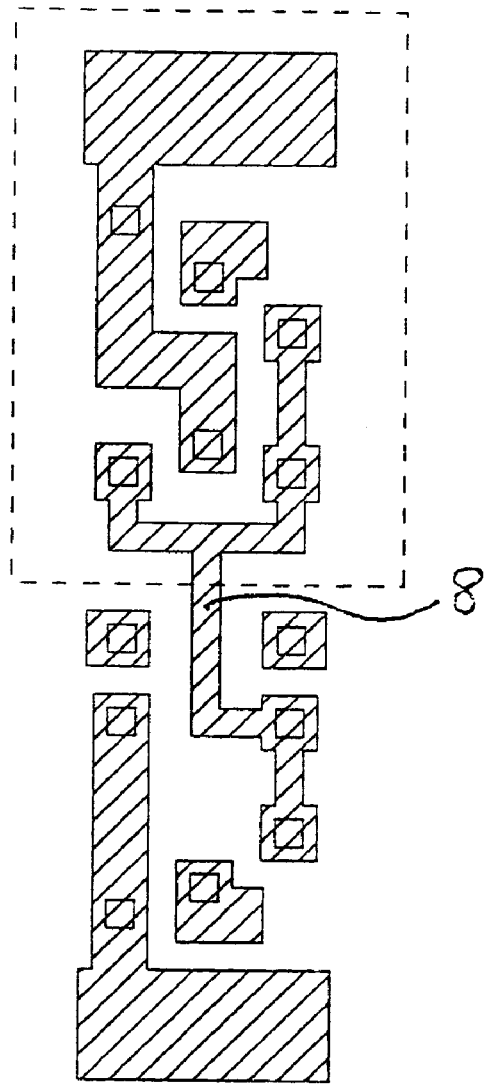
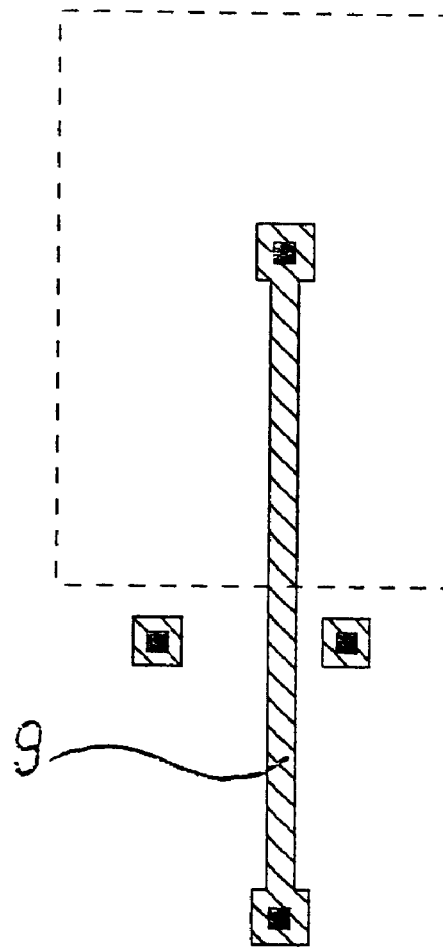
FIG. 94A
FIG. 94B

LOGIC GATE CELL

BACKGROUND OF THE INVENTION

1. Field of the Invention

The present invention relates to logic gate cells used as an element in an LSI designed in a standard cell format and falls within the layout design technology of the logic gate cell manufactured in CMOS processes, and particularly to a logic gate cell featuring a small area and low power consumption.

2. Description of the Related Art

A cell having a circuit arrangement of two inverting logic gates connected is frequently used for a logic gate cell that is an element when an LSI is designed using a standard cell technology. The inverting logic gates here refer to a NAND gate, a NOR gate, a NOT gate, an AND-NOR compound gate and an OR-NAND compound gate. Logic symbols and circuit examples corresponding to the inverting logic gates are respectively shown in FIGS. 1A and 1B through FIGS. 7A and 7B. FIGS. 1A through 7A respectively show the logic symbols and FIGS. 1B through 7B respectively show the circuit examples thereof. Referring to a two-input AND gate as a typical example of these gates, the conventional art of the layout of the logic gate cell is now discussed.

The logic symbol of the two-input AND gate AND2 is shown in FIG. 8A and the two-input AND gate AND2 is constructed by configuring an inverting logic gate NAND2 and a NOT as shown in FIG. 8B, and an example of the circuit is shown in FIG. 9. FIG. 10 shows a conventional layout example of gate NAND2. FIG. 11 shows diffusion regions and polysilicon wirings extracted from the layout shown in FIG. 10, FIG. 12 shows first metal layer wirings extracted from the layout shown in FIG. 10, and FIG. 13 shows second metal layer wirings extracted from the layout shown in FIG. 10. A diffusion region 501 for forming a P-type MOS transistor is arranged within a well 19, and a diffusion region 502 for forming an N-type MOS transistor is arranged outside and below the well 19. Transistors are formed at intersections where gate polysilicon wirings 503 intersect the diffusion regions 501 and 502. P-type MOS transistors 31 to 33 shown in FIG. 9 are formed side by side horizontally on the diffusion region 501 as shown in FIGS. 10 and 11, and N-type MOS transistors 34 to 36 shown in FIG. 9 are formed side by side horizontally on the diffusion region 502 as shown in FIGS. 10 and 11. Squares shown in FIG. 10, FIG. 12 and FIG. 13 represent contacts and via holes.

Available as methods of reducing the power consumption of LSIs through design effort of the logic gate cell are a technique to narrow a gate width of a transistor to reduce the power consumption in a transistor portion and a technique to reduce a layout area of the logic gate cell to reduce metal wiring length, and thus to reduce static capacitance of a metal wiring section, and both techniques are used in combination. Common techniques to promote a low power consumption are discussed in more detail in "Technical Paper of Low-Power LSI (Nikkei Micro Device Issue, Nikkei BP Company in Japan)". In the gate AND2 cell, to narrow the gate width of the transistor, the height of the diffusion regions 501 and 502 (the vertical length in FIGS. 10 and 11) should be small. The reduction in the height of the diffusion regions serves as a reduction in the cell height (the vertical length in FIG. 10), and the cell area is accordingly reduced.

The above methods present the following problems. Firstly, when the cell height is lowered to reduce the cell area in the above methods, only the reduction in the height of the diffusion regions 501 and 502 contributes to lowering the cell height, and wiring areas other than the cell height and the spacing (a certain spacing is required in a region where the P-type changes to the N-type) between the diffusion region 501 and the diffusion region 502 are not reduced. As a result, as the cell area is reduced more, the area of the transistor portion gets smaller relative to the cell area, and the cell suffers a smaller area utilization. Secondly, as the cell height is lowered, there is no choice but to arrange a plurality of transistors horizontally side by side and connect them, to realize a high-power (wide gate width) transistor, and a horizontally elongated cell results, suffering a poor area utilization and the cell area, on the contrary, increases more than that in the high cell height layout. These problems arise as a result of attempting lower the cell height to reduce the cell area.

SUMMARY OF THE INVENTION

Accordingly, an object of the present invention is to provide a high area-utilization and small-area logic gate cell which employs a layout that narrows a cell width (the horizontal length as shown in drawings) instead of lowering the cell height, to realize a low power consuming logic gate cell based on a narrow gate width transistor.

To layout a cell having the circuit arrangement of two inverting logic gates connected, firstly, the present invention employs a total of four diffusion regions, namely, two P-type MOS transistor diffusion regions and two N-type MOS transistor diffusion regions, and arranges them in four stages in a vertical direction in the drawings, rather than employing two diffusion regions as in the conventional art. Secondly, the two internal diffusion regions are used to realize a first inverting logic gate, and the two external diffusion regions are used to realize a second inverting logic gate that connects to the first inverting logic gate. Thirdly, wirings, which also serve as the metal wirings of an output portion of the second inverting logic gate, for interconnecting the P-type MOS transistor and the N-type MOS transistor, are partly or entirely formed of second metal layer wirings, and the second metal layer wirings extend over the second diffusion region and the third diffusion region.

In the above means, when the second inverting logic gate is realized using the two external diffusion regions, the wirings for interconnecting the P-type MOS transistor and the N-type MOS transistor are essentially required, and must be realized so that it may not interfere with the metal wirings of the first inverting logic gate constructed of the two internal diffusion regions. According to the present invention, taking advantage of the fact that the wirings for interconnecting the P-type MOS transistor to the N-type MOS transistor are limited to a single output portion, the wirings are realized by the second metal layer wirings, and the second metal layer wirings are arranged to extend over the first inverting logic gate so that no interference takes place therebetween as already described.

A logic gate cell having an even narrower gate width is provided by forming the first inverting logic gate output wirings of the first metal layer wirings, and by extending the second metal layer wirings of the output portion of the second inverting logic gate, over the first metal layer wirings. Specifically, since the first metal layer wirings of the output portion of the first inverting logic gate have no connection external to the cell, no problem is presented at all even if the second metal layer extends over the first inverting logic gate, and with the arrangement, the cell width is reduced to a minimum grid number required to route input and output terminals from within the cell.

In a portion of the input of the second inverting logic gate connected to the output of the first inverting logic gate, gate polysilicon wirings of the P-type MOS transistor and gate polysilicon wirings of the N-type MOS transistor are interconnected by the first metal layer wirings of the output portion of the first inverting logic gate. With the above arrangement, no particular wiring region is required as wirings for interconnection between the gates, and a logic gate cell having a narrow cell width is thus provided.

In addition to the above means, a gate width of the transistor formed in the external diffusion regions and used in the second inverting logic gate is set to be wider than a gate width of the transistor formed in the internal diffusion regions and used in the first inverting logic gate, and a high drive power (with a small loading delay) and a low power consuming logic gate cell is provided.

When the second inverting logic gate is a NOT gate, two P-type transistors and two N-type transistors are formed in the external diffusion regions and are connected in parallel to form the NOT gate, and a logic gate cell with an increased drive power is thus provided without increasing the cell area.

In the logic gate cell having a circuit arrangement in which the second inverting logic gate is a NOT gate and an output of a third inverting logic gate is connected to an input of the preceding first inverting logic gate, the first and third inverting logic gates are formed using the internal diffusion regions while the second logic gate is formed using the external diffusion regions, and the above means is thus applied in the embodiment, and a small-area and low-power consuming logic gate cell is thus provided.

The nature, principle and utility of the invention will become more apparent from the following detailed description when read in conjunction with the accompanying drawings.

BRIEF DESCRIPTION OF THE DRAWINGS

In the accompanying drawings:

FIGS. 1A and 1B show an inverting logic gate (NOT), wherein FIG. 1A shows the logic symbol and FIG. 1B shows an example of the circuit;

FIGS. 2A and 2B show an inverting logic gate (NAND), wherein FIG. 2A shows the logic symbol and FIG. 2B shows an example of the circuit;

FIGS. 3A and 3B show an inverting logic gate (NOR), wherein FIG. 3A shows the logic symbol and FIG. 3B shows an example of the circuit;

FIGS. 4A and 4B show an inverting logic gate (AND-NOR), wherein FIG. 4A shows the logic symbol and FIG. 4B shows an example of the circuit;

FIGS. 5A and 5B show an inverting logic gate (AND-NOR), wherein FIG. 5A shows the logic symbol and FIG. 5B shows an example of the circuit;

FIGS. 6A and 6B show an inverting logic gate (OR-NAND), wherein FIG. 6A shows the logic diagram and FIG. 6B shows an example of the circuit;

FIGS. 7A and 7B show an inverting logic gate (OR-NAND), wherein FIG. 7A shows the logic symbol and FIG. 7B shows an example of the circuit;

FIGS. 8A and 8B show a two-input AND gate, wherein FIG. 8A shows the logic symbol and FIG. 8B shows an example of the circuit comprising NOT and NAND;

FIGS. 18A and 18B show a gate NAND, wherein FIG. 18A shows the logic symbol and FIG. 18B shows of example of the circuit;

FIGS. 32A and 32B show a gate OR, wherein FIG. 32A shows the logic symbol and FIG. 32B shows the circuit of an embodiment of the present invention;

FIG. 34A shows a layout of a cell (three-input AND-OR) of an embodiment of the present invention;

FIG. 34B shows diffusion regions and gate polysilicon wirings of a cell (three-input AND-OR) of an embodiment of the present invention;

FIG. 35A shows first metal layer wirings of the cell (three-input AND-OR) of an embodiment of the present invention;

FIG. 35B shows second metal layer wirings of the cell (three-input AND-OR) of an embodiment of the present invention;

FIGS. 36A and 36B show a gate AND-OR, wherein FIG. 36A shows the logic symbol and FIG. 36B shows the circuit of an embodiment of the present invention;

FIGS. 40A and 40B show a gate OR-AND, wherein FIG. 40A shows the logic symbol and FIG. 40B shows the circuit of an embodiment of the present invention;

FIG. 45A shows a layout of a cell (four-input AND) of an embodiment of the present invention;

FIG. 45B shows diffusion regions and gate polysilicon wirings of a cell (four-input AND) of an embodiment of the present invention;

FIG. 46A shows first metal layer wirings of the cell (four-input AND) of an embodiment of the present invention;

FIG. 46B shows second metal layer wirings of the cell (four-input AND) of an embodiment of the present invention;

FIGS. 49A and 49B show a gate AND-OR, wherein FIG. 49A shows the logic symbol and FIG. 49B shows the circuit of an embodiment of the present invention;

FIGS. 53A and 53B show a gate OR-AND, wherein FIG. 53A shows the logic symbol and FIG. 53B shows the circuit of an embodiment of the present invention;

FIGS. 56A and 56B show a gate NOR, wherein FIG. 56A shows the logic symbol and FIG. 56B shows the circuit of an embodiment of the present invention;

FIG. 58A shows a layout of a cell (three-input NAND) of an embodiment of the present invention;

FIG. 58B shows diffusion regions and gate polysilicon wirings of a cell (three-input NAND) of an embodiment of the present invention;

FIG. 59A shows first metal layer wirings of the cell (three-input NAND) of an embodiment of the present invention;

FIG. 59B shows second metal layer wirings of the cell (three-input NAND) of an embodiment of the present invention;

FIGS. 60A and 60B show a gate NAND, wherein FIG. 60A shows the logic symbol and FIG. 60B shows the circuit of an embodiment of the present invention;

FIGS. 63A and 63B show a gate NAND, wherein FIG. 63A shows the logic symbol and FIG. 63B shows the circuit of an embodiment of the present invention;

FIGS. 67A and 67B show a gate NOR, wherein FIG. 67A shows the logic symbol and FIG. 67B shows the circuit of an embodiment of the present invention;

FIG. 68A shows a layout of a cell (three-input AND-NOR) of an embodiment of the present invention;

FIG. 68B shows diffusion regions and gate polysilicon wirings of a cell (three-input AND-NOR) of an embodiment of the present invention;

FIG. 69A shows first metal layer wirings of the cell (three-input AND-NOR) of an embodiment of the present invention;

FIG. 69B shows second metal layer wirings of the cell (three-input AND-NOR) of an embodiment of the present invention;

FIGS. 70A and 70B show a gate AND-NOR, wherein FIG. 70A shows the logic symbol and FIG. 70B shows the circuit of an embodiment of the present invention;

FIG. 72A shows first metal layer wirings of the cell (three-input OR-NAND) of an embodiment of the present invention;

FIG. 72B shows second metal layer wirings of the cell (three-input OR-NAND) of an embodiment of the present invention;

FIGS. 73A and 73B show a gate OR-NAND, wherein FIG. 73A shows the logic symbol and FIG. 73B shows the circuit of an embodiment of the present invention;

FIGS. 76A and 76B show a gate NAND, wherein FIG. 76A shows the logic symbol and FIG. 76B shows the circuit of an embodiment of the present invention;

FIGS. 80A and 80B show a gate NOR, wherein FIG. 80A shows the logic symbol and FIG. 80B shows the circuit of an embodiment of the present invention;

FIG. 81A shows a layout of a cell (exclusive OR) of an embodiment of the present invention;

FIG. 81B shows diffusion regions and gate polysilicon wirings of a cell (exclusive OR) of an embodiment of the present invention;

FIG. 82A shows first metal layer wirings of the cell (exclusive OR) of an embodiment of the present invention;

FIG. 82B shows second metal layer wirings of the cell (exclusive OR) of an embodiment of the present invention;

FIGS. 83A and 83B show an exclusive OR, wherein FIG. 83B shows the logic symbol and FIG. 83A shows the circuit of an embodiment of the present invention;

FIG. 84 shows an example of the circuit of an exclusive OR of an embodiment of the present invention;

FIG. 85A show a layout of a cell (exclusive NOR) of an embodiment of the present invention;

FIG. 85B shows diffusion regions and gate polysilicon wirings of a cell (exclusive NOR) of an embodiment of the present invention;

FIG. 86A shows first metal layer wirings of the cell (exclusive NOR) of an embodiment of the present invention;

FIG. 86B shows second metal layer wirings of the cell (exclusive NOR) of an embodiment of the present invention;

FIGS. 87A and 87B show an exclusive NOR, wherein FIG. 87B shows the logic symbol and FIG. 87A shows the circuit of an embodiment of the present invention;

FIG. 88 shows an example of the circuit of an exclusive NOR of an embodiment of the present invention;

FIG. 89A shows a layout of a cell (three-input NOR) of an embodiment of the present invention;

FIG. 89B shows diffusion regions and gate polysilicon wirings of a cell (three-input NOR) of an embodiment of the present invention;

FIG. 90A shows first metal layer wirings of the cell (three-input NOR) of an embodiment of the present invention;

FIG. 90B shows second metal layer wirings of the cell (three-input NOR) of an embodiment of the present invention;

Figures 91A, 91B:
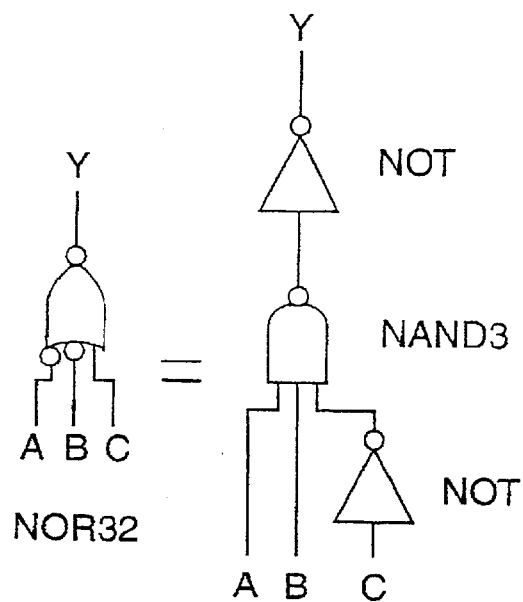
Figure 92:
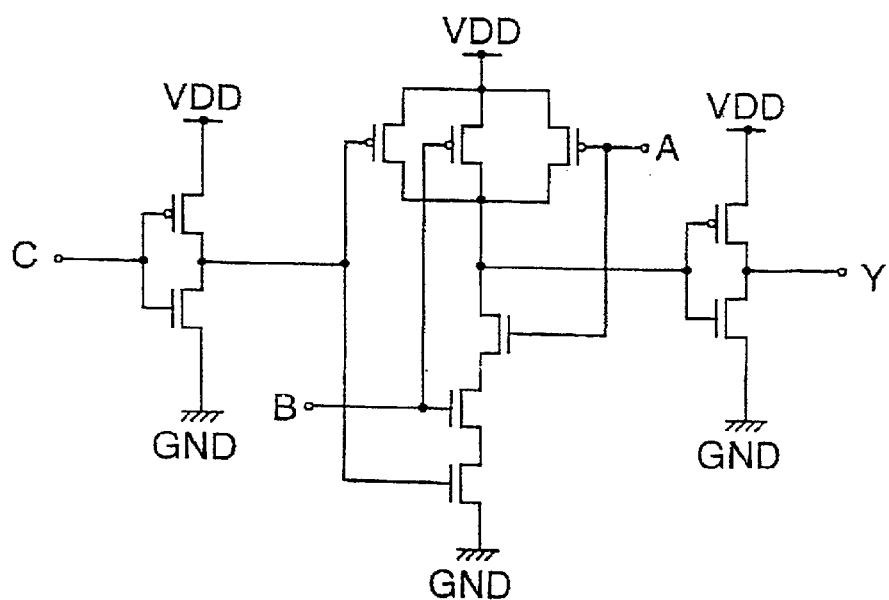
Figure 93A:
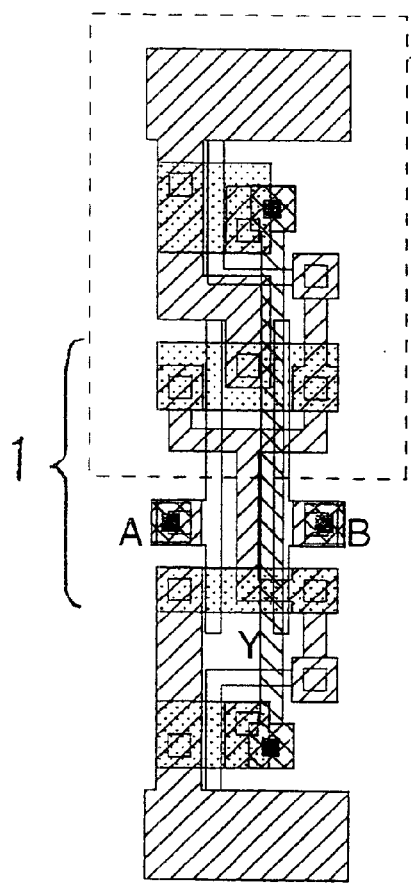
Figure 93B:
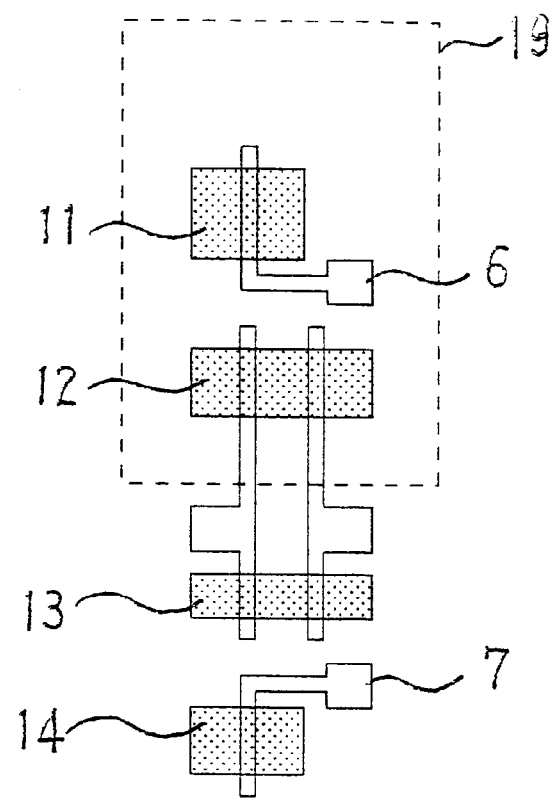
Figures 95A, 95B:
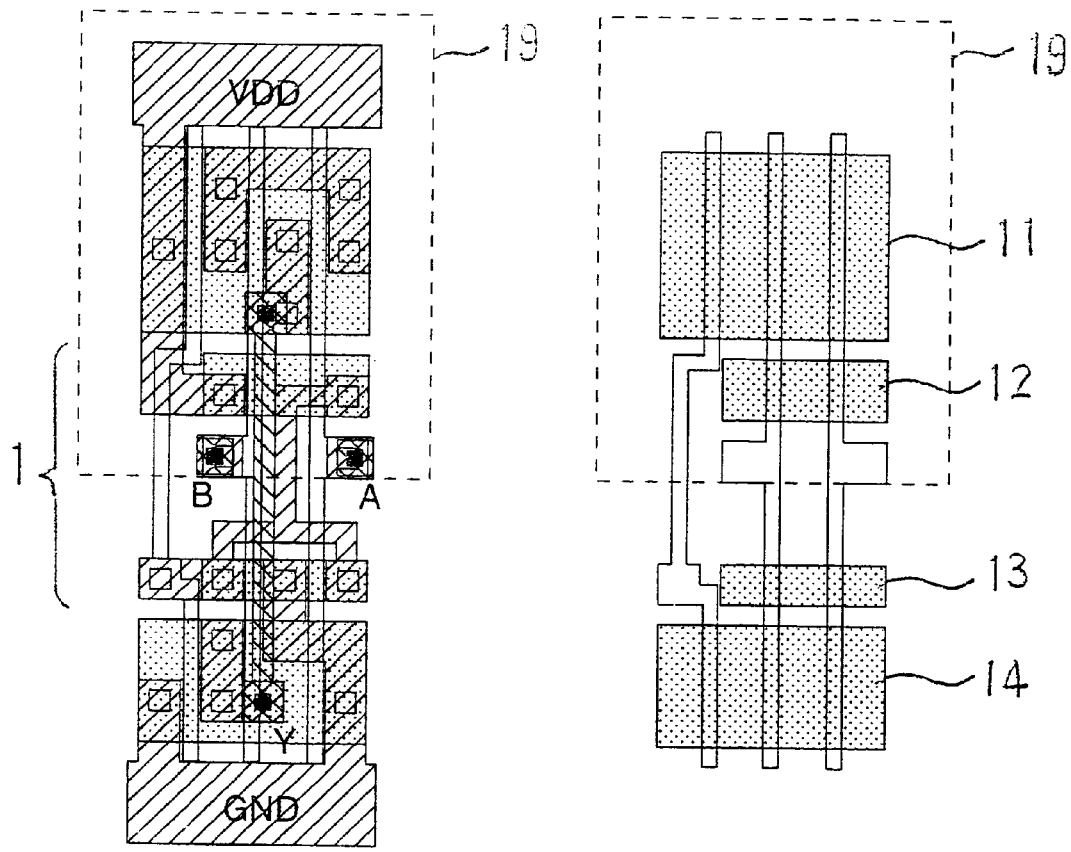
Figure 96A:
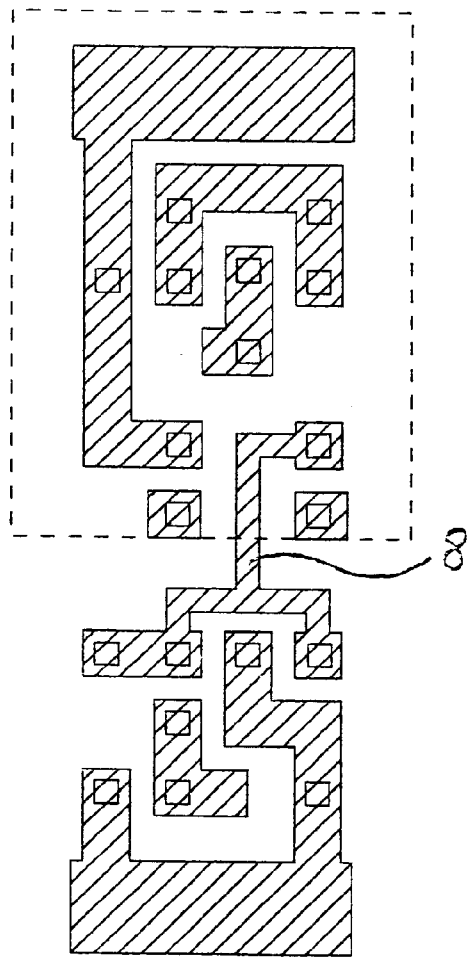
Figure 96B:
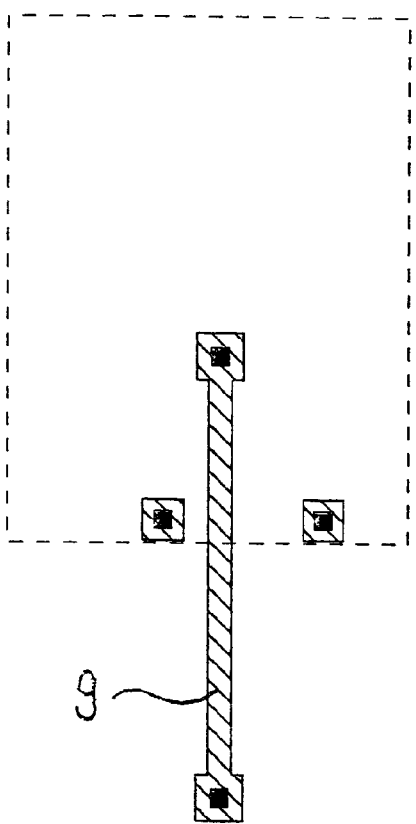

FIGS. 91A and 91B show a NOR, wherein FIG. 91A shows the logic symbol and FIG. 91B shows the circuit of an embodiment of the present invention;

FIG. 92 shows an example of the circuit of a NOR of an embodiment of the present invention;

FIG. 93A shows a layout of a cell (two-input AND) of an embodiment of the present invention;

FIG. 93B shows diffusion regions and gate polysilicon wirings of a cell (two-input AND) of an embodiment of the present invention;

FIG. 94A shows first metal layer wirings of the cell (two-input AND) of an embodiment of the present invention;

FIG. 94B shows second metal layer wirings of the cell (two-input AND) of an embodiment of the present invention;

FIG. 95A shows a layout of a cell (exclusive OR) of an embodiment of the present invention;

FIG. 95B shows diffusion regions and gate polysilicon wirings of a cell (exclusive OR) of an embodiment of the present invention;

FIG. 96A shows first metal layer wirings of the cell (exclusive OR) of an embodiment of the present invention; and FIG. 96B shows second metal layer wirings of the cell (exclusive OR) of an embodiment of the present invention.

DETAILED DESCRIPTION OF THE PREFERRED EMBODIMENTS

The preferred embodiments of the present invention will now be explained.

The present invention covers a logic gate cell that is used as an element in an LSI manufactured through CMOS process, and includes two inverting logic gates 1 and 2, with an output of the first inverting logic gate 1 connected to one of inputs of the second inverting logic gate 2. The inverting logic gates here refer to a NAND gate, a NOR gate, a NOT gate, an AND-NOR compound gate and an OR-NAND compound gate. Referring to a two-input AND gate AND 2 as an embodiment, the present invention is now explained with reference to drawings.

Figure 1A:
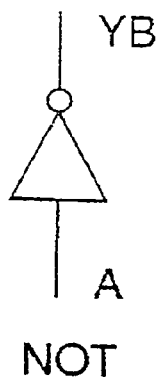
Figure 1B:
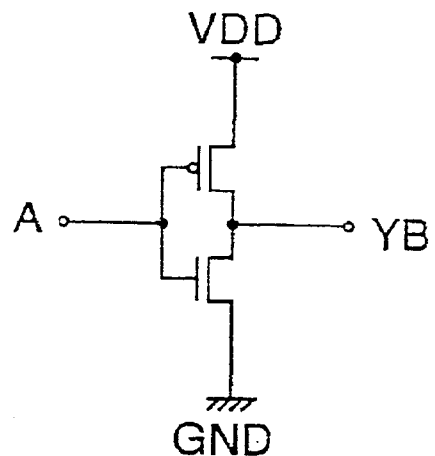
Figure 2A:
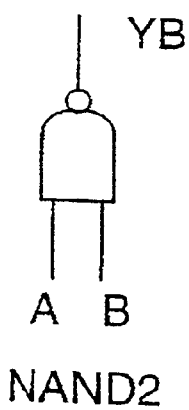
Figure 2B:
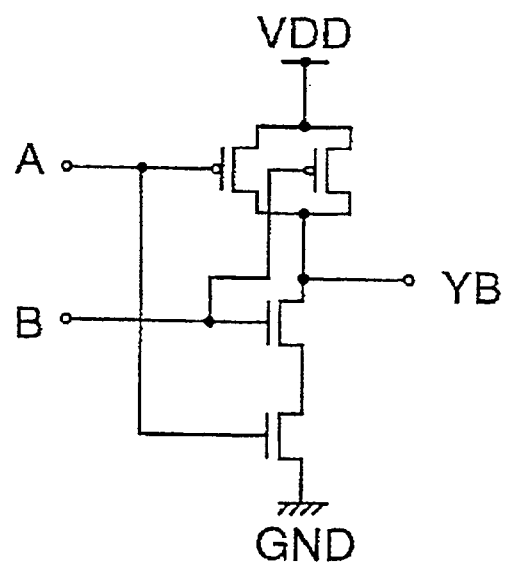
Figure 3A:
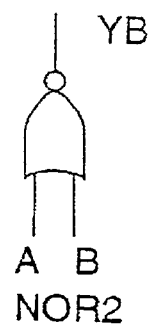
Figure 3B:
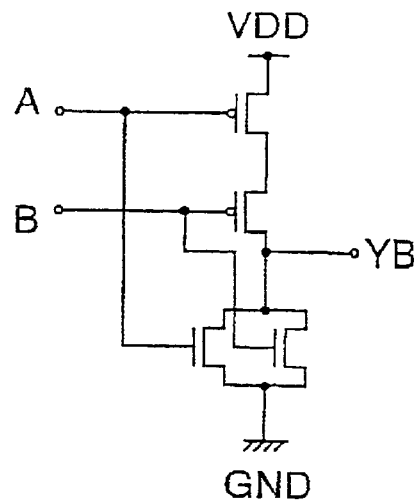
Figure 4A:
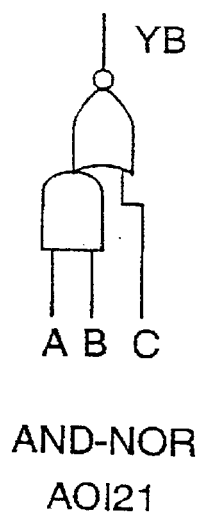
Figure 4B:
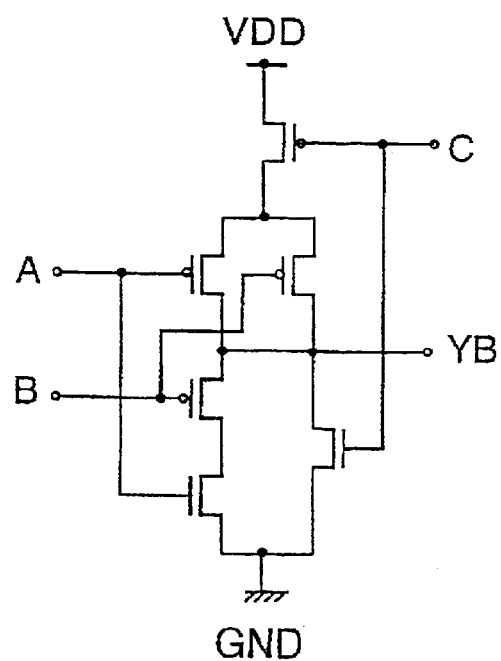
Figure 5A:
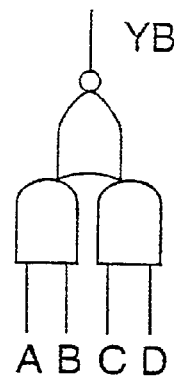
Figure 5B:
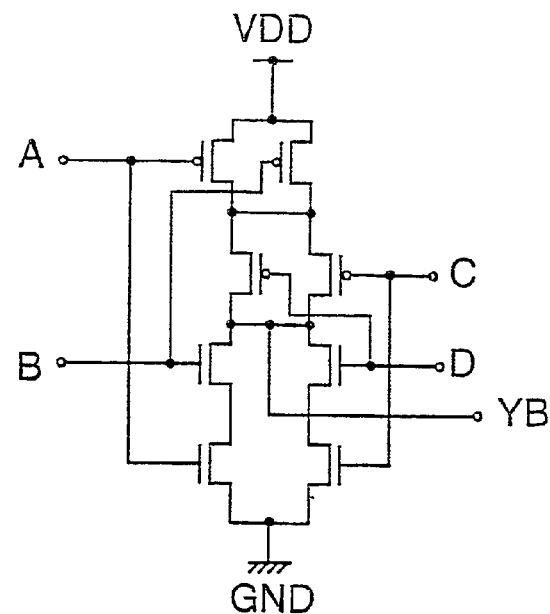
Figure 6A:
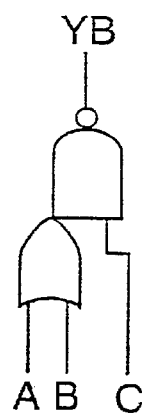
Figure 6B:
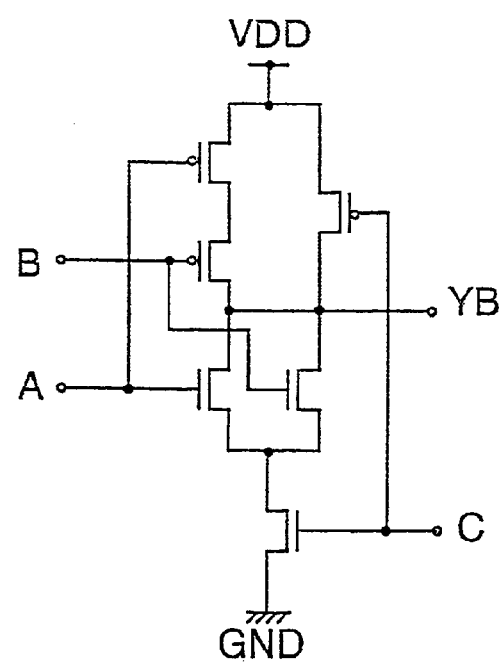
Figure 9:
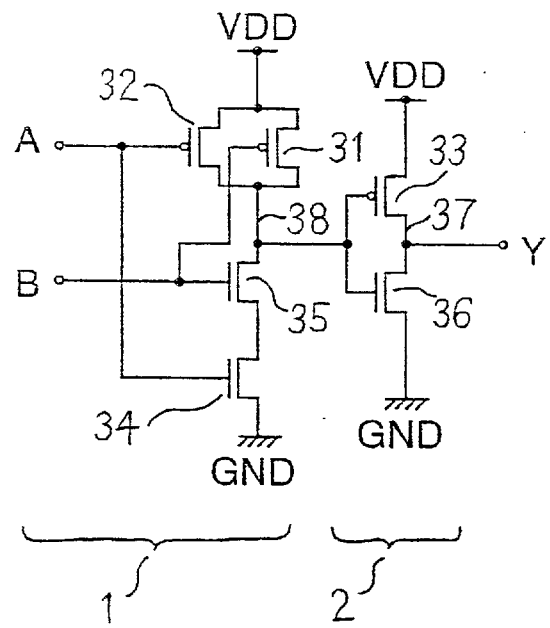
FIG. 9 shows an example of the circuit of a two-input AND gate.
Figure 10:
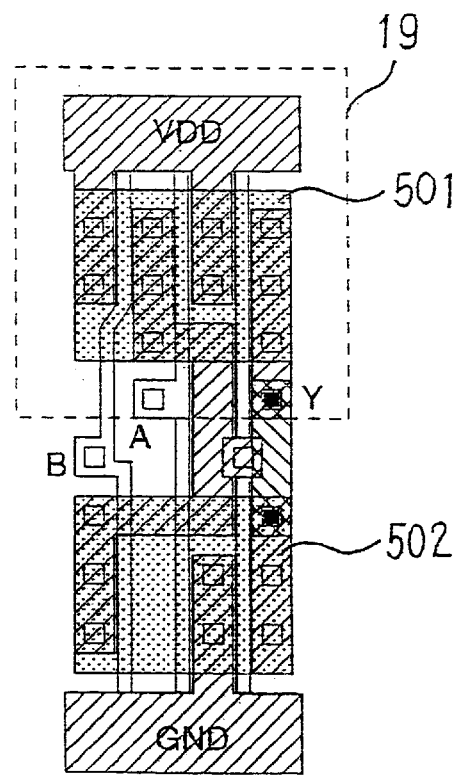
FIG. 10 shows a layout of a cell (AND) of a conventional art.
Figure 11:
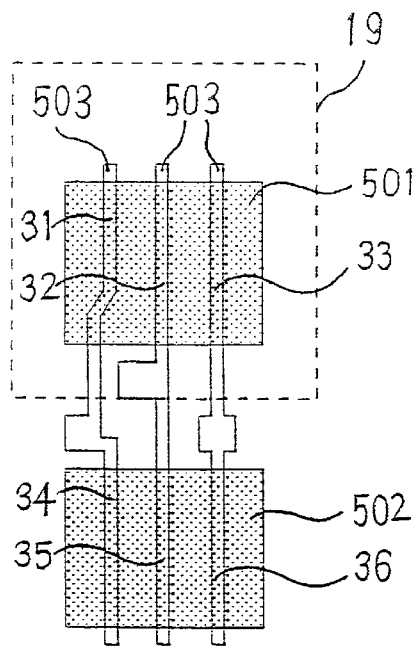
FIG. 11 shows diffusion regions and polysilicon wirings in the cell (AND) of the conventional art.
Figure 12:
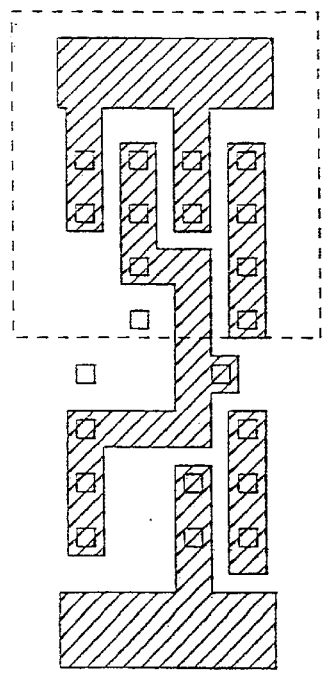
FIG. 12 shows first metal layer wirings of the cell (AND) of the conventional art.
Figure 13:
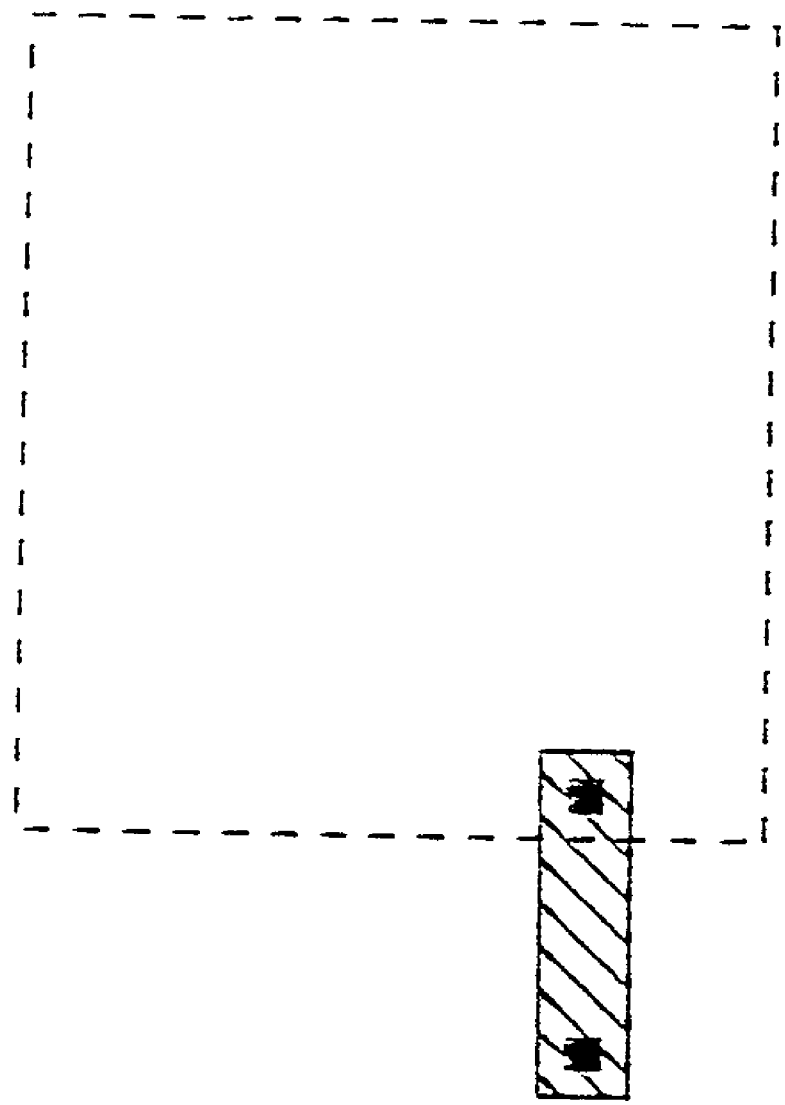
FIG. 13 shows second metal layer wirings of the cell (AND) of the conventional art.
Figure 14:
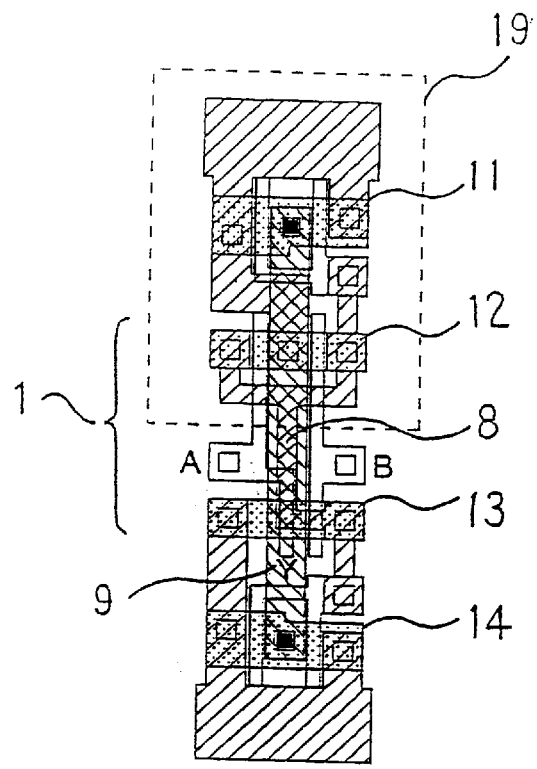
FIG. 14 shows a layout of a cell (AND) of an embodiment of the present invention.
Figure 15:
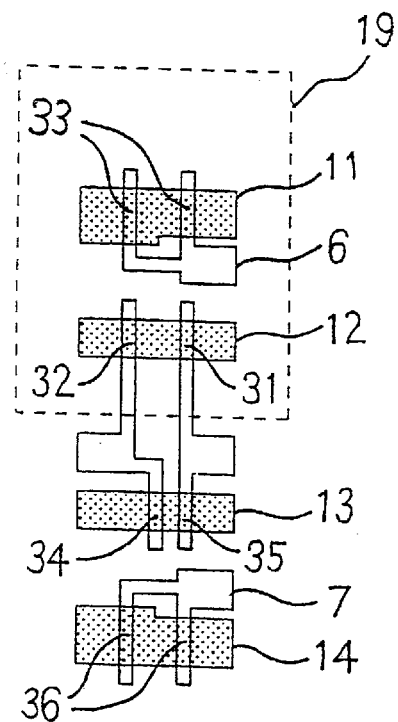
FIG. 15 shows diffusion regions and polysilicon wirings of the cell (AND) of an embodiment of the present invention.
Figure 16:
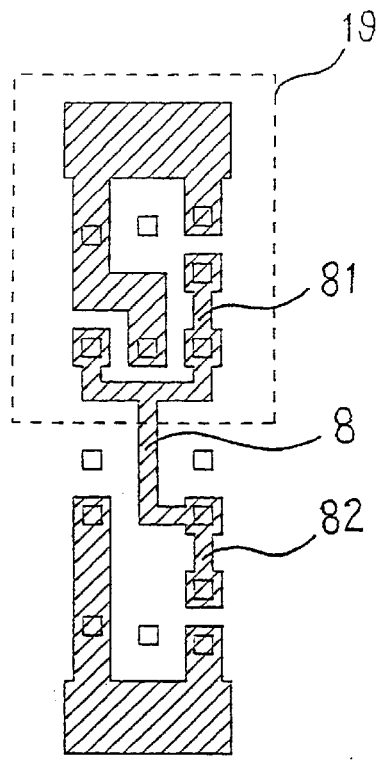
FIG. 16 shows first metal layer wirings of the cell (AND) of an embodiment of the present invention.
Figure 17:
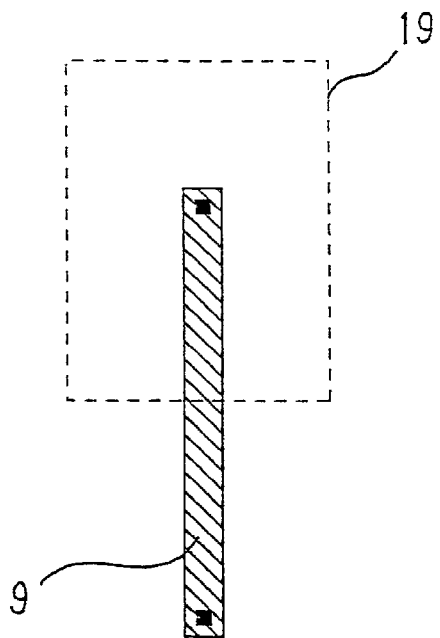
FIG. 17 shows second metal layer wirings of the cell (AND) of an embodiment of the present invention.

The two-input AND gate AND2 has a circuit arrangement in which a gate NAND2 as a first inverting logic gate 1 is connected to a NOT gate as a second inverting logic gate 2 as shown in FIG. 8B, and the output of the gate NAND2 is connected to the input of the NOT gate. An example of the circuit of the gate AND2 is shown in FIG. 9. The gate NAND2, as the first inverting logic gate 1, is constructed of P-type MOS transistors 31 and 32 and N-type MOS transistors 34 and 35, and the NOT gate, as the second inverting logic gate 2, is constructed of a P-type MOS transistor 33 and an N-type MOS transistor 36. The layout of the gate AND2 of the present invention is shown in FIG. 14. FIG. 15 shows diffusion regions and gate polysilicon wirings extracted from the layout shown FIG. 14, FIG. 16 shows the first metal layer wirings extracted from the layout shown FIG. 14, and FIG. 17 shows the second metal layer wirings extracted from the layout shown FIG. 14.

An embodiment corresponding to claim 1 is now discussed. A first diffusion region 11 and a second diffusion region 12 for the P-type MOS transistor, are arranged within a well 19 to form the P-type MOS transistor, and a third diffusion region 13 and a fourth diffusion region 14 to form the N-type MOS transistor, are arranged outside and below the well 19. In this construction, the second diffusion region 12 is thus arranged below the first diffusion region 11, and the fourth diffusion region 14 is thus arranged below the third diffusion region 13. Then, the gate NAND2, as the first inverting logic gate 1, is formed using the second diffusion region 12 and third diffusion region 13, and the NOT gate, as the second inverting logic gate 2, is formed using the first diffusion region 11 and fourth diffusion region 14. The correspondences between the transistors shown in the circuit of FIG. 9 and those in the layout drawing in FIG. 15 are denoted by the same numerals. Next, wirings 37, which also serve as the wiring of an output portion of the second inverting logic gate 2, for interconnecting the P-type MOS transistor and the N-type MOS transistor, are partly or entirely formed of second metal layer wirings 9, and the second metal layer wirings 9 are arranged to extend over the second diffusion region 12 and the third diffusion region 13. Specifically, the second metal layer wirings 9 are arranged to extend over the first inverting logic gate 1 constructed of the diffusion regions 12 and 13.

An embodiment corresponding to claim 2 is now discussed. Wiring 38, which also serve as wirings of an output portion of the first inverting logic gate 1, for interconnecting the P-type MOS transistor and the N-type MOS transistor, are formed of first metal layer wirings 8. Furthermore, the second metal layer wirings 9 of the output portion of the second inverting logic gate 2 are arranged to extend over the first metal layer wirings 8. With this arrangement not adopted, routing the second metal layer wirings 9 not to extend over input terminals A and B will be difficult without changing the cell width from three grids to four grids as shown in FIG. 14. The above arrangement is thus an essential requirement to realize the cell width with the three grids as shown in FIG. 14.

An embodiment corresponding to claims 3 and 4 is now discussed. In a portion of the input of the second inverting logic gate 2 connected to the output of the first inverting logic gate 1, gate polysilicon wirings 6 of the P-type MOS transistor and gate polysilicon wirings 7 of the N-type MOS transistor are interconnected by the first metal layer wirings 8 of the output portion of the first inverting logic gate 1. To attain this interconnection, wirings 81 and 82 extending from the first metal layer wirings 8 are used as shown in FIGS. 14 to 16. This arrangement contributes to a reduction in cell width because no new grids are needed to interconnect the gate polysilicon wirings 6 and 7, and with the above arrangement not adopted, it is difficult to attain the cell width by the three grids.

An embodiment corresponding to claims 5 to 8 is now discussed. A gate width of the P-type MOS transistor in the second inverting logic gate 2 is set to be wider than a gate width of the P-type MOS transistor in the first inverting logic gate 1, and a gate width of the N-type MOS transistor in the second inverting logic gate 2 is set to be wider than a gate width of the N-type MOS transistor in the first inverting logic gate 1. To attain this setting, the height (the vertical length in the drawings) of the first diffusion region 11 is set to be greater than the height of the second diffusion region 12, and the height of the fourth diffusion region 14 is set to be greater than the height of the third diffusion region 13. In this way, the output drive power of the second inverting logic gate 2 is increased while the power consumption of the first inverting logic gate 1 is reduced, and a low power consuming cell having a short output loading delay is thus provided.

An embodiment corresponding to claims 25 to 32 is now discussed. Each of the P-type MOS transistor and the N-type transistor forming the NOT gate of the second inverting logic gate 2 is composed of two MOS transistors connected in parallel. Referring to FIG. 15, the P-type MOS transistor 33 is composed of two MOS transistors, and the N-type MOS transistor 36 is composed of two MOS transistors. Each of the transistors 33 and 36 has a parallel configuration in which diffusion regions of drains are shared by the two transistors. With this arrangement, the cell is provided with an increased drive power and a small loading delay without increasing the cell width.

An embodiment corresponding to claims 33 and 34 is now discussed. The logic gate cell of interest here includes a third inverting logic gate 3, besides the first and second inverting logic gates 1 and 2, and has a circuit arrangement in which the second inverting logic gate 2 is a NOT gate, and the third inverting logic gate 3 is a NOT gate, a NAND gate having two to four inputs, or a NOR gate having two to four inputs, with an output of the third inverting logic gate 3 connected to one of the inputs of the first inverting logic gate 1. In this logic gate cell, the third inverting logic gate 3 is formed of the second diffusion region 12 and the third diffusion region 13, and the remaining construction of the logic gate cell remains substantially identical to the construction of the embodiment according to claims 17 to 24 or claims 25 to 32. As an embodiment, an extended NAND gate NAND32 shown in FIGS. 18A and 18B is discussed.

Figures 18A, 18B:
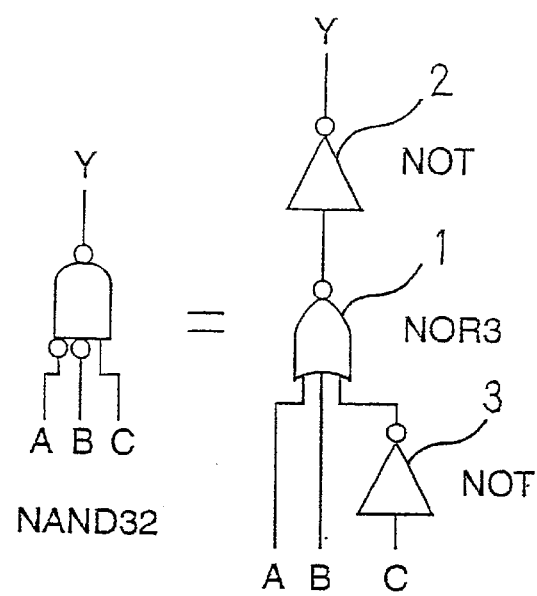
Figure 19:
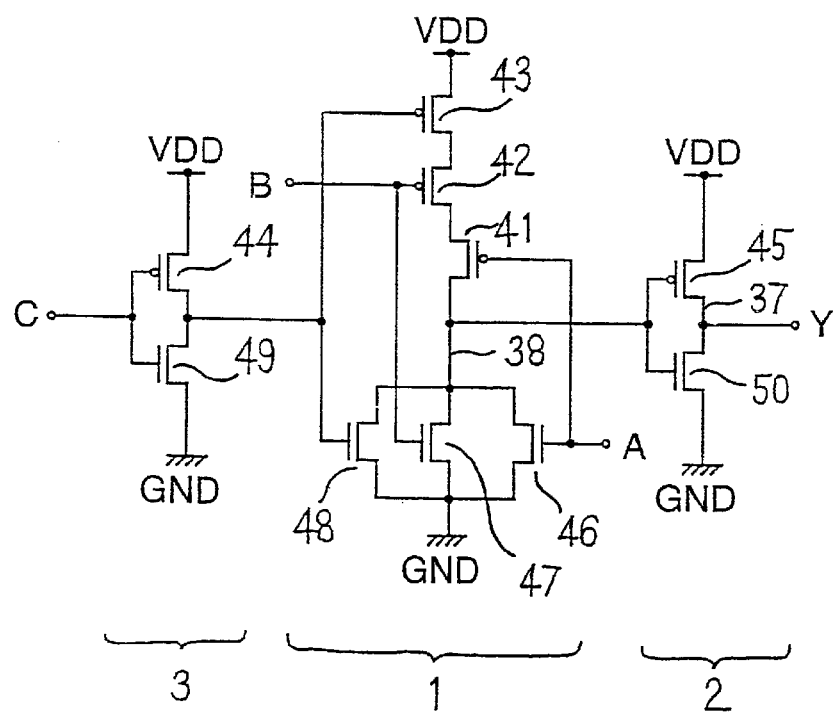
FIG. 19 shows an example of the circuit of the cell (NAND) of an embodiment of the present invention.
Figure 20:
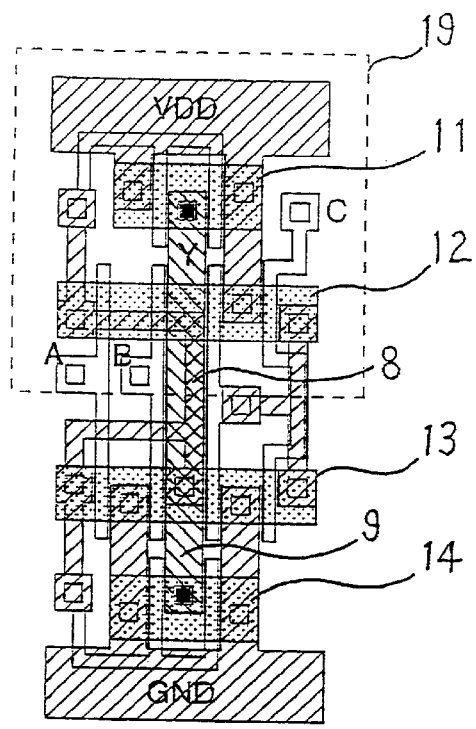
FIG. 20 shows a layout of a cell (NAND) of an embodiment of the present invention.
Figure 21:
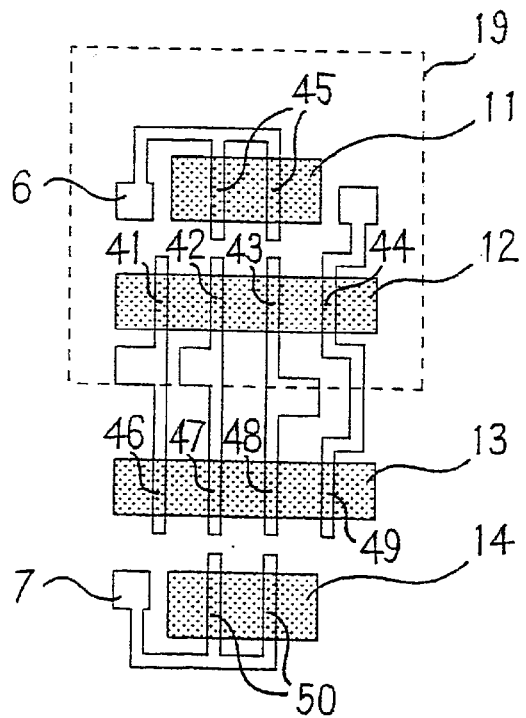
FIG. 21 shows diffusion regions and polysilicon wirings in the cell (NAND) of an embodiment of the present invention.
Figure 22:
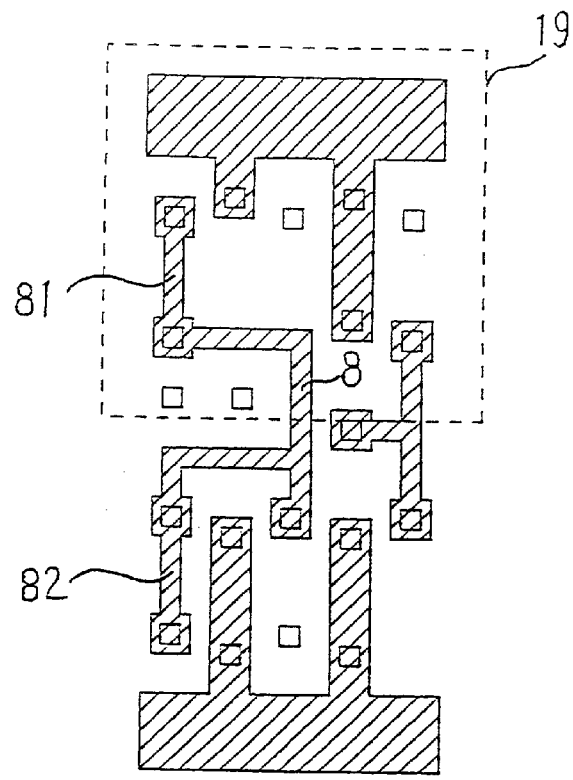
FIG. 22 shows first layer wirings of the cell (NAND) of an embodiment of the present invention.
Figure 23:
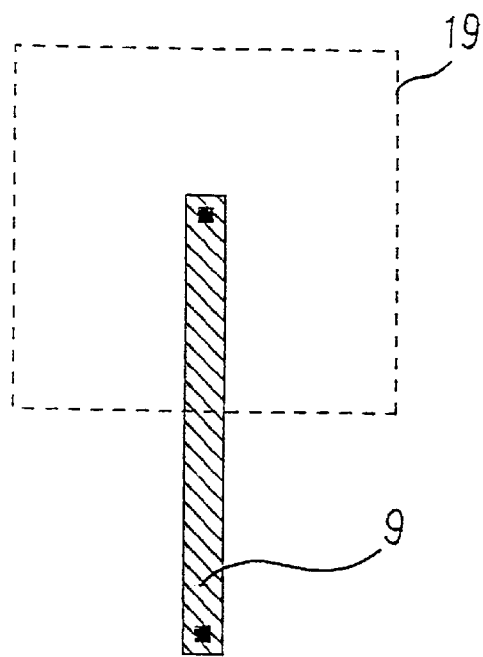
FIG. 23 shows second layer wirings of the cell (NAND) of an embodiment of the present invention.

The logical symbol of the gate NAND32 is shown in FIG. 18A, and the NOT gate as the third inverting logic gate 3, the gate NOR3 as the first inverting logic gate 1 and the NOT gate as the second inverting logic gate 2 are configured as shown in FIG. 18B. FIG. 19 is a circuit diagram of the gate NAND32. The gate NAND32 is composed of P-type MOS transistors 41 to 45 and N-type MOS transistors 46 to 50. FIG. 20 shows the layout of gate NAND32 of the present invention. FIG. 21 shows diffusion regions and gate polysilicon wiring extracted from the layout shown in FIG. 20, FIG. 22 shows first metal layer wirings extracted from the layout shown in FIG. 20, and FIG. 23 shows second metal layer wirings extracted from the layout shown in FIG. 20.

As shown in FIGS. 20 to 23, the first diffusion region 11 and second diffusion region 12 for the P-type MOS transistor are arranged in the well 19 to form the P-type MOS transistor, and the third diffusion region 13 and fourth diffusion region 14 to form the N-type MOS transistor are arranged outside and below the well 19. In this construction, the second diffusion region 12 is thus arranged below the first diffusion region 11, and the fourth diffusion region 14 is thus arranged below the third diffusion region 13. The gate NOR3, as the first inverting logic gate 1 and the NOT gate, as the third inverting logic gate 3, are formed of the second diffusion region 12 and third diffusion region 13, and the NOT gate, as the second inverting logic gate 2, is formed of the first diffusion region 11 and fourth diffusion region 14. The correspondences between the transistors shown in the circuit in FIG. 19 and those in the layout drawing in FIG. 21 are denoted by the same numerals. Next, wirings 37, which also serve as the wiring of an output portion of the second inverting logic gate 2, for interconnecting the P-type MOS transistor and the N-type MOS transistor, are partly or entirely formed of second metal layer wirings 9, and the second metal layer wirings 9 are arranged to extend over the second diffusion region 12 and the third diffusion region 13. Specifically, the second metal layer wirings 9 are arranged to extend over the first inverting logic gate 1 constructed of the diffusion regions 12 and 13. Depending on the layout, the second metal layer wirings 9 may be arranged to extend over the third inverting logic gate 3 constructed of the diffusion regions 12 and 13.

Wiring 38, which also serve as wirings of an output portion of the first inverting logic gate 1, for interconnecting the P-type MOS transistor and the N-type MOS transistor, are formed of first metal layer wirings 8. Furthermore, the second metal layer wirings 9 of the output portion of the second inverting logic gate 2 are arranged to extend over the first metal layer wirings 8. In a portion of the input of the second inverting logic gate 2 connected to the output of the first inverting logic gate 1, gate polysilicon wirings 6 of the P-type MOS transistor and gate polysilicon wirings 7 of the N-type MOS transistor are interconnected by the first metal layer wirings 8 of the output portion of the first inverting logic gate 1. To attain the interconnection, wirings 81 and 82 extending from the first metal layer wirings 8 are used as shown in FIGS. 20 to 22. A gate width of the P-type MOS transistor in the second inverting logic gate 2 is set to be wider than a gate width of the P-type MOS transistors in the first inverting logic gate 1 and the third inverting logic gate 3, and a gate width of the N-type MOS transistor in the second inverting logic gate 2 is set to be wider than a gate width of the N-type MOS transistors in the first inverting logic gate 1 and the third inverting logic gate 3. To attain this setting, the height (the vertical length in the drawings) of the first diffusion region 11 is set to be greater than the height of the second diffusion region 12, and the height of the fourth diffusion region 14 is set to be greater than the height of the third diffusion region 13. Each of the P-type MOS transistor and the N-type transistor forming the NOT gate of the second inverting logic gate 2 is composed of two MOS transistors connected in parallel. Referring to FIG. 21, the P-type MOS transistor 45 is composed of two MOS transistors, and the N-type MOS transistor 50 is composed of two MOS transistors. Each of the transistors 45 and 50 has a parallel configuration in which diffusion regions of drains are shared by the two transistors.

An embodiment corresponding to claims 35 to 37 is now discussed. A cell required to realize an LSI having a desired function is selected from the cells stated in claims 1 to 34 and other cells, and a plurality of these cells are laid out in a standard cell format. Specifically, a plurality of cells are arranged in a plurality of cell rows mutually in parallel, and wirings between cells required to achieve a desired logic and wirings to feed power to all cells are arranged. The layout thus obtained is handled as a block, and interconnects are made so that blocks are used singly or in combination with other blocks, and finally wirings are made to external connection pads to complete the layout of the entire LSI chip.

Figure 24:
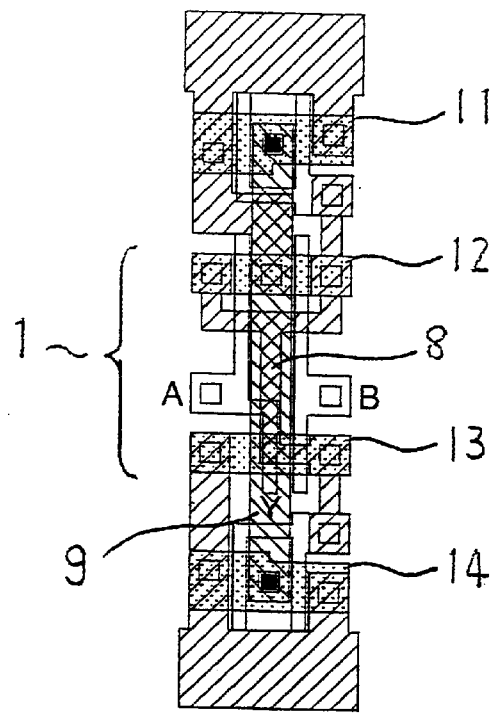
FIG. 24 shows a layout of a cell (AND) of another embodiment of the present invention.
Figure 25:
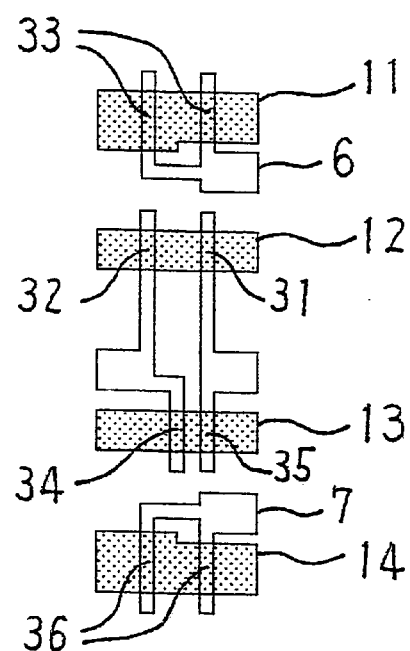
FIG. 25 shows diffusion regions and polysilicon wirings of the cell (AND) of another embodiment of the present invention.
Figure 26:
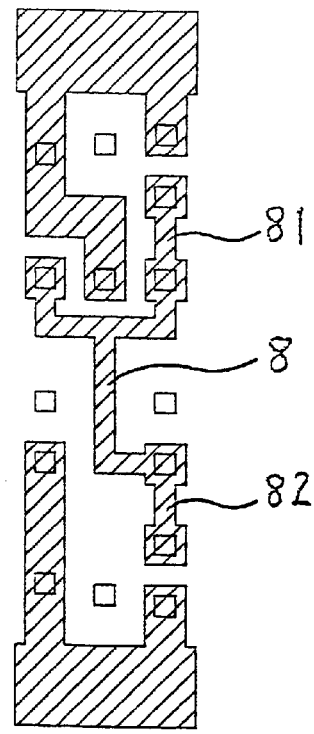
FIG. 26 shows first metal layer wirings of the cell (AND) of another embodiment of the present invention.
Figure 27:
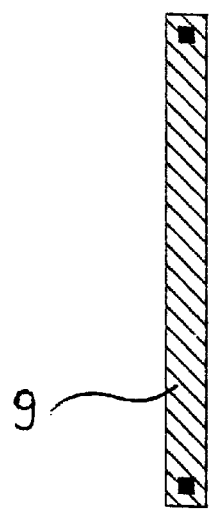
FIG. 27 shows second metal layer wirings of the cell (AND) of another embodiment of the present invention.

Further, an embodiment corresponding to claim 38 is now discussed with reference to FIGS. 24 to 27, FIGS. 8A and 8B and FIG. 9. FIG. 24 is a diagram removing only the well 19 from FIG. 14 and is the same with FIG. 14 at another elements. FIGS. 25 to 27 are respectively diagrams in which the well 19 is removed from FIGS. 15 to 17.

A second diffusion region 12 to form the P-type MOS transistor is arranged below a first diffusion region 11 to form the P-type MOS transistor, a third diffusion region 13 to form an N-type MOS transistor is arranged below the second diffusion region 12 and a fourth diffusion region 14 to form an N-type MOS transistor is arranged below the third diffusion region 13. In this construction, the second diffusion region 12 is thus arranged below the first diffusion region 11, and the fourth diffusion region 14 is thus arranged below the third diffusion region 13. Then, the gate NAND2, as the first inverting logic gate 1, is formed using the second diffusion region 12 and third diffusion region 13, and the NOT gate, as the second inverting logic gate 2, is formed using the first diffusion region 11 and fourth diffusion region 14. The correspondences between the transistors shown in the circuit diagram in FIG. 9 and those in the layout drawing in FIG. 25 are denoted by the same numerals. Next, wirings 37, which also serve as the wirings of an output portion of the second inverting logic gate 2, for interconnecting the P-type MOS transistor and the N-type MOS transistor, are partly or entirely formed of second metal layer wirings 9, and the second metal layer wirings 9 are arranged to extend over the second diffusion region 12 and the third diffusion region 13. Specifically, the second metal layer wirings 9 are arranged to extend over the first inverting logic gate 1 constructed of the diffusion regions 12 and 13.

As described above, only the matter that there is no the well 19 is different from the embodiment corresponding to claim 1. In a standard CMOS process (CMOS bulk process), although the well 19 is necessary for forming the P-type diffusion region to form the P-type MOS transistor, there is a process not to need a well such as CMOS-SOI process and therefore the present embodiment is also applicable to such process.

Similarly, the embodiments corresponding to claims 39 to 48 are respectively different from that corresponding to Claims 2 to 37 at a point that there is no the well 19.

Embodiments

Other embodiments of the present invention will be now explained. The following embodiments correspond to any of claims 1 to 24.

Figures 28A, 28B:
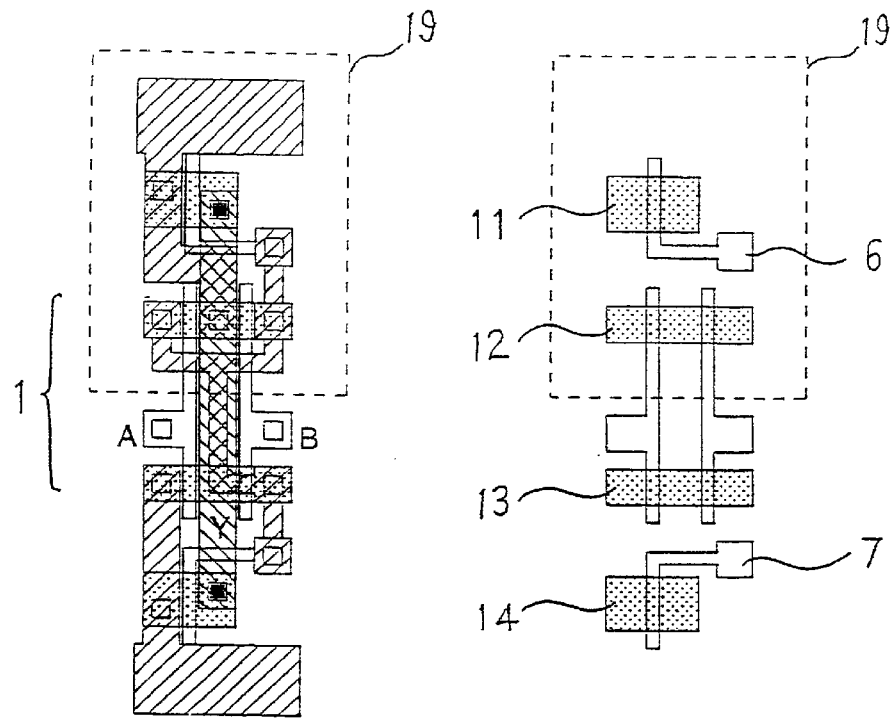
FIG. 28A shows a layout of a cell (two-input AND) of an embodiment of the present invention.
FIG. 28B shows diffusion regions and gate polysilicon wirings of a cell (two-input AND) of an embodiment of the present invention.
Figures 29A, 29B:
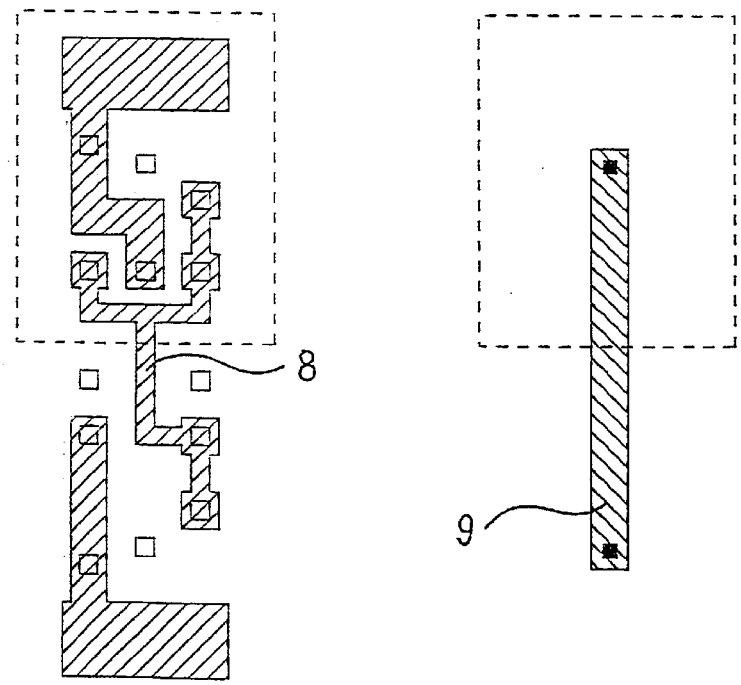
FIG. 29A shows first metal layer wirings of the cell (two-input AND) of an embodiment of the present invention.
FIG. 29B shows second metal layer wirings of the cell (two-input AND) of an embodiment of the present invention.
Figure 30A:
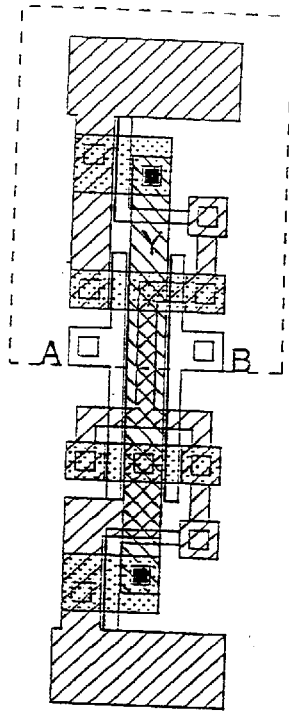
FIG. 30A shows a layout of a cell (two-input OR) of an embodiment of the present invention.
Figure 30B:
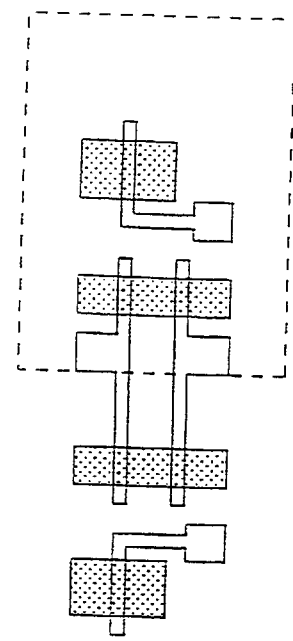
FIG. 30B shows diffusion regions and gate polysilicon wirings of a cell (two-input OR) of an embodiment of the present invention.
Figure 31A:
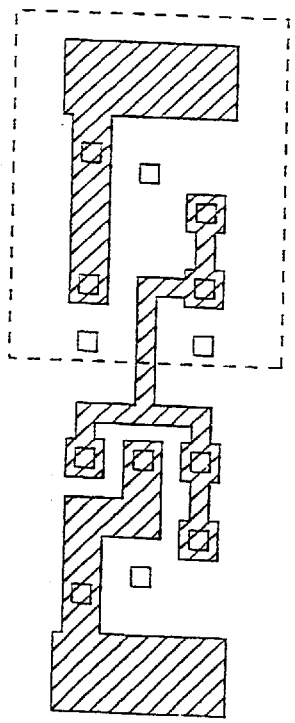
FIG. 31A shows first metal layer wirings of the cell (two-input OR) of an embodiment of the present invention.
Figure 31B:
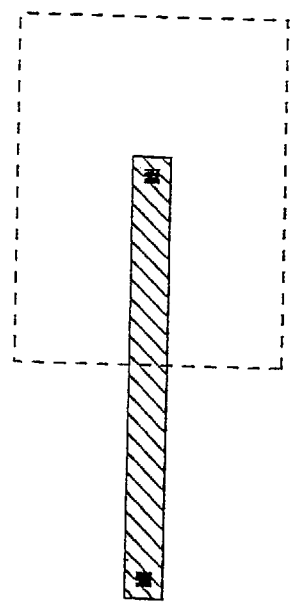
FIG. 31B shows second metal layer wirings of the cell (two-input OR) of an embodiment of the present invention.

FIGS. 28A shows a layout of a two-input AND gate AND2, and its circuit is shown in FIG. 9. The layout in FIG. 28A is different from that in FIG. 14 in that the output portions of transistors 33 and 36 are not connected in parallel, and both layouts are identical in the remaining construction. FIG. 28B shows diffusion regions and gate polysilicon wirings extracted from the layout shown in FIG. 28A. FIG. 29A shows first metal layer wirings extracted from the layout in FIG. 28A, and FIG. 29B shows second metal layer wirings extracted from the layout in FIG. 28A. The same drawing method applies in the subsequent embodiments.

Figures 32A, 32B:
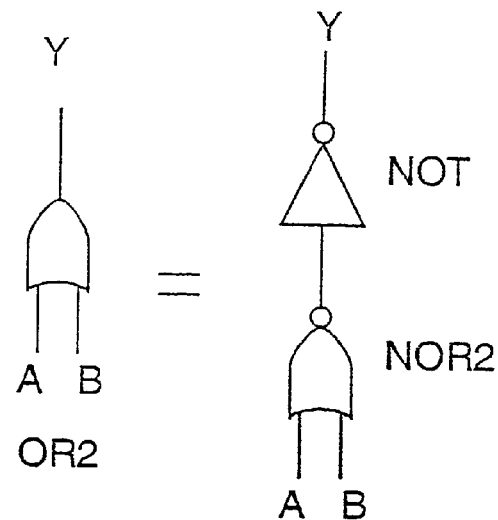
Figure 33:
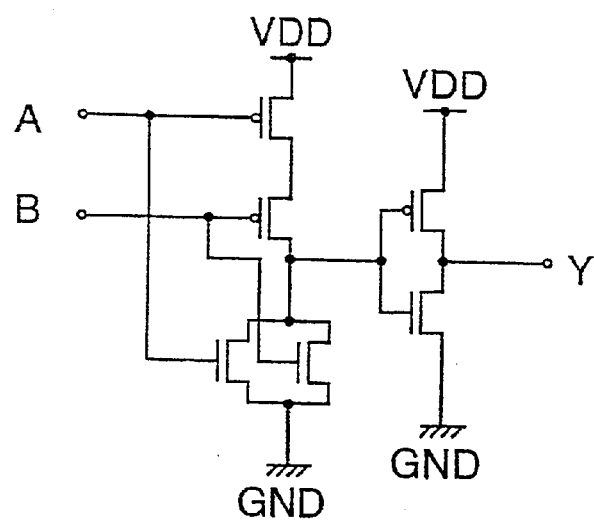
FIG. 33 shows an example of the circuit of OR of an embodiment of the present invention.

FIGS. 30A and 30B and FIGS. 31A and 31B show the layout of a two-input OR gate OR2. Referring to FIG. 32B, the gate OR2 is formed by connecting a gate NOR2 and a NOT gate. FIG. 33 is a circuit diagram of the gate OR2. The layout shown in FIGS. 30A and 30B has the arrangement that is obtained by upside down reversing, in the drawings, the portion of the layout of the gate AND2 shown in FIGS. 28A and 28B, except the well 19.

Figures 36A, 36B:
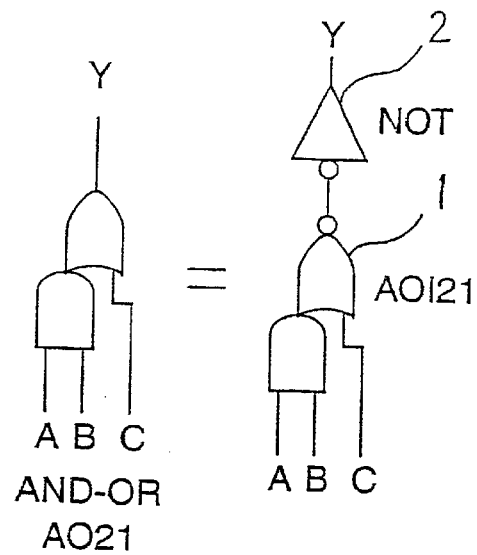
Figure 37:
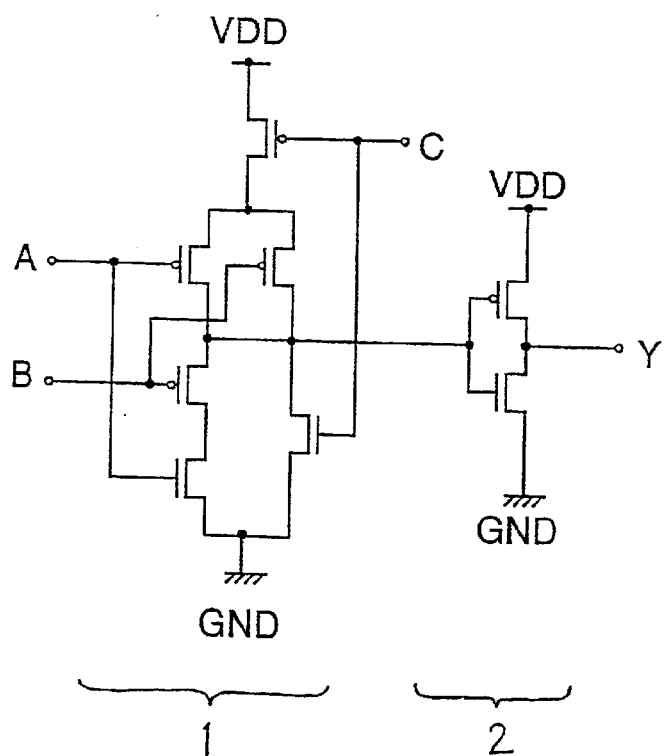
FIG. 37 shows an example of the circuit of AND-OR of an embodiment of the present invention.
Figure 38A:
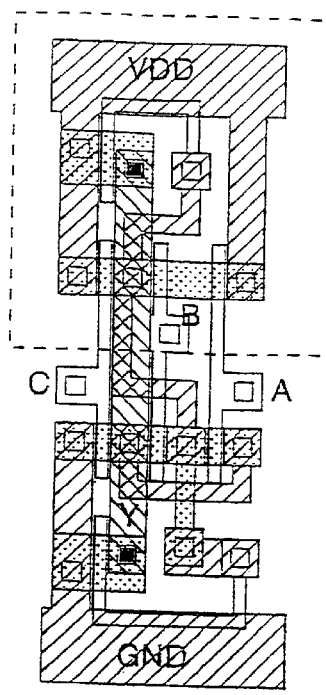
FIG. 38A shows a layout of a cell (three-input OR-AND) of an embodiment of the present invention.
Figure 38B:
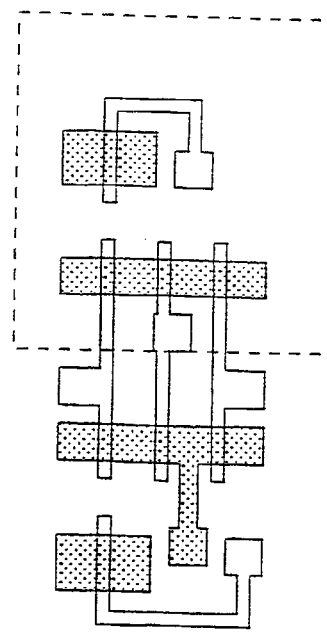
FIG. 38B shows diffusion regions and gate polysilicon wirings of a cell (three-input OR-AND) of an embodiment of the present invention.
Figure 39A:
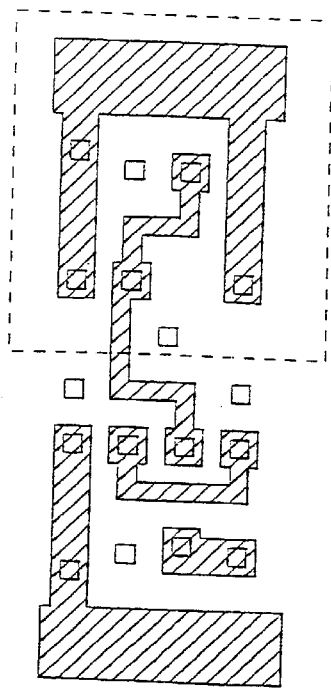
FIG. 39A shows first metal layer wirings of the cell (three-input OR-AND) of an embodiment of the present invention.
Figure 39B:
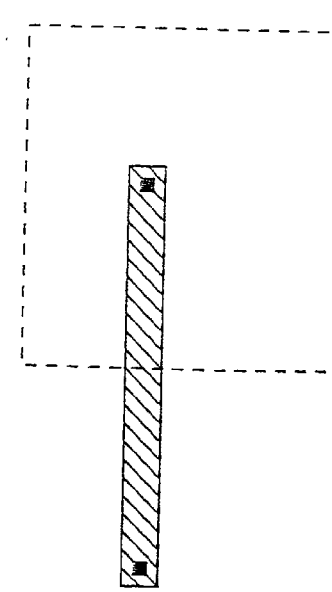
FIG. 39B shows second metal layer wirings of the cell (three-input OR-AND) of an embodiment of the present invention.

FIGS. 34A and 34B and FIGS. 35A and 35B show the layout of a three-input AND-OR gate AO21. As shown in FIGS. 36A and 36B, the gate AO21 has the arrangement in which the gate AOI21, as the first inverting logic gate 1, and a NOT gate, as the second inverting logic gate 2, are connected. FIG. 37 shows a circuit of the gate AO21. The layout shown in FIGS. 34A and 34B and FIGS. 35A and 35B is similar to the layout of the gate AND2 shown in FIG. 14, in the positional relationship between the second metal layer wirings 9 and the first metal layer wirings 8, in the interconnect between the gate polysilicon wirings 6 and 7, in that the height of the first diffusion region 11 is greater than the height of the second diffusion region 12, and in that the height of the fourth diffusion region 14 is greater than the height of the third diffusion region 13. However, the difference between both layouts lies in that part of the interconnect between the gate polysilicon wirings 6 and 7 is formed of diffusion wirings 15.

Figures 40A, 40B:
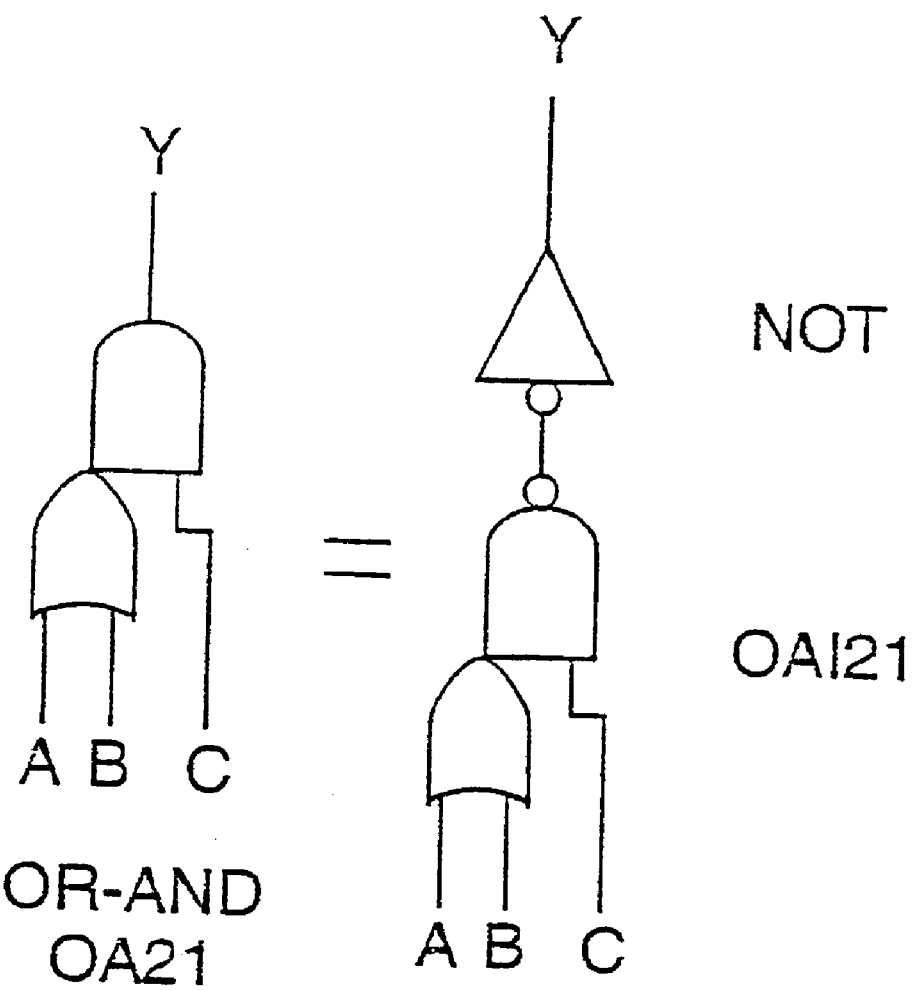
Figure 41A:
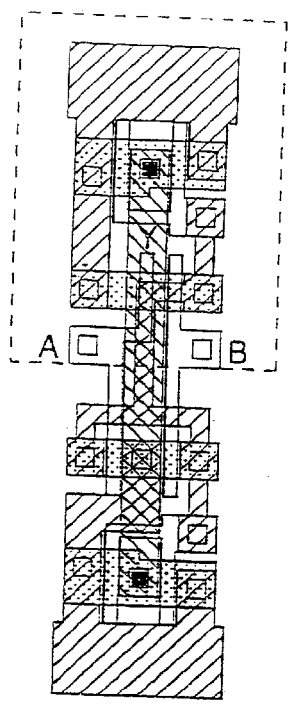
FIG. 41A shows a layout of a cell (two-input OR) of an embodiment of the present invention.
Figure 41B:
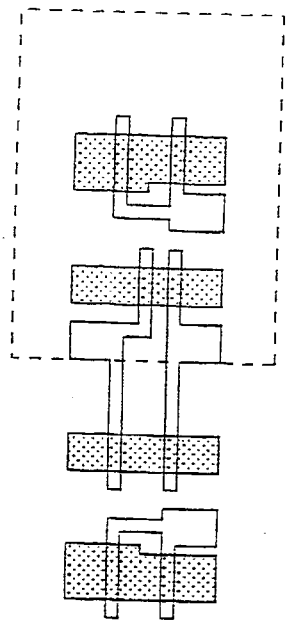
FIG. 41B shows diffusion regions and gate polysilicon wirings of a cell (two-input OR) of an embodiment of the present invention.
Figure 42A:
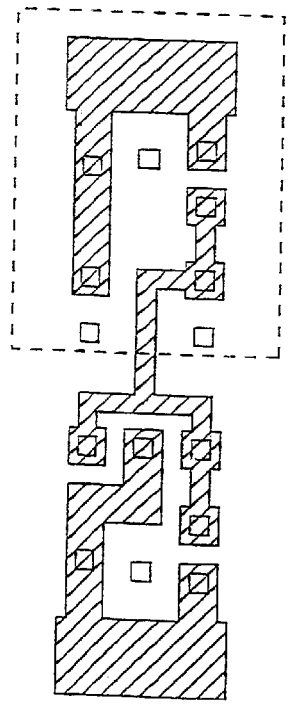
FIG. 42A shows first metal layer wirings of the cell (two-input OR) of an embodiment of the present invention.
Figure 42B:
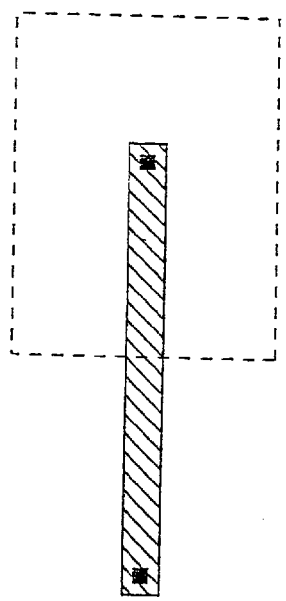
FIG. 42B shows second metal layer wirings of the cell (two-input OR) of an embodiment of the present invention.
Figure 43A:
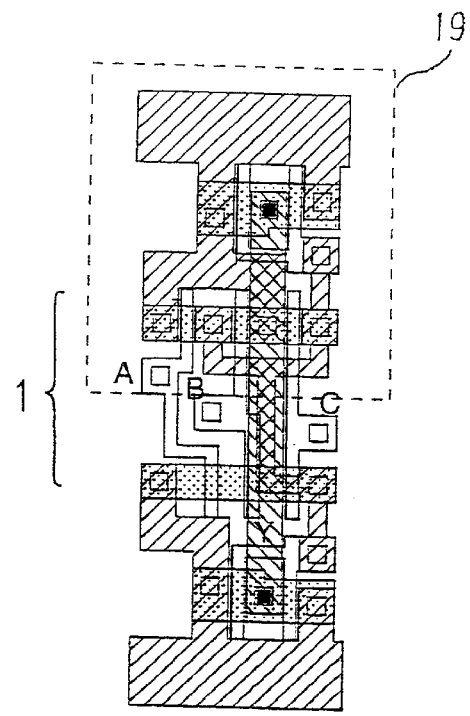
FIG. 43A shows a layout of a cell (three-input AND) of an embodiment of the present invention.
Figure 43B:
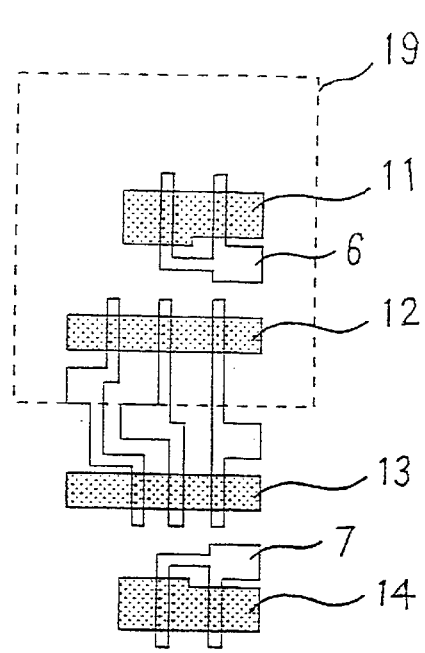
FIG. 43B shows diffusion regions and gate polysilicon wirings of a cell (three-input AND) of an embodiment of the present invention.
Figure 44A:
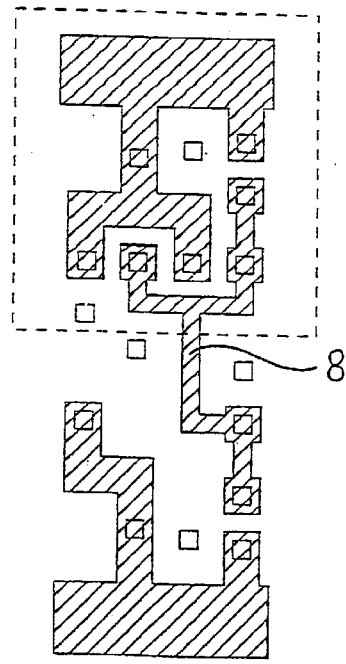
FIG. 44A shows first metal layer wirings of the cell (three-input AND) of an embodiment of the present invention.
Figure 44B:
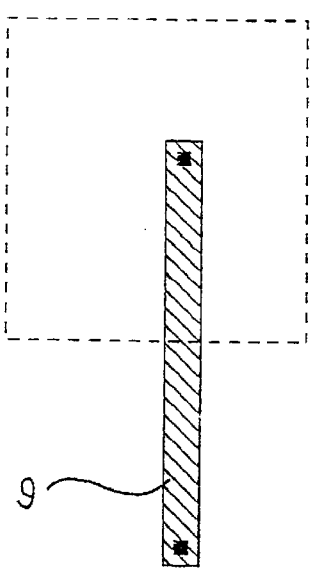
FIG. 44B shows second metal layer wirings of the cell (three-input AND) of an embodiment of the present invention.
Figure 47A:
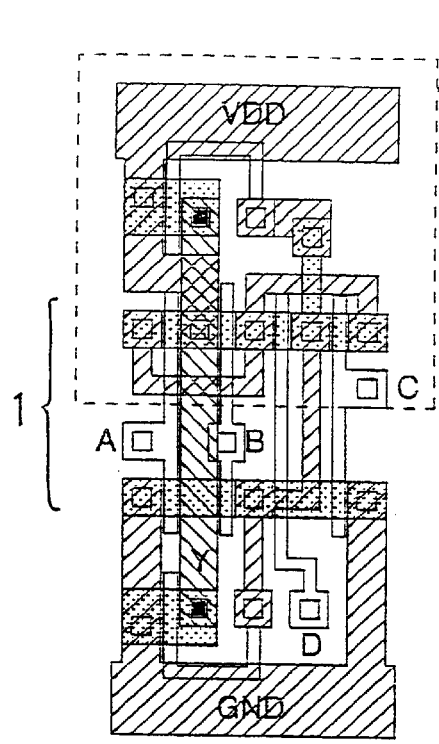
FIG. 47A shows a layout of a cell (four-input AND-OR) of an embodiment of the present invention.
Figure 47B:
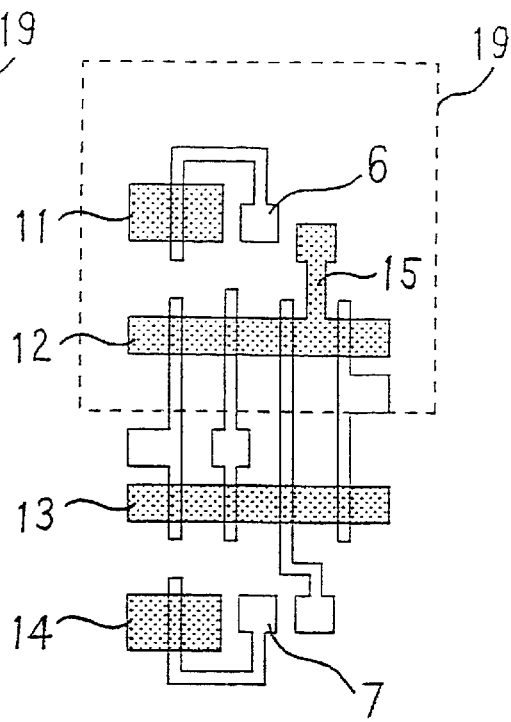
FIG. 47B shows diffusion regions and gate polysilicon wirings of a cell (four-input AND-OR) of an embodiment of the present invention.
Figure 48A:
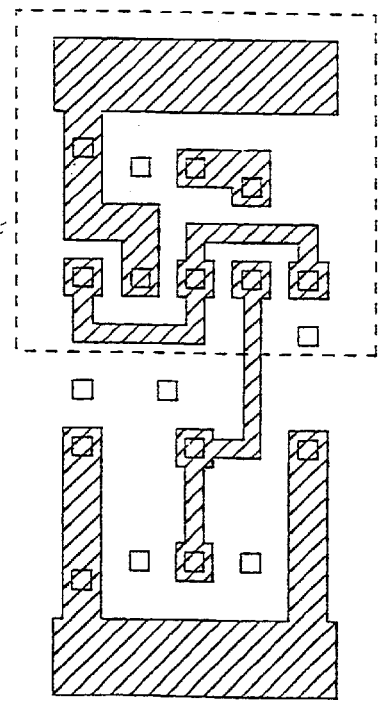
FIG. 48A shows first metal layer wirings of the cell (four-input AND-OR) of an embodiment of the present invention.
Figure 48B:
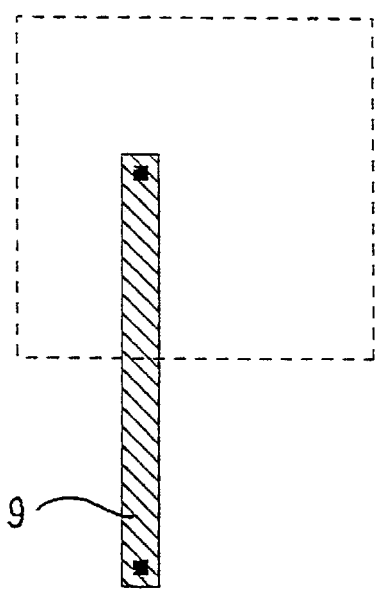
FIG. 48B shows second metal layer wirings of the cell (four-input AND-OR) of an embodiment of the present invention.

FIGS. 38A and 38B and FIGS. 39A and 39B show the layout of a three-input OR-AND gate OA21. As shown in FIG. 40B, the gate OA21 has a circuit arrangement in which the gate OAI21 and a NOT gate are connected. The layout shown in FIGS. 38A and 38B has the arrangement that is obtained by upside down reversing, in the drawings, the portion of the layout of the gate AO21 shown in FIGS. 34A and 34B, except the well 19.

Discussed next are embodiments corresponding to any of claims 1 to 32.

FIGS. 41A and 41B and FIGS. 42A and 42B show the layout of a two-input OR gate OR2. As shown in FIG. 32B, the gate OR2 has a circuit arrangement in which the gate NOR2 and a NOT gate are connected. FIG. 33 shows a circuit of the gate OR2. The layout shown in FIGS. 41A and 41B has the arrangement that is obtained by upside down reversing, in the drawings, the portion of the layout of the gate AND2 shown in FIG. 14, except the well 19.

FIGS. 43A and 43B and FIGS. 44A and 44B show the layout of a three-input AND gate AND3. The gate AND3 has a circuit arrangement in which a three-input NAND gate NAND3, as the first inverting logic gate 1, and a NOT gate, as the second inverting logic gate 2, are connected. The layout shown in FIGS. 43A and 43B and FIGS. 44A and 44B is similar to the layout of the gate AND2 shown in FIG. 14, in the use of the four diffusion regions 11 to 14, in the positional relationship between the second metal layer wirings 9 and the first metal layer wirings 8, in the interconnect between the gate polysilicon wirings 6 and 7, in that the height of the first diffusion region 11 is greater than the height of the second diffusion region 12, in that the height of the fourth diffusion region 14 is greater than the height of the third diffusion region 13 and in that the two transistors for the output NOT gate are used in parallel configuration.

FIGS. 45A and 45B and FIGS. 46A and 46B show the layout of a four-input AND gate AND4. The gate AND4 has a circuit arrangement in which a four-input NAND gate NAND4, as the first inverting logic gate 1, and a NOT gate, as the second inverting logic gate 2, are connected. The layout shown in FIGS. 45A and 45B and FIGS. 46A and 46B is similar to the layout of the gate AND2 shown in FIG. 14, in the use of the four diffusion regions 11 to 14, in the positional relationship between the second metal layer wirings 9 and the first metal layer wirings 8, in the interconnect between the gate polysilicon wirings 6 and 7, in that the height of the first diffusion region 11 is greater than the height of the second diffusion region 12, in that the height of the fourth diffusion region 14 is greater than the height of the third diffusion region 13 and in that the two transistors for the output NOT gate are used in parallel configuration.

Further, discussed next are embodiments that are particular in that they correspond to any of claim 1 and claims 3 to 24 but not claim 2.

Figures 49A, 49B:
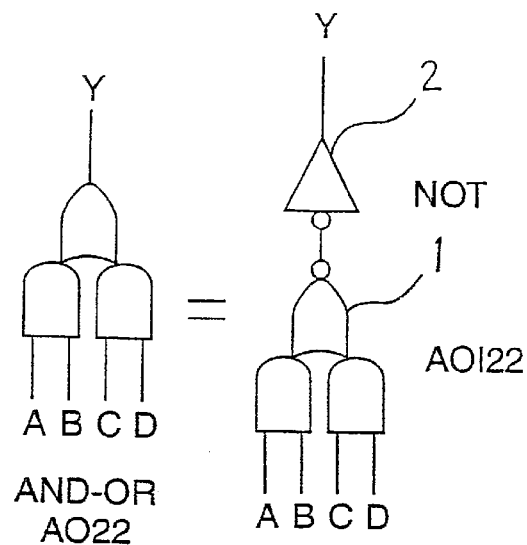
Figure 50:
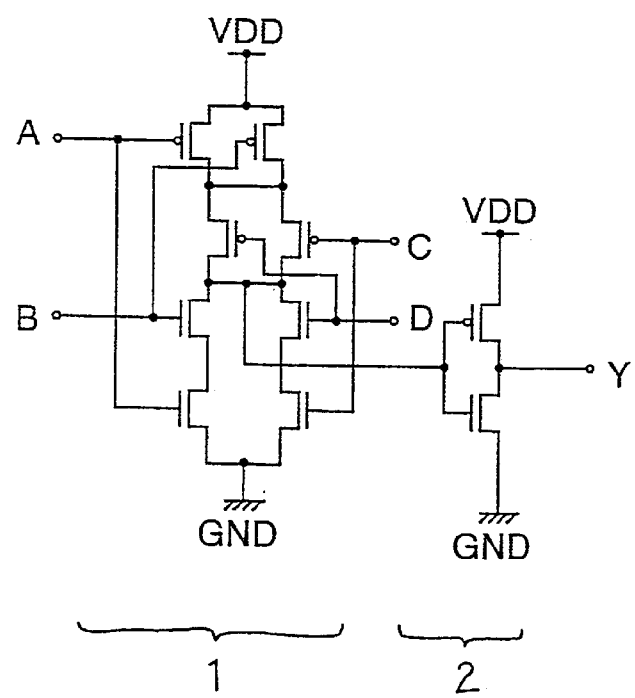
FIG. 50 shows an example of the circuit of AND-OR of an embodiment of the present invention.
Figure 51A:
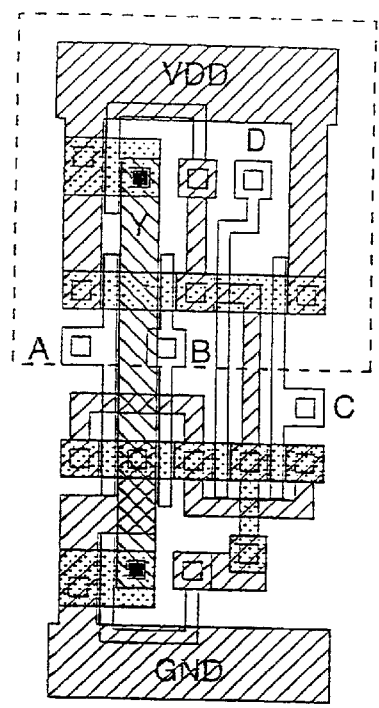
FIG. 51A shows a layout of a cell (four-input OR-AND) of an embodiment of the present invention.
Figure 51B:
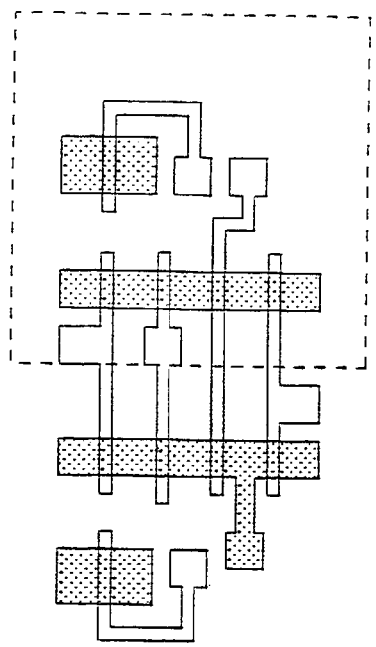
FIG. 51B shows diffusion regions and gate polysilicon wirings of a cell (four-input OR-AND) of an embodiment of the present invention.
Figure 52A:
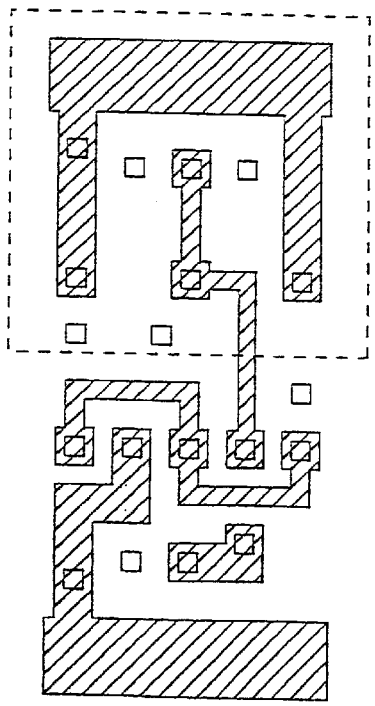
FIG. 52A shows first metal layer wirings of the cell (four-input OR-AND) of an embodiment of the present invention.
Figure 52B:
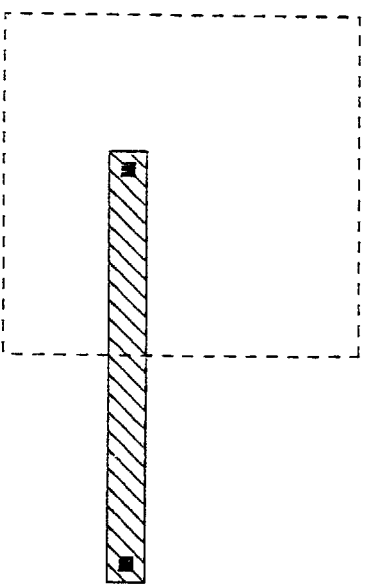
FIG. 52B shows second metal layer wirings of the cell (four-input OR-AND) of an embodiment of the present invention.

FIGS. 47A and 47B and FIGS. 48A and 48B show the layout of a four-input AND-OR gate AO22. As shown in FIG. 49B, the gate AO22 has a circuit arrangement in which the gate AOI22, as the first inverting logic gate 1, and a NOT gate, as the second inverting logic gate 2, are connected. The circuit diagram of the gate AO22 is shown in FIG. 50. The layout shown in FIGS. 47A and 47B and FIGS. 48A and 48B is similar to the layout of the gate AND2 shown in FIG. 14, in the interconnect between the gate polysilicon wirings 6 and 7, in that the height of the first diffusion region 11 is greater than the height of the second diffusion region 12, and in that the height of the fourth diffusion region 14 is greater than the height of the third diffusion region 13. However, the difference between both layouts lies in that part of the interconnect between the gate polysilicon wirings 6 and 7 is formed of diffusion wirings 15. Furthermore, the difference between both layouts lies in that the second metal layer wirings 9 does not extend over the output wirings of the first inverting logic gate 1, and for this reason, the present embodiment does not correspond to claim 2.

Figures 53A, 53B:
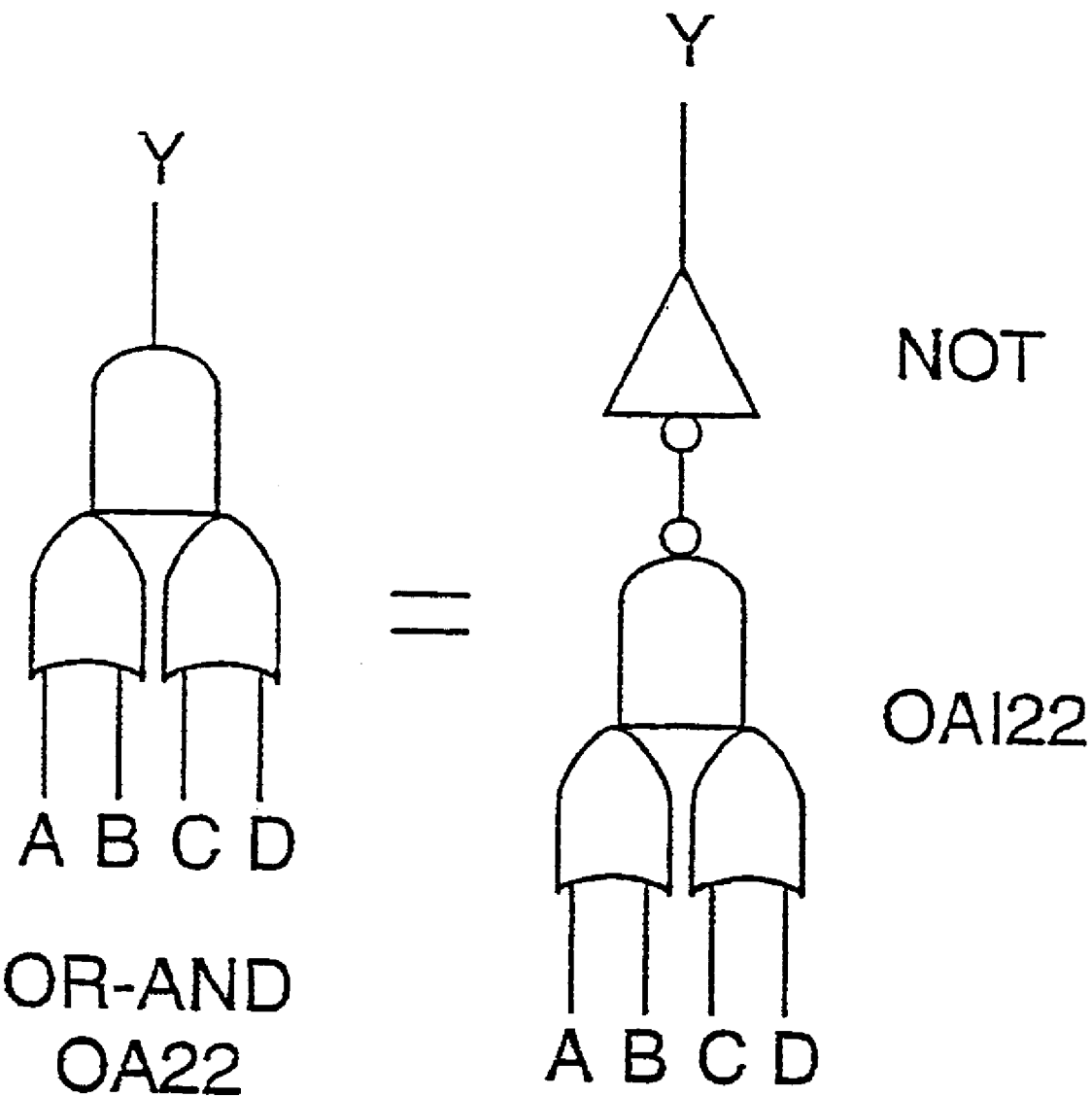
Figures 54A, 54B:
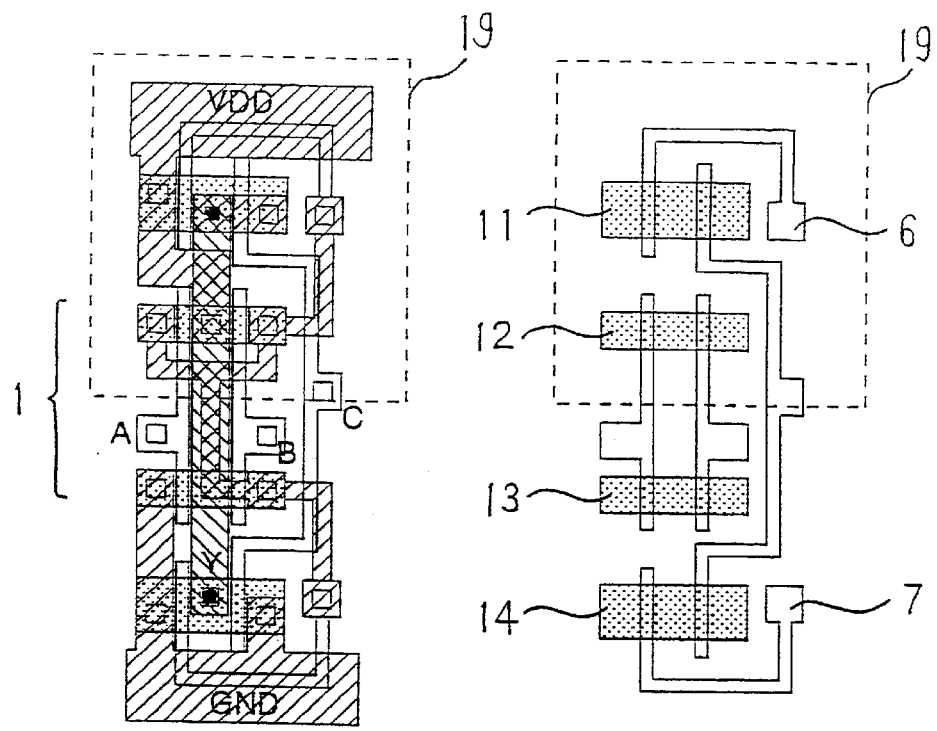
FIG. 54A shows a layout of a cell (three-input NOR) of an embodiment of the present invention.
FIG. 54B shows diffusion regions and gate polysilicon wirings of a cell (three-input NOR) of an embodiment of the present invention.
Figures 55A, 55B:
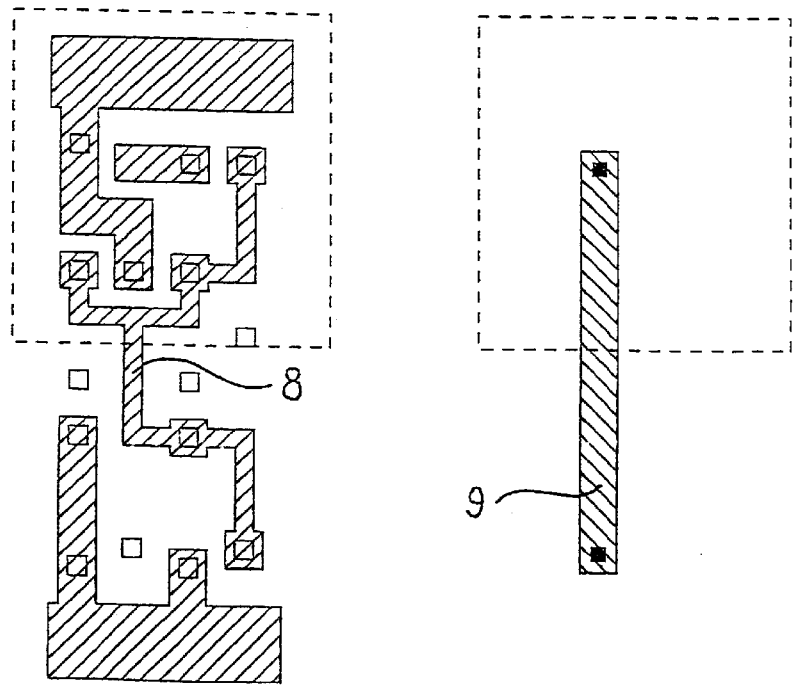
FIG. 55A shows first metal layer wirings of the cell (three-input NOR) of an embodiment of the present invention.
FIG. 55B shows second metal layer wirings of the cell (three-input NOR) of an embodiment of the present invention.

FIGS. 51A and 51B and FIGS. 52A and 52B show the layout of a four-input OR-AND gate OA22. As shown in FIG. 53B, the gate OA22 has a circuit arrangement in which the gate OAI22 and a NOT gate are connected. The layout shown in FIGS. 51A and 51B has the arrangement that is obtained by upside down reversing, in the drawings, the portion of the layout of the gate AO22 shown in FIGS. 47A and 47B, except the well 19.

Embodiments corresponding to claims 1 to 16 are now discussed.

Figures 56A, 56B:
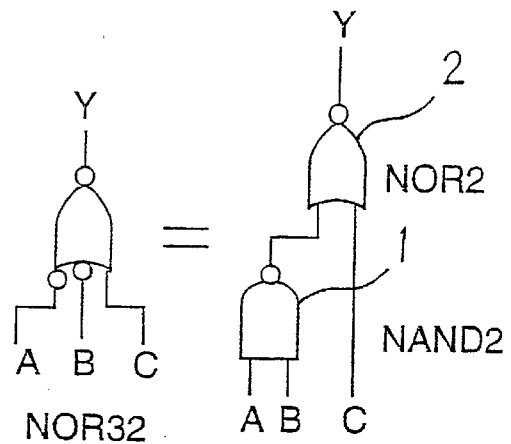
Figure 57:
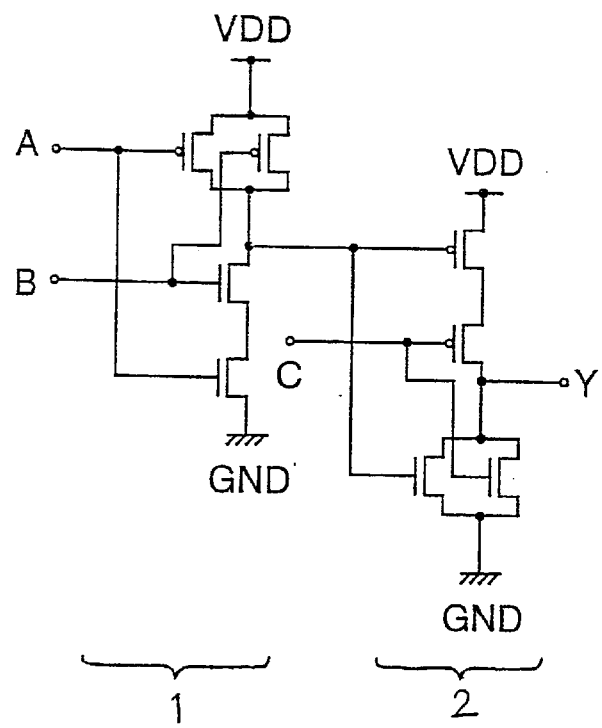
FIG. 57 shows an example of the circuit of NOR of an embodiment of the present invention.

FIGS. 54A and 54B and FIGS. 55A and 55B show the layout of a three-input, extended NOR gate NOR32. As shown in FIG. 56B, the gate NOR32 has a circuit arrangement in which the gate NAND2, as the first inverting logic gate 1, and the gate NOR2, as the second inverting logic gate 2, are connected. The circuit of the gate NOR32 is shown in FIG. 57. The layout shown in FIGS. 54A and 54B and FIGS. 55A and 55B is similar to the layout of the gate AND2 shown in FIG. 14, in the use of the four diffusion regions 11 to 14, in the positional relationship between the second metal layer wirings 9 and the first metal layer wirings 8, in the interconnect between the gate polysilicon wirings 6 and 7, in that the height of the first diffusion region 11 is greater than the height of the second diffusion region 12, and in that the height of the fourth diffusion region 14 is greater than the height of the third diffusion region 13.

Figures 60A, 60B:
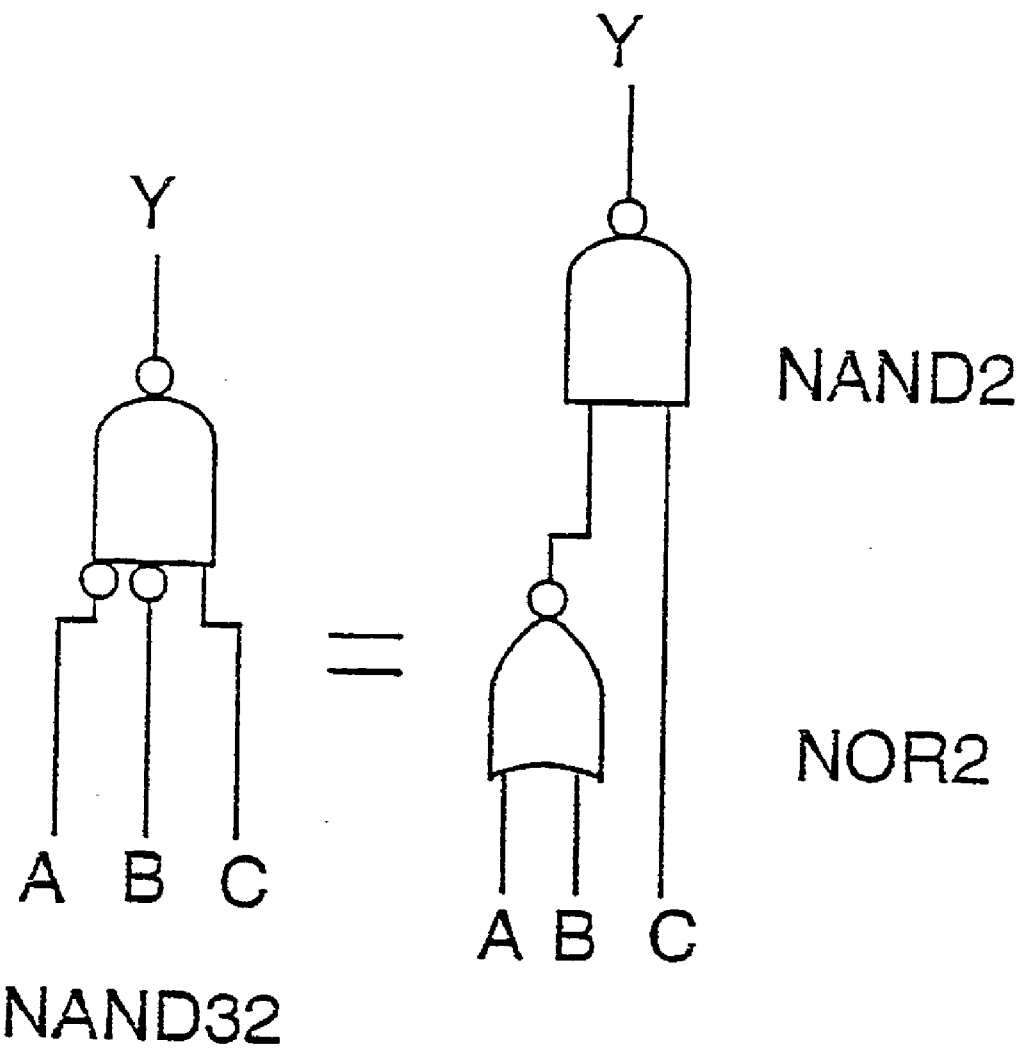
Figures 61A, 61B:
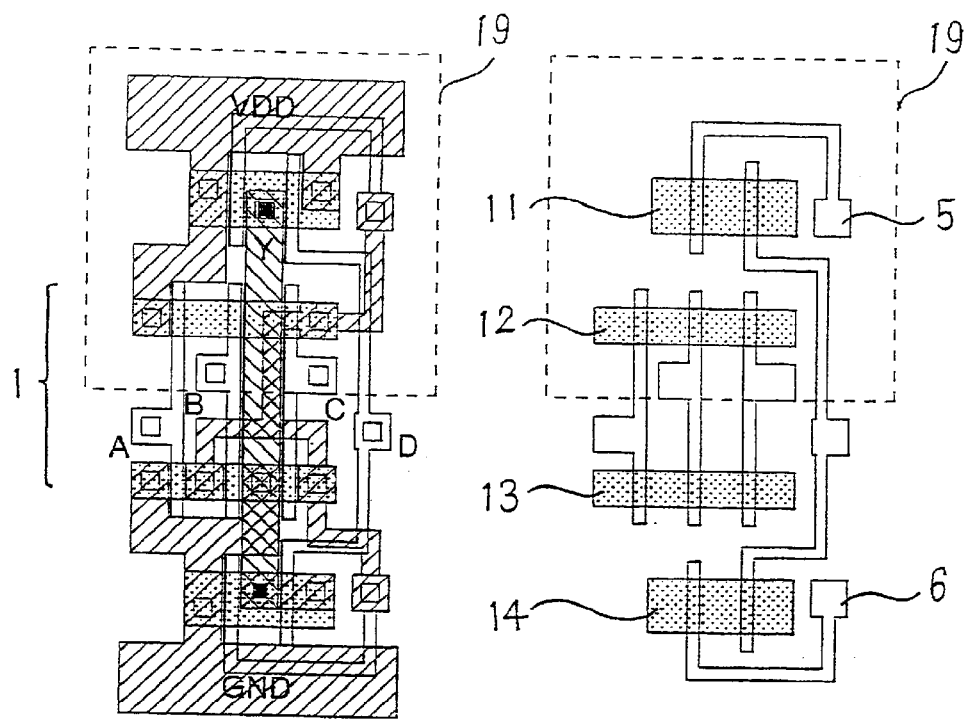
FIG. 61A shows a layout of a cell (four-input NAND) of an embodiment of the present invention.
FIG. 61B shows diffusion regions and gate polysilicon wirings of a cell (four-input NAND) of an embodiment of the present invention.
Figures 62A, 62B:
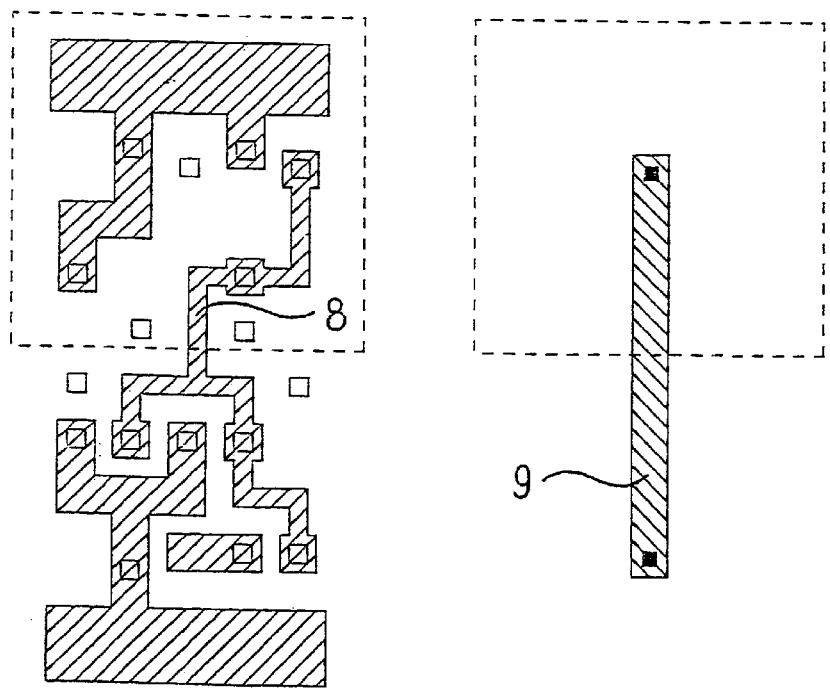
FIG. 62A shows first metal layer wirings of the cell (four-input NAND) of an embodiment of the present invention.
FIG. 62B shows second metal layer wirings of the cell (four-input NAND) of an embodiment of the present invention.

FIGS. 58A and 58B and FIGS. 59A and 59B show the layout of a three-input extended NAND gate NAND32. As shown in FIG. 60B, the gate NAND32 has a circuit arrangement in which the gate NOR2 and the gate NAND2 are connected. The layout shown in FIGS. 58A and 58B has the arrangement that is obtained by upside down reversing, in the drawings, the portion of the layout of the gate NOR32 shown in FIGS. 54A and 54B, except the well 19.

Figures 63A, 63B:
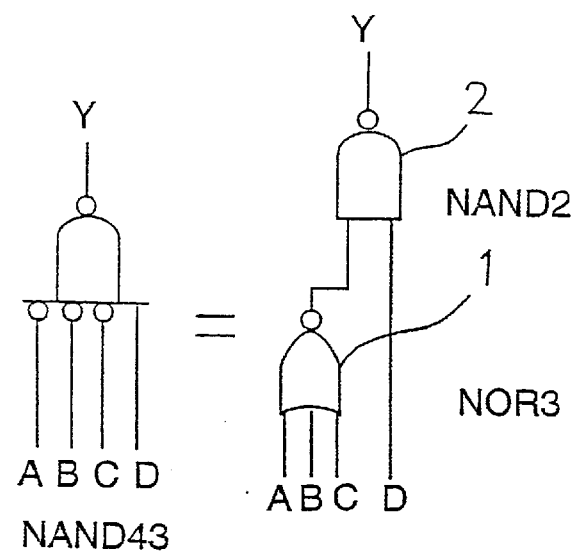
Figure 64:
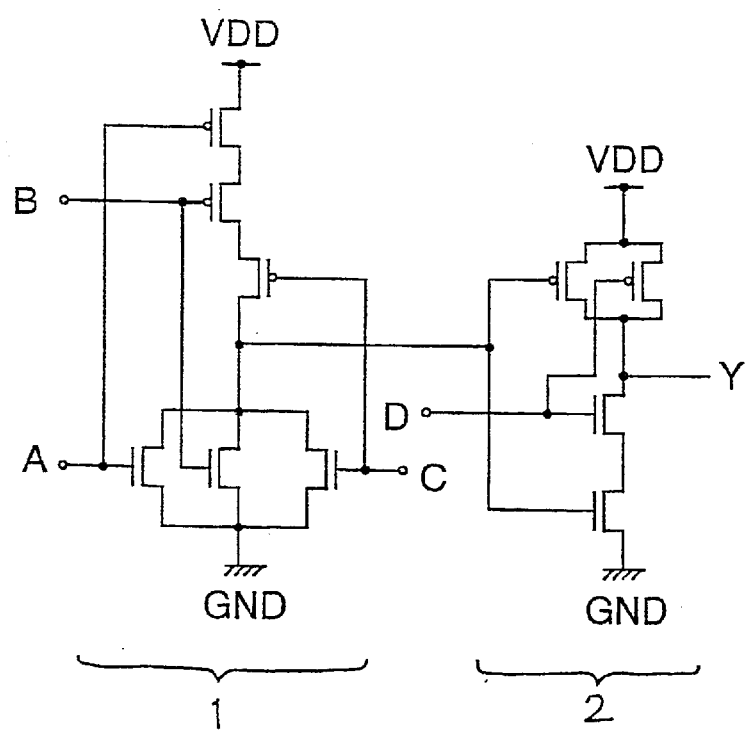
FIG. 64 shows an example of the circuit of NAND of an embodiment of the present invention.
Figure 65A:
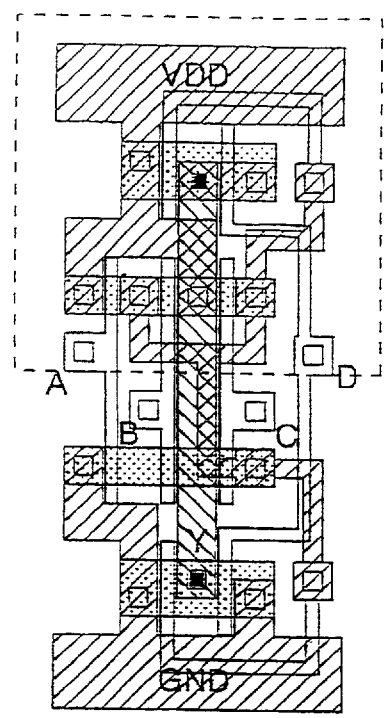
FIG. 65A shows a layout of a cell (four-input NOR) of an embodiment of the present invention.
Figure 65B:
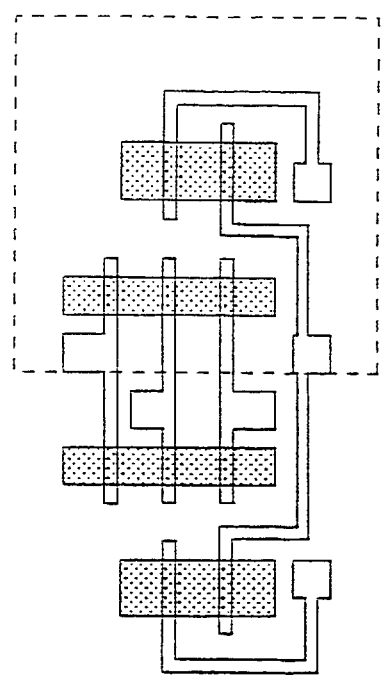
FIG. 65B shows diffusion regions and gate polysilicon wirings of a cell (four-input NOR) of an embodiment of the present invention.
Figure 66A:
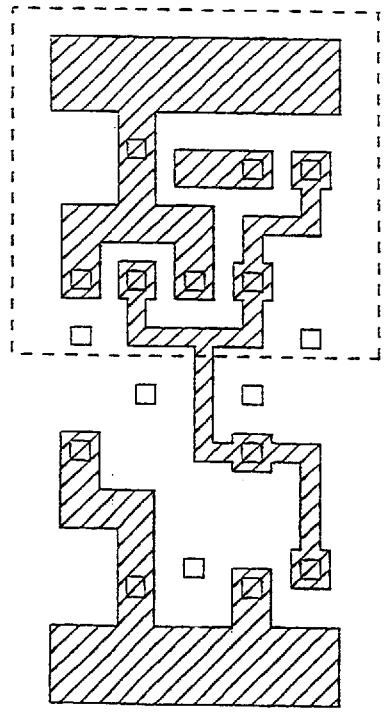
FIG. 66A shows first metal layer wirings of the cell (four-input NOR) of an embodiment of the present invention.
Figure 66B:
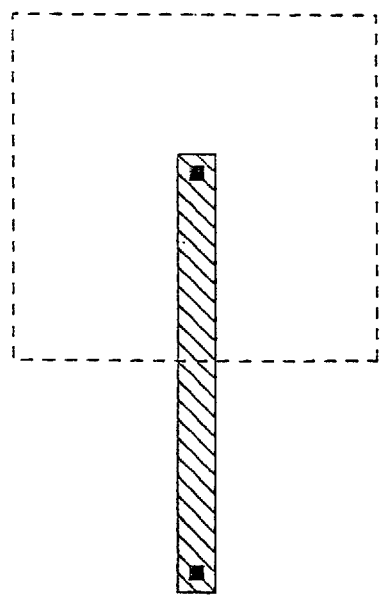
FIG. 66B shows second metal layer wirings of the cell (four-input NOR) of an embodiment of the present invention.

FIGS. 61A and 61B and FIGS. 62A and 62B show the layout of a four-input extended NAND gate NAND43. As shown in FIG. 63B, the gate NAND43 has a circuit arrangement in which the gate NOR3, as the first inverting logic gate 1, and the gate NAND2, as the second inverting logic gate 2, are connected. The circuit of the gate NAND43 is shown in FIG. 64. The layout shown in FIGS. 61A and 61B and FIGS. 62A and 62B is similar to the layout of the gate AND2 shown in FIG. 14, in the use of the four diffusion regions 11 to 14, in the positional relationship between the second metal layer wirings 9 and the first metal layer wirings 8, in the interconnect between the gate polysilicon wirings 6 and 7, in that the height of the first diffusion region 11 is greater than the height of the second diffusion region 12, and in that the height of the fourth diffusion region 14 is greater than the height of the third diffusion region 13.

Figures 67A, 67B:
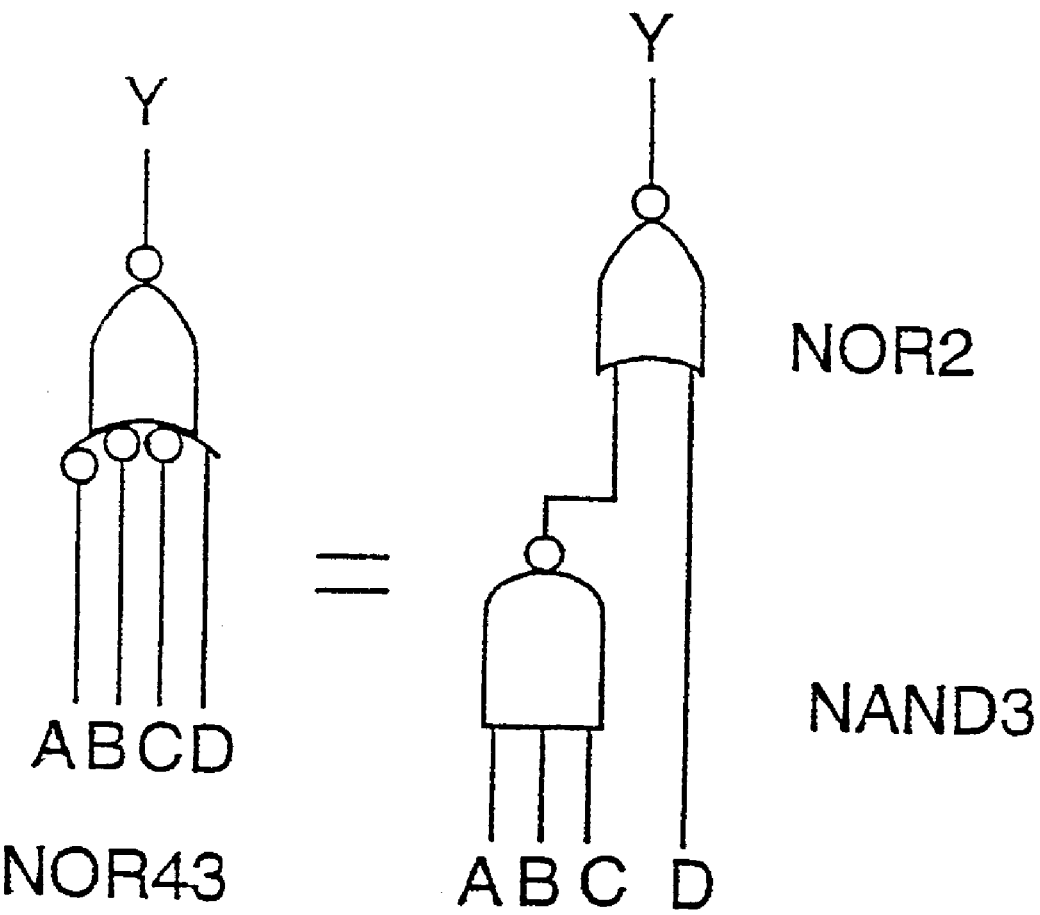

FIGS. 65A and 65B and FIGS. 66A and 66B show the layout of a four-input extended NOR gate NOR43. As shown in FIG. 67B, the gate NOR43 has a circuit arrangement in which the gate NAND3 and the gate NOR2 are connected. The layout shown in FIGS. 65A and 65B has the arrangement that is obtained by upside down reversing, in the drawings, the portion of the layout of the gate NAND43 shown in FIGS. 61A and 61B, except the well 19.

Figures 70A, 70B:
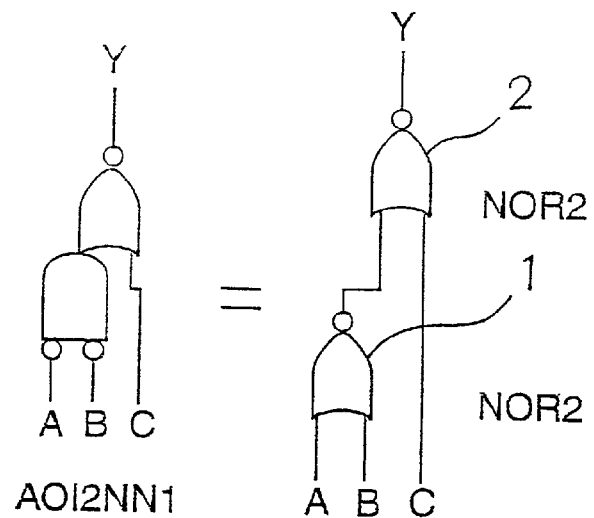
Figures 71A, 71B:
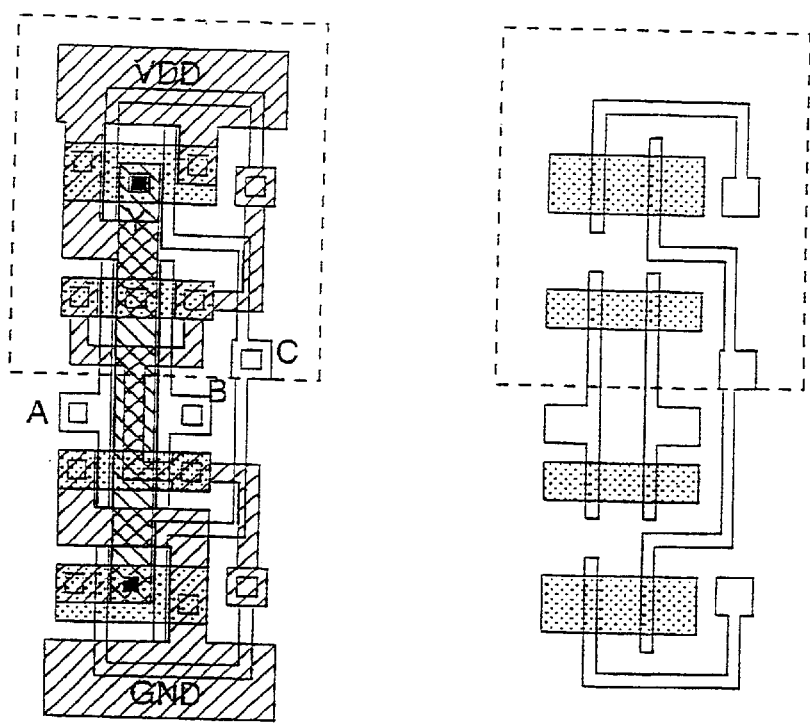
FIG. 71A shows a layout of a cell (three-input OR-NAND) of an embodiment of the present invention.
FIG. 71B shows diffusion regions and gate polysilicon wirings of a cell (three-input OR-NAND) of an embodiment of the present invention.
Figures 74A, 74B:
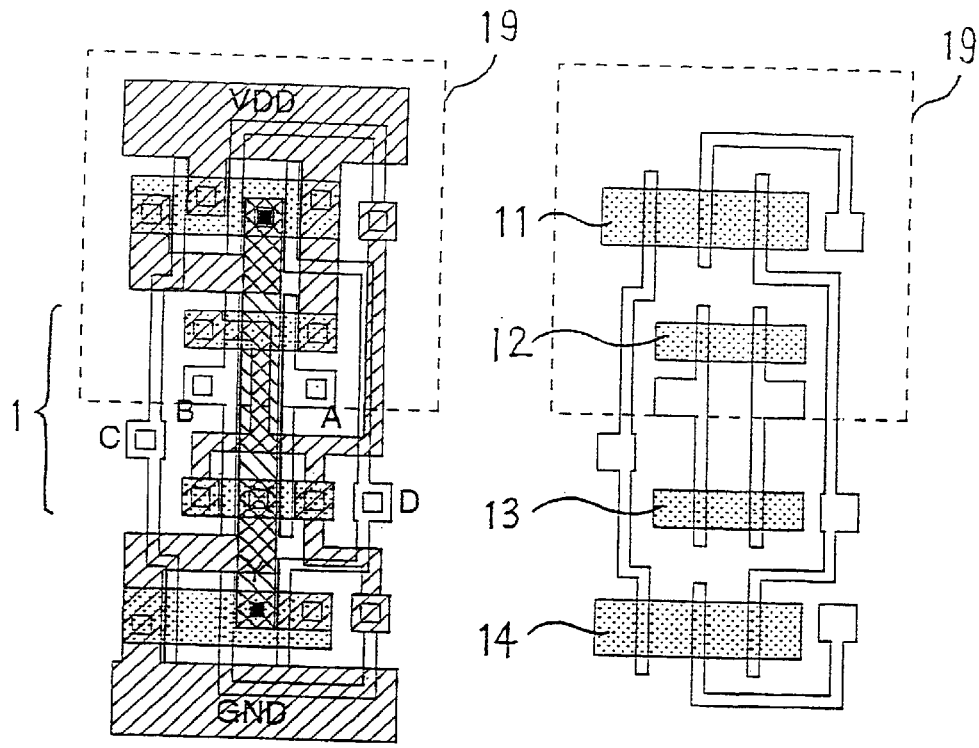
FIG. 74A shows a layout of a cell (four-input NAND) of an embodiment of the present invention.
FIG. 74B shows diffusion regions and gate polysilicon wirings of a cell (four-input NAND) of an embodiment of the present invention.
Figures 75A, 75B:
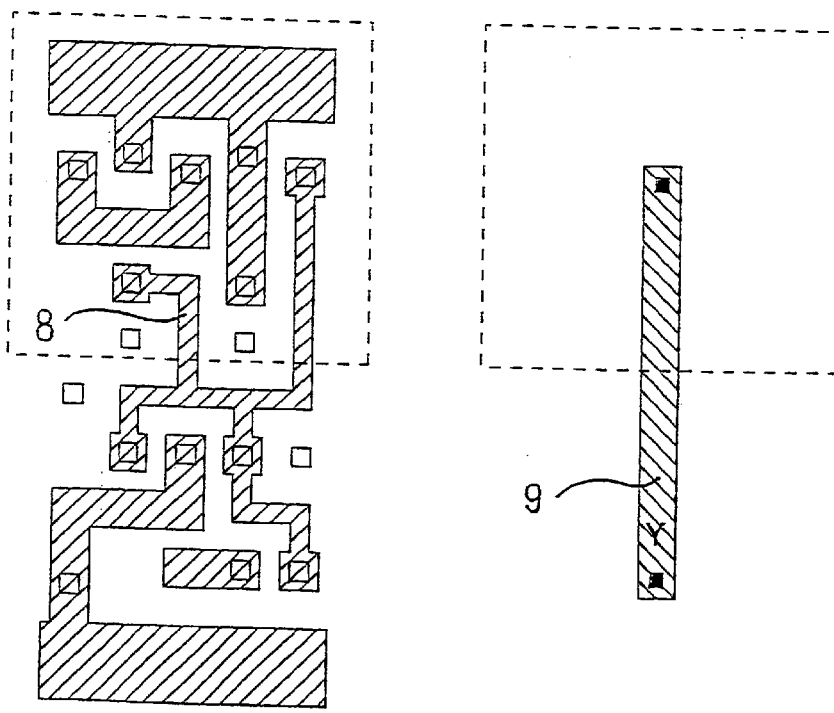
FIG. 75A shows first metal layer wirings of the cell (four-input NAND) of an embodiment of the present invention.
FIG. 75B shows second metal layer wirings of the cell (four-input NAND) of an embodiment of the present invention.

FIGS. 68A and 68B and FIGS. 69A and 69B show the layout of a three-input extended AND-NOR gate AOI2NN1. As shown in FIG. 70B, the gate AOI2NN1 has a circuit arrangement in which the gate NOR2, as the first inverting logic gate 1, and the gate NOR2, as the second inverting logic gate 2, are connected. The layout shown in FIGS. 68A and 68B and FIGS. 69A and 69B is similar to the layout of the gate AND2 shown in FIG. 14, in the use of the four diffusion regions 11 to 14, in the positional relationship between the second metal layer wirings 9 and the first metal layer wirings 8, in the interconnect between the gate polysilicon wirings 6 and 7, in that the height of the first diffusion region 11 is greater than the height of the second diffusion region 12, and in that the height of the fourth diffusion region 14 is greater than the height of the third diffusion region 13.

FIGS. 71A and 71B and FIGS. 72A and 72B show the layout of a three-input extended OR-NAND gate OAI2NN1. As shown in FIG. 73B, the gate OAI2NN1 has a circuit arrangement in which the gate NAND2 and the gate NAND2 are connected. The layout shown in FIGS. 71A and 71B has the arrangement that is obtained by upside down reversing, in the drawings, the portion of the layout of the gate AOI2NN1 shown in FIGS. 68A and 68B, except the well 19.

Discussed next are embodiments that are particular in that they correspond to any of claims 1 and 2, claims 5 to 8 and claims 9 to 16 but not claims 3 and 4.

Figures 76A, 76B:
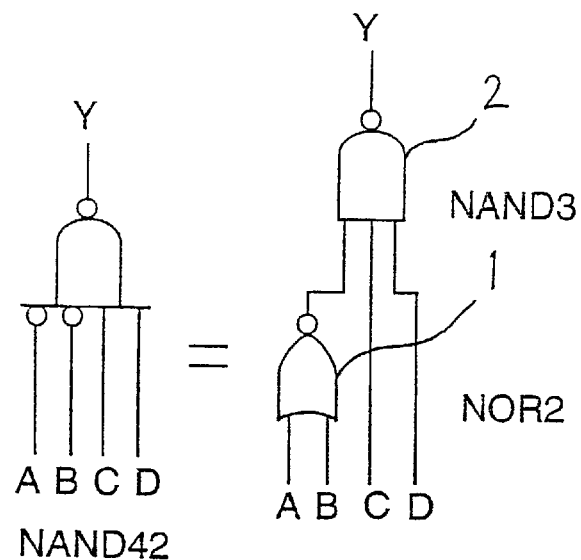
Figure 77:
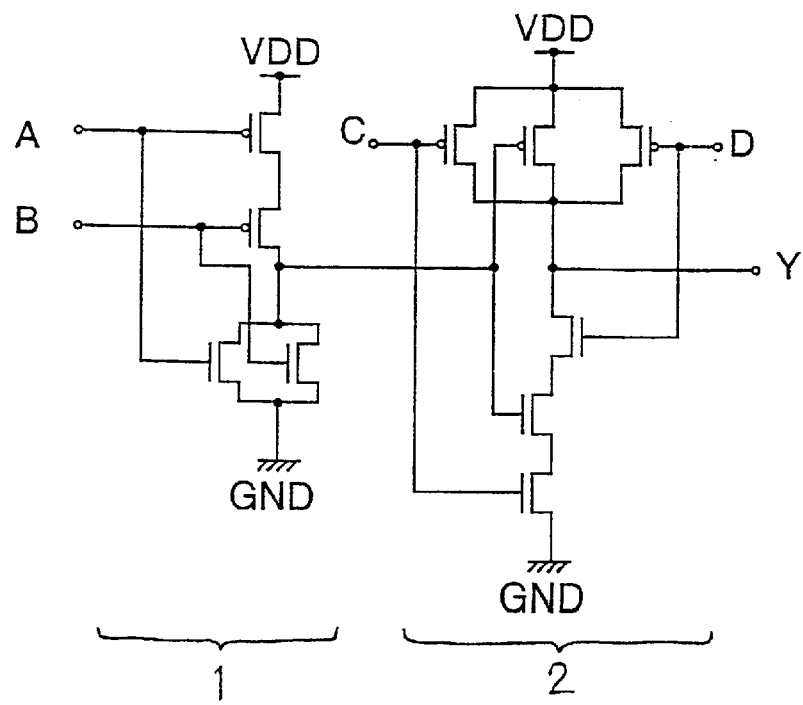
FIG. 77 shows an example of the circuit of NAND of an embodiment of the present invention.
Figure 78A:
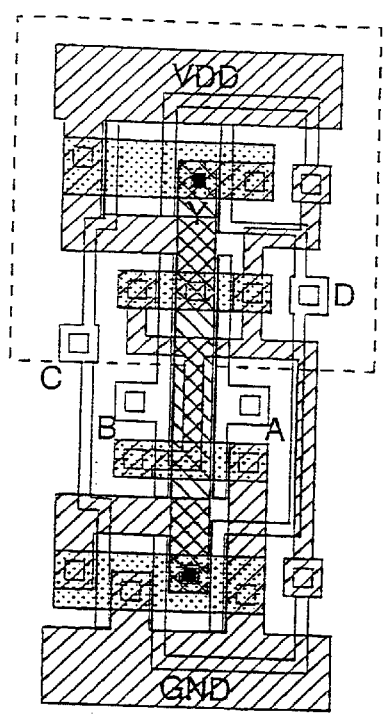
FIG. 78A shows a layout of a cell (four-input NOR) of an embodiment of the present invention.
Figure 78B:
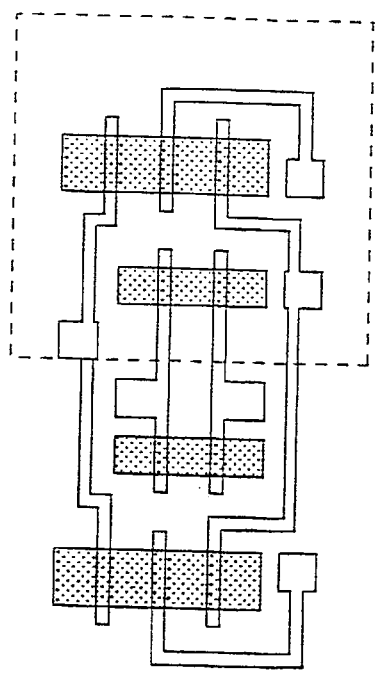
FIG. 78B shows diffusion regions and gate polysilicon wirings of a cell (four-input NOR) of an embodiment of the present invention.
Figure 79A:
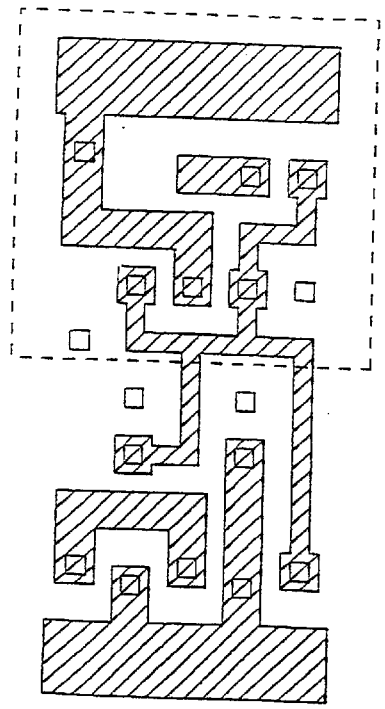
FIG. 79A shows first metal layer wirings of the cell (four-input NOR) of an embodiment of the present invention.
Figure 79B:
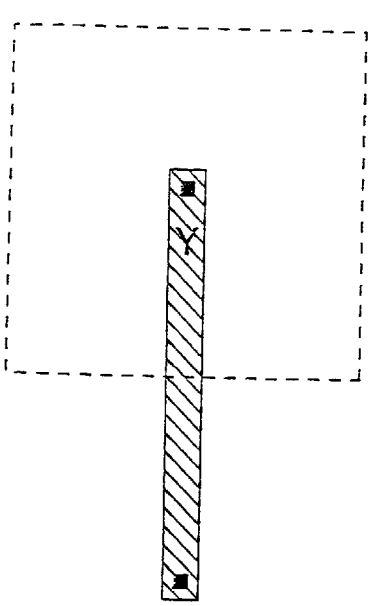
FIG. 79B shows second metal layer wirings of the cell (four-input NOR) of an embodiment of the present invention.

FIGS. 74A and 74B and FIGS. 75A and 75B show the layout of a four-input extended NAND gate NAND42. As shown in FIG. 76B, the gate NAND42 has a circuit diagram in which the gate NOR2, as the first inverting logic gate 1, and the gate NAND3, as the second inverting logic gate 2, are connected. The circuit of the gate NAND42 is shown in FIG. 77. The layout shown in FIGS. 74A and 74B and FIGS. 75A and 75B is similar to the layout of the gate AND2 shown in FIG. 14, in the use of the four diffusion regions 11 to 14, in the positional relationship between the second metal layer wirings 9 and the first metal layer wirings 8, in that the height of the first diffusion region 11 is greater than the height of the second diffusion region 12, and in that the height of the fourth diffusion region 14 is greater than the height of the third diffusion region 13, but the difference between both layouts lies in that the interconnect between the gate polysilicon wirings 6 and 7 is not made through the first metal layer wirings 8 of the output wirings of the first inverting logic gate 1. For this reason, the present embodiment does not correspond to claims 3 and 4.

Figures 80A, 80B:
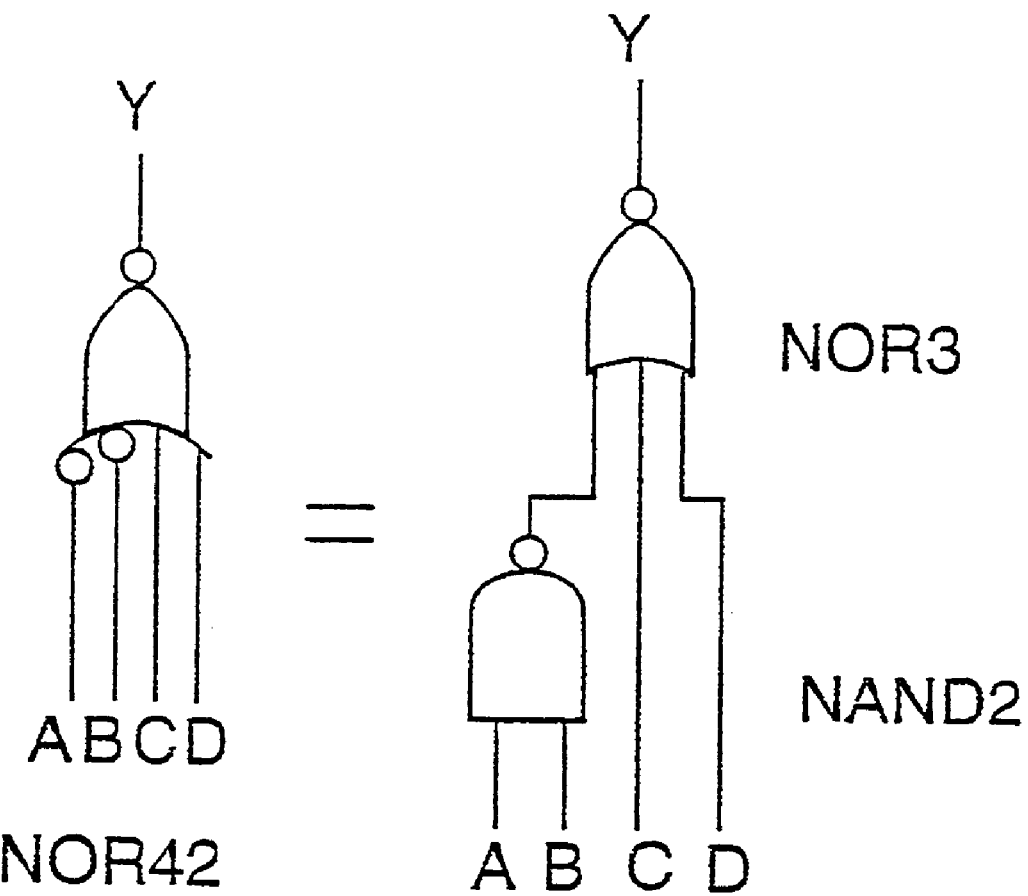
Figure 85A:
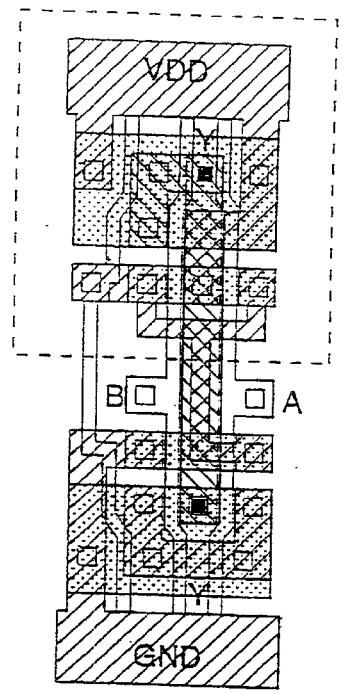
Figure 85B:
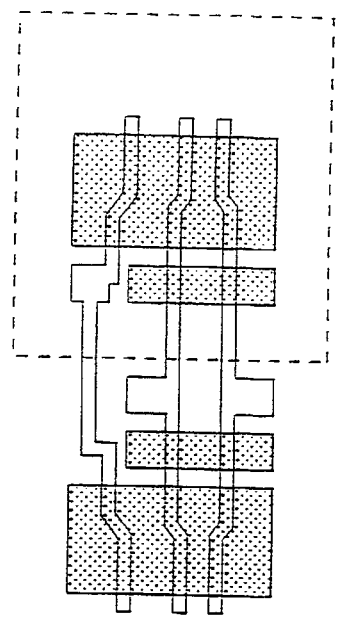
Figure 86A:
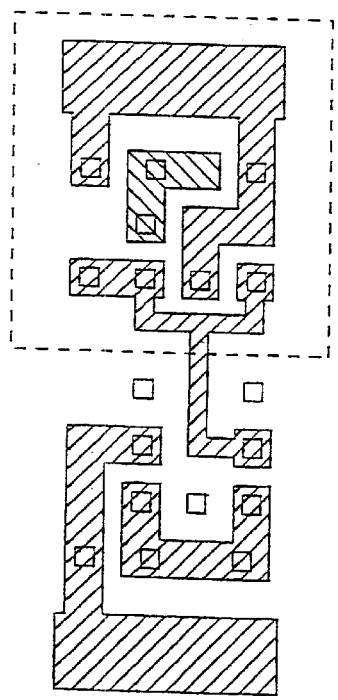
Figure 86B:
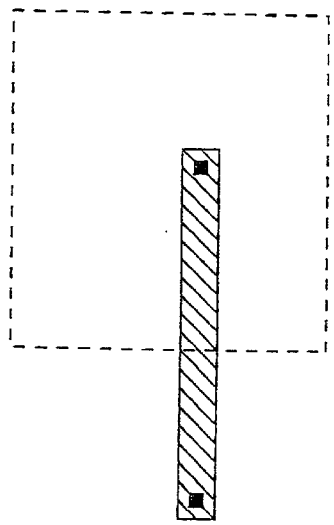

FIGS. 78A and 78B and FIGS. 79A and 79B show the layout of a four-input extended NOR gate NOR42. As shown in FIG. 80B, the gate NOR42 has a circuit arrangement in which the gate NAND2 and the gate NOR3 are connected. The layout shown in FIGS. 78A and 78B has the arrangement that is obtained by upside down reversing, in the drawings, the portion of the layout of the gate NAND42 shown in FIGS. 74A and 74B, except the well 19.

FIGS. 81A and 81B and FIGS. 82A and 82B show the layout of an exclusive OR gate XOR2. As shown in FIG. 83A, the gate XOR2 has a circuit arrangement in which the gate NOR2, as the first inverting logic gate 1, and the gate AOI21, as the second inverting logic gate 2, are connected. The circuit diagram of the gate XOR2 is shown in FIG. 84. The layout shown in FIGS. 81A and 81B and FIGS. 82A and 82B is similar to the layout of the gate AND2 shown in FIG. 14, in the use of the four diffusion regions 11 to 14, in the positional relationship between the second metal layer wirings 9 and the first metal layer wirings 8, in that the height of the first diffusion region 11 is greater than the height of the second diffusion region 12, and in that the height of the fourth diffusion region 14 is greater than the height of the third diffusion region 13. However, the difference between both layouts lies in that the input wirings of the second inverting logic gate 2 connected to the output of the first inverting logic gate 1 is not routed via the first metal layer wirings 8 of the output of the first inverting logic gate 1. For this reason, the present embodiment does not correspond to claims 3 and 4.

Figure 87A:
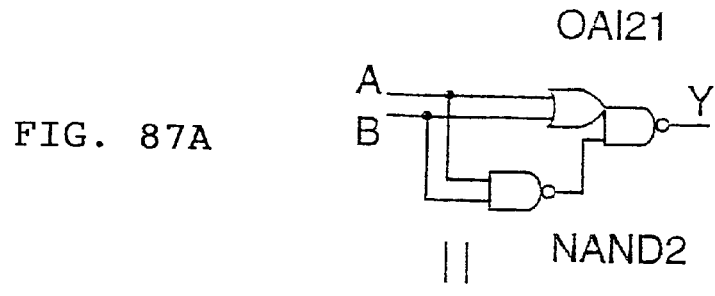
Figure 87B:
Figure 88:
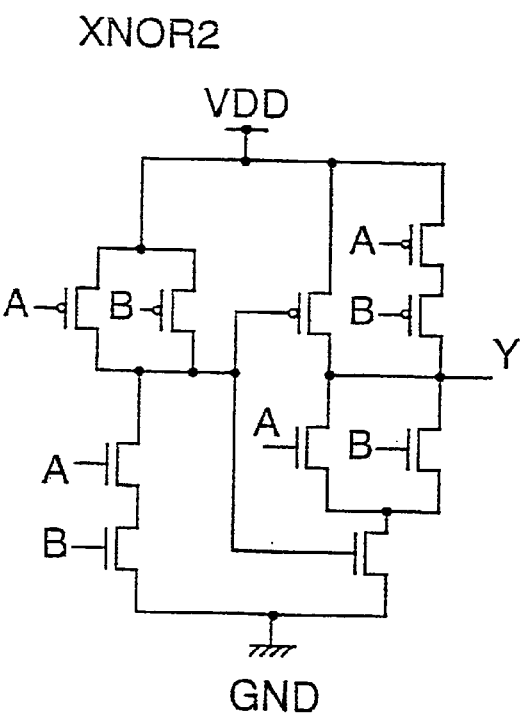

FIGS. 85A and 85B and FIGS. 86A and 86B show the layout of an exclusive NOR gate XNOR2. As shown in FIG. 87A, the gate XNOR2 has a circuit arrangement in which the gate NAND2 and the gate OAI21 are connected. The circuit of the gate XNOR2 is shown in FIG. 88. The layout shown in FIGS. 85A and 85B has the arrangement that is obtained by upside down reversing, in the drawings, the portion of the layout of the gate XOR2 shown in FIGS. 81A and 81B, except the well 19.

An embodiment corresponding to claims 33 and 34 is now discussed. FIGS. 89A and 89B and FIGS. 90A and 90B show the layout of a three-input extended NOR gate NOR32. As shown in FIG. 91B, the gate NOR32 of this embodiment has a circuit arrangement in which a NOT gate, a gate NAND3 and a NOT gate are connected. The circuit of the gate NOR32 is shown in FIG. 92. The layout shown in FIGS. 89A and 89B has the arrangement that is obtained by upside down reversing, in the drawings, the portion of the layout of the gate NAND32 shown in FIG. 20, except the well 19. Different from the gate NOR32 shown in FIGS. 56A and 56B and FIGS. 55A and 55B, the present embodiment has a circuit arrangement in which three inverting logic gates are connected in series. Compared to the gate NOR32 shown in FIGS. 56A and 56B and FIGS. 55A and 55B, the present embodiment has a large cell internal delay but a small output loading delay. As the design of LSI becomes finer, capacitance load in wirings increases, and the circuit arrangement of the present embodiment having a small output loading delay is advantageous in view of reducing the delay.

An embodiment corresponding to any of claims 1 to 24 will be now explained. FIG. 93A shows the layout of a two-input AND gate AND2 and the circuit diagram is shown in FIG. 9. FIGS. 93A and 93B are respectively different from FIGS. 28A and 28B at two points. That is, FIGS. 93A and 93B show an embodiment of which the P-type MOS transistor is greater than the N-type MOS transistor and are the embodiment in a case that a layout pitch of the transistor is different from a second metal wiring pitch (wiring grid). FIG. 93B shows diffusion region and gate polysilicon wirings extracted from FIG. 93A, FIG. 94A shows first metal layer wirings extracted from FIG. 93A and FIG. 94B shows second metal layer wirings extracted from FIG. 93A. The embodiment shown in FIGS. 93A and 93B is the same with that of FIGS. 28A and 28B except for size and metal wiring pitch of the P-type MOS transistor, and therefore the explanation is omitted.

Further, FIGS. 95A and 95B and FIGS. 96A and 96B show another embodiment of an exclusive-OR gate XOR2 corresponding to FIGS. 81A and 81B and FIGS. 82A and 82B. The differences are that the height of the diffusion region 12 is greater than the height of the diffusion region 13, the height of the diffusion region 11 is greater than the height of the diffusion region 14 and that a pitch of the transistor layout is different from a pitch (wiring grid) of the second metal wirings.

When a low power consuming logic gate cell is constructed using a narrow gate width transistor, the area utilization of the cell becomes high according to the present invention, compared to the conventional art. Specifically, given the same function, a small area cell results, and the area required for LSI layout is thus reduced. In a first advantage of the present invention, the length of metal wiring between cells is reduced, the static capacitance of the wiring is reduced, and the power consumption of the LSI is even more reduced. In its second advantage, the reduced LSI area leads to a reduction in manufacturing cost.

According to the present invention, the reduction of the cell area is performed through a reduction in cell width rather a reduction in cell height. For this reason, a transistor having a large drive power and a wide gate width may be included. Specifically, a wide gate width transistor is constructed without a drop in the area utilization.

According to the present invention, by increasing the drive power of a transistor at an output stage only, the output loading delay is reduced while a low power consuming and small area cell is realized. As the fine design of the LSI is promoted with a wiring load relatively increasing, the present invention is advantageous in the reduction of delay.

It should be understood that many modifications and adaptations of the invention will become apparent to those skilled in the art and it is intended to encompass such obvious modifications and changes in the scope of the Claims appended hereto.

What is claimed is:

1. A logic gate cell used as an element in an LSI manufactured through CMOS process, having a circuit arrangement composed of two inverting logic gates (1, 2) with the output of a first inverting logic gate (1) connected to one of inputs of a second inverting logic gate (2), and having a single well (19) for forming a P-type MOS transistor in a cell layout, with the well (19) arranged in the top portion of a drawing of the cell layout, wherein the logic gate cell is firstly characterized in that the logic gate cell comprises a first diffusion region (11) and a second diffusion region (12) within the well (19), for forming a P-type MOS transistor, with the second diffusion region (12) arranged below the first diffusion region (11), and a third diffusion region (13) and a fourth diffusion region (14), outside and below the well (19), for forming an N-type MOS transistor, with the fourth diffusion region (14) arranged below the third diffusion (13), secondly characterized in that the first inverting logic gate (1) is formed of the second diffusion region (12) and the third diffusion region (13), and in that the second inverting logic gate (2) is formed of the first diffusion region (11) and the fourth diffusion region (14), and thirdly characterized in that a wiring (37), which also serves as the wiring of an output portion of the second inverting logic gate (2), for interconnecting the P-type MOS transistor and the N-type MOS transistor, is partly or entirely formed of a second metal layer wiring (9), and in that the second metal layer wiring (9) extends over the second diffusion region (12) and the third diffusion region (13).

2. An LSI comprising at least one of logic gate cells as claimed in claim 1.

3. A logic gate cell as claimed in claim 1, wherein a wiring (38), which also serves as a wiring of an output portion of the first inverting logic gate (1), for interconnecting the P-type MOS transistor and the N-type MOS transistor, is formed of a first metal layer wiring (8), and wherein the second metal layer wiring (9) of the output portion of the second inverting logic gate (2) extends over the first metal layer wiring (8).

4. An LSI comprising at least one of logic gate cells as claimed in claim 3.

5. A logic gate cell as claimed in claim 3, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

6. A logic gate as claimed in claim 5, wherein the second inverting logic gate (2) is a NOT gate.

7. A logic gate as claimed in claim 6, wherein each of the P-typeMOS transistor and the N-type transistor forming the NOT gate of the second inverting logic gate (2) is composed of two MOS transistors that are connected in parallel.

8. A logic gate as claimed in claim 6, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

9. A logic gate cell as claimed in claim 3, wherein, in a portion of the input of the second inverting logic gate (2) connected to the output of the first inverting logic gate (1), a gate polysilicon wiring (6) of the P-type MOS transistor and a gate polysilicon wiring (7) of the N-type MOS transistor are interconnected by the first metal layer wiring (8) of the output portion of the first inverting logic gate (1).

10. A logic gate cell as claimed in claim 9, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

11. A logic gate as claimed in claim 10, wherein the second inverting logic gate (2) is a NOT gate.

12. A logic gate as claimed in claim 11, wherein each of the P-type MOS transistor and the N-type transistor forming the NOT gate of the second inverting logic gate (2) is composed of two MOS transistors that are connected in parallel.

13. A logic gate as claimed in claim 11, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

14. A logic gate cell as claimed in claim 9, wherein a gate width of the P-type MOS transistor in the second inverting logic gate (2) is set to be wider than a gate width of the P-type MOS transistor in the first inverting logic gate (1), and wherein a gate width of the N-type MOS transistor in the second inverting logic gate (2) is set to be wider than a gate width of the N-type MOS transistor in the first inverting logic gate (1).

15. A logic gate cell as claimed in claim 14, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

16. A logic gate as claimed in claim 15, wherein the second inverting logic gate (2) is a NOT gate.

17. A logic gate as claimed in claim 16, wherein each of the P-type MOS transistor and the N-type transistor forming the NOT gate of the second inverting logic gate (2) is composed of two MOS transistors that are connected in parallel.

18. A logic gate as claimed in claim 16, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

19. A logic gate cell as claimed in claim 3, wherein a gate width of the P-type MOS transistor in the second inverting logic gate (2) is set to be wider than a gate width of the P-type MOS transistor in the first inverting logic gate (1), and wherein a gate width of the N-type MOS transistor in the second inverting logic gate (2) is set to be wider than a gate width of the N-type MOS transistor in the first inverting logic gate (1).

20. A logic gate cell as claimed in claim 19, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

21. A logic gate as claimed in claim 20, wherein the second inverting logic gate (2) is a NOT gate.

22. A logic gate as claimed in claim 21, wherein each of the P-type MOS transistor and the N-type transistor forming the NOT gate of the second inverting logic gate (2) is composed of two MOS transistors that are connected in parallel.

23. A logic gate as claimed in claim 21, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

24. A logic gate cell as claimed in claim 1, wherein, in a portion of the input of the second inverting logic gate (2) connected to the output of the first inverting logic gate (1), a gate polysilicon wiring (6) of the P-type MOS transistor and a gate polysilicon wiring (7) of the N-type MOS transistor are interconnected by the first metal layer wiring (8) of the output portion of the first inverting logic gate (1).

25. An LSI comprising at least one of logic gate cells as claimed in claim 24.

26. A logic gate cell as claimed in claim 24, wherein a gate width of the P-type MOS transistor in the second inverting logic gate (2) is set to be wider than a gate width of the P-type MOS transistor in the first inverting logic gate (1), and wherein a gate width of the N-type MOS transistor in the second inverting logic gate (2) is set to be wider than a gate width of the N-type MOS transistor in the first inverting logic gate (1).

27. A logic gate cell as claimed in claim 26, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

28. A logic gate as claimed in claim 27, wherein the second inverting logic gate (2) is a NOT gate.

29. A logic gate as claimed in claim 28, wherein each of the P-type MOS transistor and the N-type transistor forming the NOT gate of the second inverting logic gate (2) is composed of two MOS transistors that are connected in parallel.

30. A logic gate as claimed in claim 28, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

31. A logic gate cell as claimed in claim 24, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

32. A logic gate as claimed in claim 31, wherein the second inverting logic gate (2) is a NOT gate.

33. A logic gate as claimed in claim 32, wherein each of the P-type MOS transistor and the N-type transistor forming the NOT gate of the second inverting logic gate (2) is composed of two MOS transistors that are connected in parallel.

34. A logic gate as claimed in claim 32, wherein each of the P-type MOS transistor and the N-type transistor forming the NOT gate of the second inverting logic gate is composed of two MOS transistors that are formed adjacently, in the first diffusion region and in the fourth diffusion region and are electrically connected in parallel.

35. A logic gate cell as claimed in claim 1, wherein a gate width of the P-type MOS transistor in the second inverting logic gate (2) is set to be wider than a gate width of the P-type MOS transistor in the first inverting logic gate (1), and wherein a gate width of the N-type MOS transistor in the second inverting logic gate (2) is set to be wider than a gate width of the N-type MOS transistor in the first inverting logic gate (1).

36. A logic gate cell as claimed in claim 35, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

37. A logic gate as claimed in claim 36, wherein the second inverting logic gate (2) is a NOT gate.

38. A logic gate as claimed in claim 37, wherein each of the P-type MOS transistor and the N-type transistor forming the NOT gate of the second inverting logic gate (2) is composed of two MOS transistors that are connected in parallel.

39. A logic gate as claimed in claim 37, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

40. A logic gate cell as claimed in claim 1, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

41. A logic gate as claimed in claim 40, wherein the second inverting logic gate (2) is a NOT gate.

42. A logic gate as claimed in claim 41, further comprising a circuit arrangement having a third inverting logic gate (3) formed of one of a NOT gate, a NAND gate having two to four inputs, and a NOR gate having two to four inputs, wherein an output of the third inverting logic gate (3) is connected to one of the inputs of the first inverting logic gate (1), and wherein the third inverting logic gate (3) is formed of the second diffusion region (12) and the third diffusion region (13).

43. A logic gate as claimed in claim 41, wherein each of the P-type MOS transistor and the N-type transistor forming the NOT gate of the second inverting logic gate (2) is composed of two MOS transistors that are connected in parallel.

44. A logic gate as claimed in claim 43, further comprising a circuit arrangement having a third inverting logic gate (3) formed of one of a NOT gate, a NAND gate having two to four inputs, and a NOR gate having two to four inputs, wherein an output of the third inverting logic gate (3) is connected to one of the inputs of the first inverting logic gate (1), and wherein the third inverting logic gate (3) is formed of the second diffusion region (12) and the third diffusion region (13).

45. A logic gate as claimed in claim 41, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

46. A logic gate as in claim 45, further comprising a circuit arrangement having a third inverting logic gate formed of on of a NOT gate, a NAND gate having two to four inputs, and a NOR gate having two to four inputs, wherein an output of the third inverting logic gate is connected to one of the inputs of the first inverting logic gate, and wherein the third inverting logic gate is formed of the second diffusion region and the third diffusion region.

47. A logic gate cell used as an element in an LSI manufactured through CMOS process, having a circuit arrangement composed of two inverting logic gates (1, 2) with the output of a first inverting logic gate (1) connected to one of inputs of a second inverting logic gate (2), and having a first diffusion region (11) and a second diffusion region (12) for forming a P-type MOS transistor and a third diffusion region (13) and a fourth diffusion region (14) for forming a N-type MOS transistor in a cell layout, wherein the logic cell is firstly characterized in that, when the diffusion regions (11,12) for forming the P-type MOS transistor are arranged in a top portion of a drawing of the cell layout, the second diffusion region (12) is arranged below the first diffusion region (11), the third diffusion region (13) is arranged below the second diffusion region (12) and the fourth diffusion region (14) is arranged below the third diffusion region (12), secondly characterized in that the inverting logic gate (1) is formed of the second diffusion region (12) and the third diffusion region (13), and in that the second inverting logic gate (2) is formed of the first diffusion region (11) and the fourth diffusion region (14), and thirdly characterized in that a wiring (37), which also serves as the wiring of an output portion of the second inverting logic gate (2), for interconnecting the P-type MOS transistor and the N-type MOS trtransistor, is partly or entirely formed of a second metal layer wiring (9), and in that the second metal layer wiring (9) extends over the second diffusion region (12) and the third diffusion region (13).

48. A logic gate cell as claimed in claim 47, wherein, in a portion of the input of the second inverting logic gate (2) connected to the output of the first inverting logic gate (1), a gate polysilicon wiring (6) of the P-type MOS transistor and a gate polysilicon wiring (7) of the N-type MOS transistor are interconnected by the first metal layer wiring (8) of the output portion of the first inverting logic gate (1).

49. A logic gate cell as claimed in claim 47, wherein a gate width of the P-type MOS transistor in the second inverting logic gate (2) is set to be wider than a gate width of the P-type MOS transistor in the first inverting logic gate (1), and wherein a gate width of the N-type MOS transistor in the second inverting logic gate (2) is set to be wider than a gate width of the N-type MOS transistor in the first inverting logic gate (1).

50. An LSI comprising at least one of logic gate cells as claimed in claim 47.

51. A logic gate cell as claimed in claim 47, wherein a wiring (38), which also serves as a wiring of an output portion of the first inverting logic gate (1), for interconnecting the P-type MOS transistor and the N-type MOS transistor, is formed of a first metal layer wiring (8), and wherein the second metal layer wiring (9) of the output portion of the second inverting logic gate (2) extends over the first metal layer wiring (8).

52. A logic gate cell as claimed in claim 51, wherein, in a portion of the input of the second inverting logic gate (2) connected to the output of the first inverting logic gate (1), a gate polysilicon wiring (6) of the P-type MOS transistor and a gate polysilicon wiring (7) of the N-type MOS transistor are interconnected by the first metal layer wiring (8) of the output portion of the first inverting logic-gate (1).

53. A logic gate cell as claimed in claim 47, wherein each of the two inverting logic gates (1, 2) is one of a NOT gate, a NAND gate having two to four inputs, a NOR gate having two to four inputs, an AND-NOR compound gate having three to four inputs, and an OR-NAND compound gate having three to four inputs.

54. A logic gate as claimed in claim 53, wherein the second inverting logic gate (2) is a NOT gate.

55. A logic gate as claimed in claim 54, wherein each of the P-type MOS transistor and the N-type transistor forming the NOT gate of the second inverting logic gate (2) is composed of two MOS transistors that are connected in parallel.

56. A logic gate as claimed in claim 55, further comprising a circuit arrangement having a third inverting logic gate (3) formed of one of a NOT gate, a NAND gate having two to four inputs, and a NOR gate having two to four inputs, wherein an output of the third inverting logic gate (3) is connected to one of the inputs of the first inverting logic gate (1), and wherein the third inverting logic gate (3) is formed of the second diffusion region (12) and the third diffusion region (13).

57. A logic gate as claimed in claim 54, further comprising a circuit arrangement having a third inverting logic gate (3) formed of one of a NOT gate, a NAND gate having two to four inputs, and a NOR gate having two to four inputs, wherein an output of the third inverting logic gate (3) is connected to one of the inputs of the first inverting logic gate (1), and wherein the third inverting logic gate (3) is formed of the second diffusion region (12) and the third diffusion region (13).

58. A logic gate as claimed in claim 54, wherein each of the P-type MOS transistor and the N-type transistor forming the NOT gate of the second inverting logic gate is composed of two MOS transistors that are formed adjacently in the first diffusion region and in the fourth diffusion region and are electrically connected in parallel.

59. A logic gate as claimed in claim 58, further comprising a circuit arrangement having a third inverting logic gate formed of one of a NOT gate, a NAND gate having two to four inputs, and a NOR gate having two to four inputs, wherein an output of the third inverting logic gate is connected to one of the inputs of the first inverting logic gate, and wherein the third inverting logic gate is formed of the second diffusion region and the third diffusion region.

* * * * *